United States Patent
Hoshi

(10) Patent No.: US 12,069,945 B2
(45) Date of Patent: Aug. 20, 2024

(54) LIGHT EMITTING DEVICE

(71) Applicant: Samsung Display Co., Ltd., Yongin-si (KR)

(72) Inventor: Keigo Hoshi, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 612 days.

(21) Appl. No.: 17/344,278

(22) Filed: Jun. 10, 2021

(65) Prior Publication Data

US 2022/0123228 A1    Apr. 21, 2022

(30) Foreign Application Priority Data

Oct. 20, 2020    (KR) .................. 10-2020-0136195

(51) Int. Cl.
*H10K 85/30* (2023.01)
*H10K 85/60* (2023.01)
*H10K 50/11* (2023.01)

(52) U.S. Cl.
CPC ......... *H10K 85/636* (2023.02); *H10K 85/658* (2023.02); *H10K 50/11* (2023.02)

(58) Field of Classification Search
None
See application file for complete search history.

(56) References Cited

U.S. PATENT DOCUMENTS

| | | | |
|---|---|---|---|
| 10,374,166 B2 | 8/2019 | Hatakeyama et al. | |
| 10,811,613 B2 | 10/2020 | Hatakeyama et al. | |
| 2018/0090718 A1* | 3/2018 | Lee ...................... H10K 50/858 |
| 2019/0375768 A1 | 12/2019 | Kim et al. | |
| 2020/0052212 A1 | 2/2020 | Tasaki et al. | |
| 2020/0066997 A1 | 2/2020 | Huang et al. | |

(Continued)

FOREIGN PATENT DOCUMENTS

| | | |
|---|---|---|
| CN | 107501311 | 12/2017 |
| CN | 109790460 | 5/2019 |

(Continued)

*Primary Examiner* — Robert S Loewe
(74) *Attorney, Agent, or Firm* — KILE PARK REED & HOUTTEMAN PLLC

(57) ABSTRACT

A light emitting device of an embodiment includes a first electrode, a second electrode disposed on the first electrode, and an emission layer disposed between the first electrode and the second electrode, wherein the emission layer includes a polycyclic compound represented by Formula 1. Accordingly, the light emitting device of an embodiment may show improved emission efficiency and increased life characteristics.

[Formula 1]

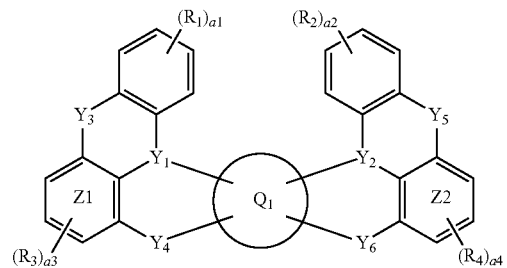

18 Claims, 6 Drawing Sheets

(56) References Cited

U.S. PATENT DOCUMENTS

| | | |
|---|---|---|
| 2020/0144503 A1 | 5/2020 | Hayano |
| 2020/0161552 A1 | 5/2020 | Joo et al. |
| 2020/0185626 A1 | 6/2020 | Yuuki |
| 2020/0190115 A1* | 6/2020 | Hatakeyama ............. C07F 5/02 |

FOREIGN PATENT DOCUMENTS

| | | |
|---|---|---|
| CN | 110407858 | 11/2019 |
| KR | 10-2018-0108559 | 10/2018 |
| KR | 10-2019-0132645 | 11/2019 |
| KR | 10-2019-0141052 | 12/2019 |
| KR | 10-2058028 | 12/2019 |
| KR | 10-2020-0020637 | 2/2020 |
| KR | 10-2020-0052513 | 5/2020 |
| KR | 10-2020-0071192 | 6/2020 |
| WO | 2019/128633 | 7/2019 |

* cited by examiner

LIGHT EMITTING DEVICE

CROSS-REFERENCE TO RELATED APPLICATION(S)

This claims priority to and benefits of Korean Patent Application No. 10-2020-0136195 under 35 U.S.C. § 119, filed on Oct. 20, 2020 in the Korean Intellectual Property Office, the entire contents of which are incorporated herein by reference.

BACKGROUND

1. Technical Field

The disclosure relates to a light emitting device including a polycyclic compound.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light-emitting material including an organic compound in the emission layer emits light to achieve display.

In the application of an organic electroluminescence device to an image display, there is a need to increase the emission efficiency and the life of the organic electroluminescence device, and continuous development is required for materials for an organic electroluminescence device which stably achieves such qualities.

Recently, in order to attain an organic electroluminescence device with high efficiency, techniques on phosphorescence emission which uses energy in a triplet state, or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device showing excellent emission efficiency and improved device life.

An embodiment provides a light emitting device that may include a first electrode, a second electrode disposed on the first electrode, and an emission layer disposed between the first electrode and the second electrode and including a polycyclic compound represented by Formula 1 below.

[Formula 1]

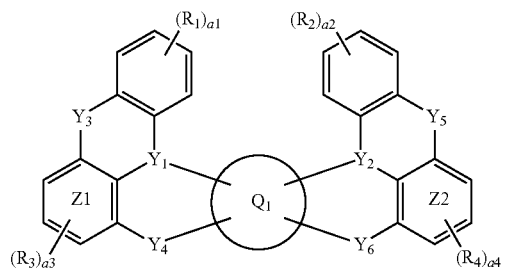

In Formula 1, $Q_1$ may be a substituted or unsubstituted hydrocarbon ring group, or a substituted or unsubstituted heterocyclic group, $Y_1$ and $Y_2$ may each independently be B, N, P, P=O, P=S, Al, Ga, As, $Si(R_5)$, or $Ge(R_6)$, $Y_3$ to $Y_6$ may each independently be $N(R_7)$, O, or S, and at least one of $Y_3$ to $Y_6$ may be $N(R_7)$. In Formula 1, if at least one of $Y_3$ and $Y_4$ is $N(R_7)$, then $R_7$ may be combined with adjacent ring Z1 to form a ring, and if at least one of $Y_5$ and $Y_6$ is $N(R_7)$, then $R_7$ may be combined with adjacent ring Z2 to form a ring. In Formula 1, a1 and a2 may each independently be an integer from 0 to 4, a3 and a4 may each independently be an integer from 0 to 3, and $R_1$ to $R_7$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, Formula 1 may be represented by any one among Formula 1-1 to Formula 1-4 below.

[Formula 1-1]

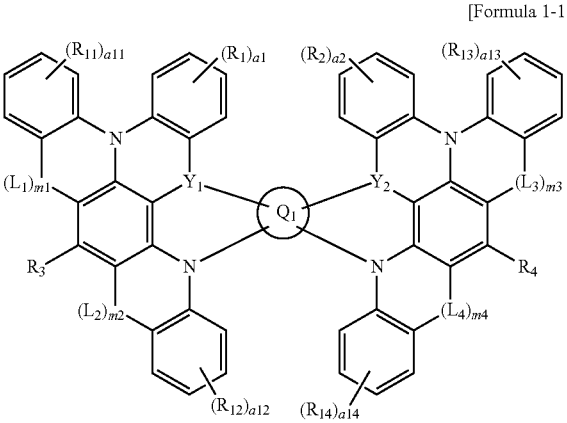

-continued

[Formula 1-2]

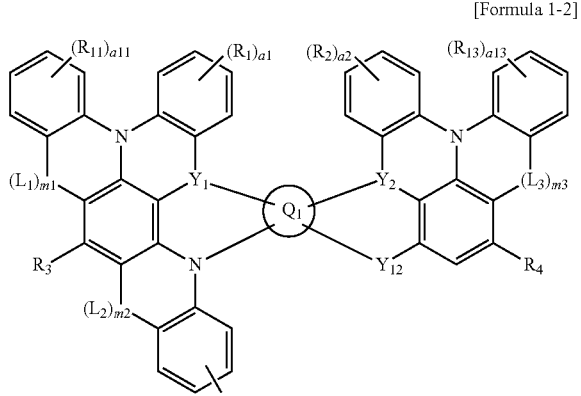

[Formula 1-3]

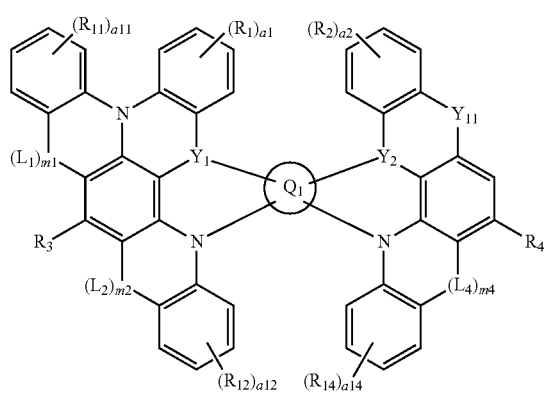

[Formula 1-4]

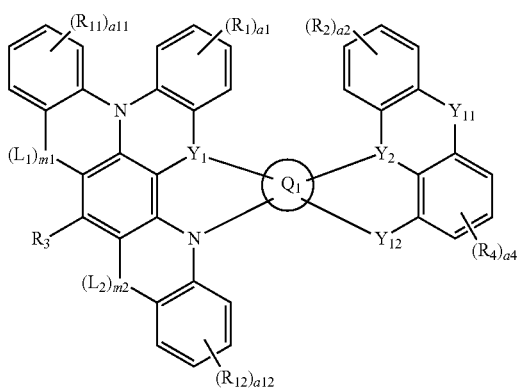

In Formula 1-2 to Formula 1-4, $Y_{11}$ and $Y_{12}$ may each independently be O or S. In Formula 1-1 to Formula 1-4, at least one of m1 to m4 may be 1, and the remainder of m1 to m4 may each independently be 0 or 1, $L_1$ to $L_4$ may each be a direct linkage, a11 to a14 may each independently be an integer from 0 to 4, and $R_{11}$ to $R_{14}$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula 1-1 to Formula 1-4, a1, a2, a4, $R_1$ to $R_4$, $Q_1$, $Y_1$, and $Y_2$ may be the same as defined in connection with Formula 1 above.

In an embodiment, in Formula 1-1, $Y_1$ and $Y_2$ may each independently be Al, Ga, As, Si($R_5$), or Ge($R_6$), and $R_5$ and $R_6$ may each be an unsubstituted phenyl group.

In an embodiment, if a11 is an integer of 2 or more, multiple $R_{11}$ groups may be combined to form a hydrocarbon ring.

In an embodiment, $R_{11}$ to $R_{14}$ may each independently be a methyl group, a t-butyl group, an unsubstituted phenyl group, a substituted or unsubstituted diphenylamine group, or a substituted or unsubstituted carbazole group.

In an embodiment, Formula 1-1 may be represented by any one among Formula 1-1A to Formula 1-1C below.

[Formula 1-1A]

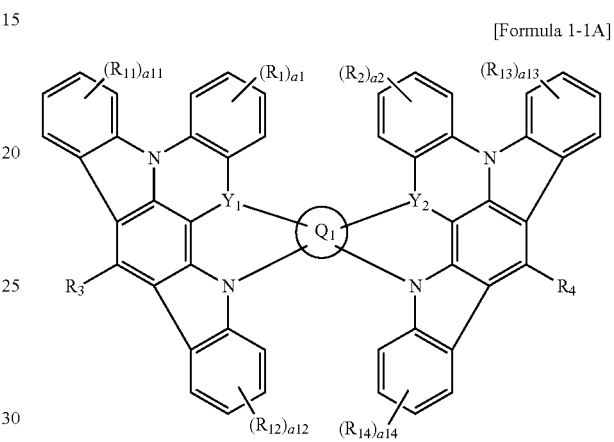

[Formula 1-1B]

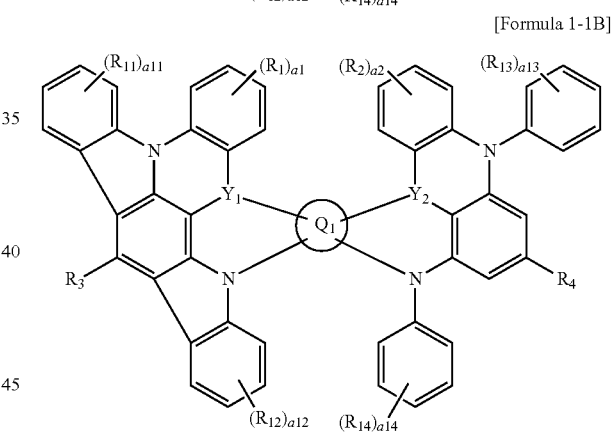

[Formula 1-1C]

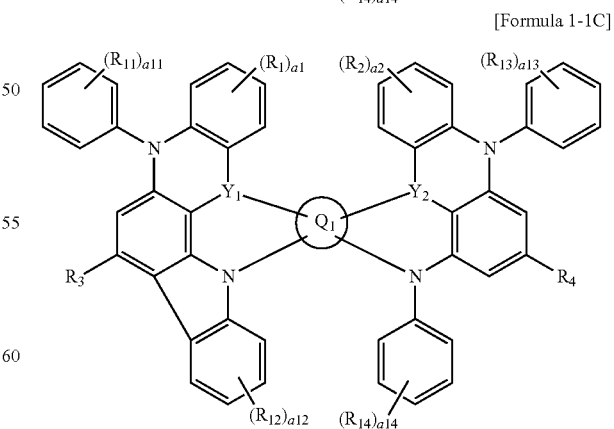

In Formula 1-1A to Formula 1-1C, a1, a2, a11 to a14, $R_1$ to $R_4$, $R_{11}$ to $R_{14}$, $Q_1$, $Y_1$, and $Y_2$ may be the same as defined in connection with Formula 1-1.

In an embodiment, Formula 1 may be represented by Formula 2-1 or Formula 2-2 below.

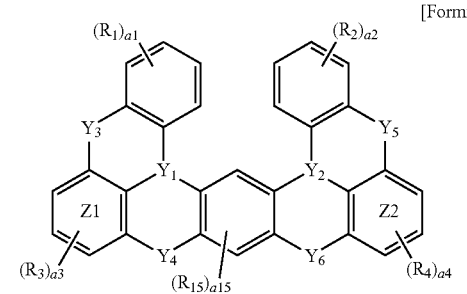

[Formula 2-1]

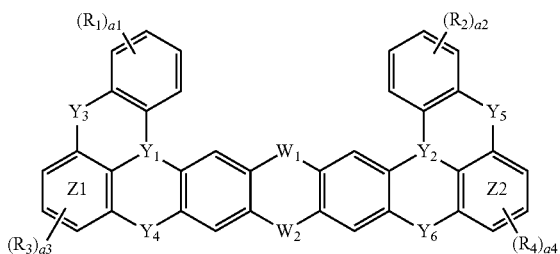

[Formula 2-2]

In Formula 2-1, a15 may be an integer from 0 to 2, and $R_{15}$ may be a hydrogen atom, a deuterium atom, a substituted or unsubstituted alkyl group of 1 to 20 carbon atoms, or a substituted or unsubstituted aryl group of 6 to 30 ring-forming carbon atoms. In Formula 2-2, $W_1$ and $W_2$ may each independently be a direct linkage, $C(R_{21})(R_{22})$, $N(R_{23})$, O, S, or $Si(R_{24})(R_{25})$, and $R_{21}$ to $R_{25}$ may each independently be a hydrogen atom, a deuterium atom, or a substituted or unsubstituted aryl group of 6 to 30 ring-forming carbon atoms. In Formula 2-1 and Formula 2-2, a1 to a4, $R_1$ to $R_4$, $Y_1$ to $Y_6$, Z1, and Z2 may be the same as defined in connection with Formula 1.

In an embodiment, at least one of $W_1$ and $W_2$ may be a direct linkage.

In an embodiment, Formula 2-2 may be represented by any one among Formula 2-2A to Formula 2-2C below.

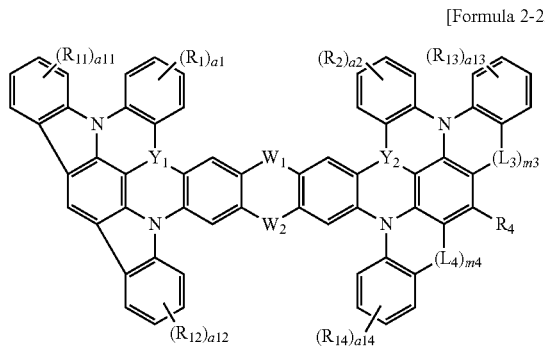

[Formula 2-2A]

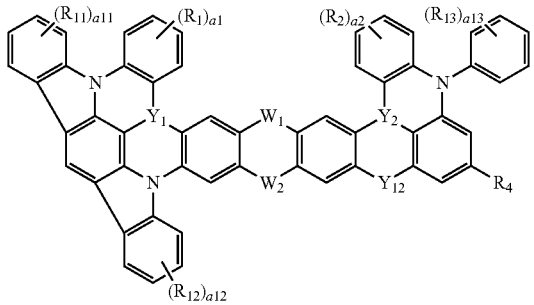

[Formula 2-2B]

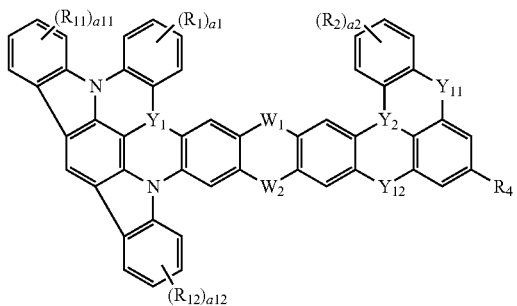

[Formula 2-2C]

In Formula 2-2A, at least one of m3 and m4 may be 1, and the remainder of m3 and m4 may be 0 or 1, and $L_3$ and $L_4$ may each be a direct linkage. In Formula 2-2B and Formula 2-2C, $Y_{11}$ and $Y_{12}$ may each independently be O or S. In Formula 2-2B, a16 may be an integer from 0 to 5. In Formula 2-2A to Formula 2-2C, a11 to a14 may each independently be an integer from 0 to 4, $R_{11}$ to $R_{14}$, and $R_{16}$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and a1, a2, $R_1$, $R_2$, $R_4$, $Y_1$, $Y_2$, $W_1$, and $W_2$ may be the same as defined in connection with Formula 2-2.

In an embodiment, $R_3$ and $R_4$ may each independently be represented by R-1 or R-2 below.

[Formula R-1]

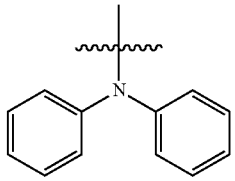

R-1

[Formula R-2]

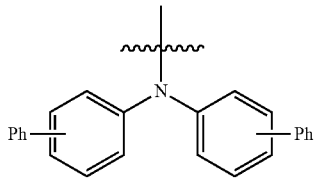

In R-2, Ph is a phenyl group. In R-1 and R-2,

indicates a binding site to a neighboring atom.

In an embodiment, $Y_1$ and $Y_2$ may be the same.

In an embodiment, the polycyclic compound may have bilateral symmetry with respect to $Q_1$.

In an embodiment, $Y_3$ to $Y_6$ may each be $N(R_7)$, and at least one of the $R_7$ groups may be combined with an adjacent ring Z1 or an adjacent ring Z2 to form a ring.

In an embodiment, the polycyclic compound may include at least one substituted or unsubstituted diphenylamine group.

In an embodiment, the emission layer may emit light with a central wavelength in a range of about 430 nm to about 470 nm.

In an embodiment, the light emitting device may further include a capping layer disposed on the second electrode, and the capping layer may have a refractive index equal to or greater than about 1.6.

In an embodiment, the emission layer may be a delayed fluorescence emission layer including a host and a dopant, and the dopant may include the polycyclic compound.

Another embodiment provides a light emitting device that may include a first electrode, a second electrode disposed on the first electrode, and an emission layer disposed between the first electrode and the second electrode and including the polycyclic compound represented by Formula 1, wherein an external quantum efficiency of the light emitting device may be in a range of about 24% to about 30%.

BRIEF DESCRIPTION OF THE DRAWINGS

The accompanying drawings are included to provide a further understanding of the embodiments and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
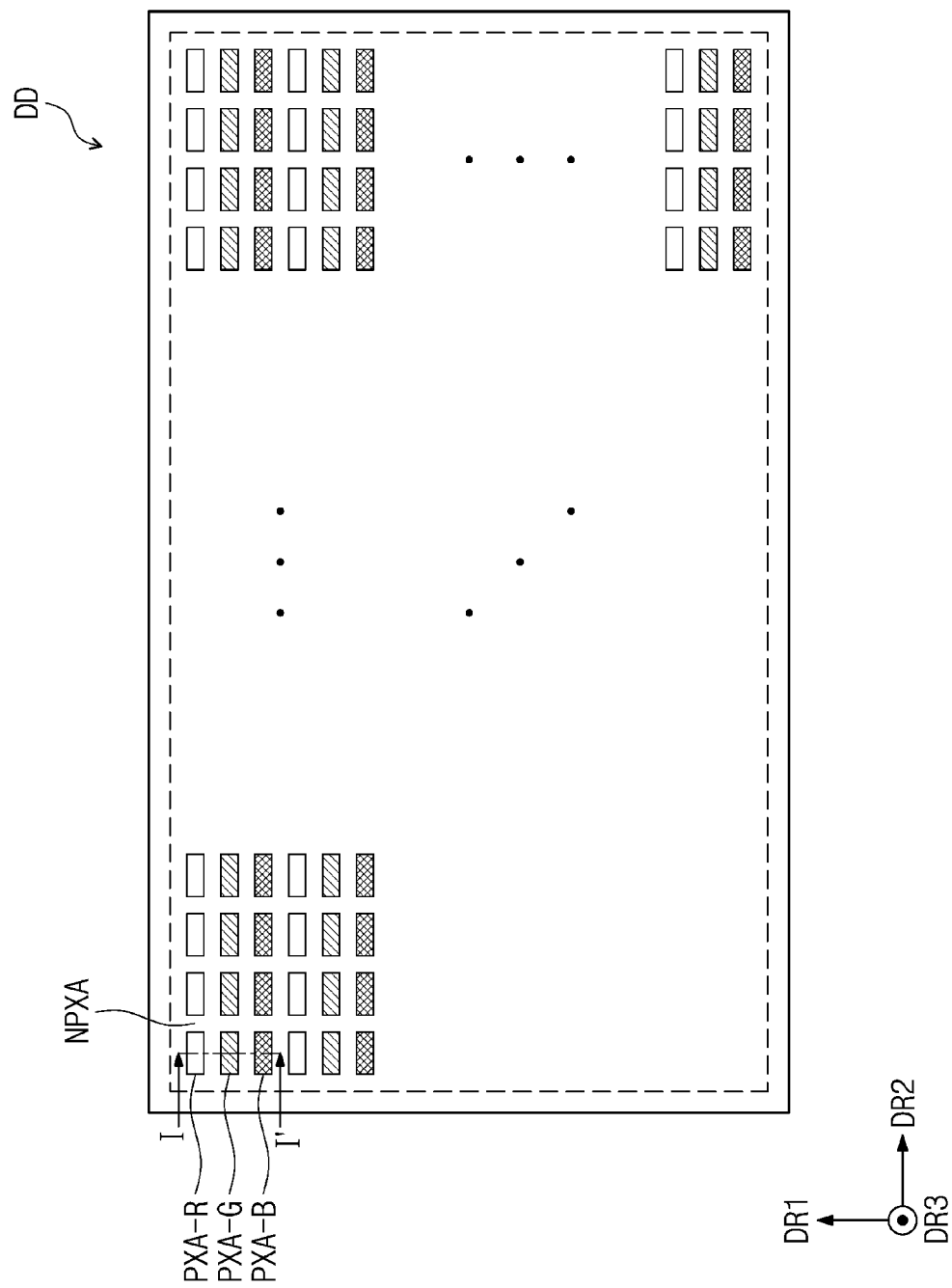
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a light emitting device according to an embodiment will be explained with reference to the attached drawings.

Figure 2:
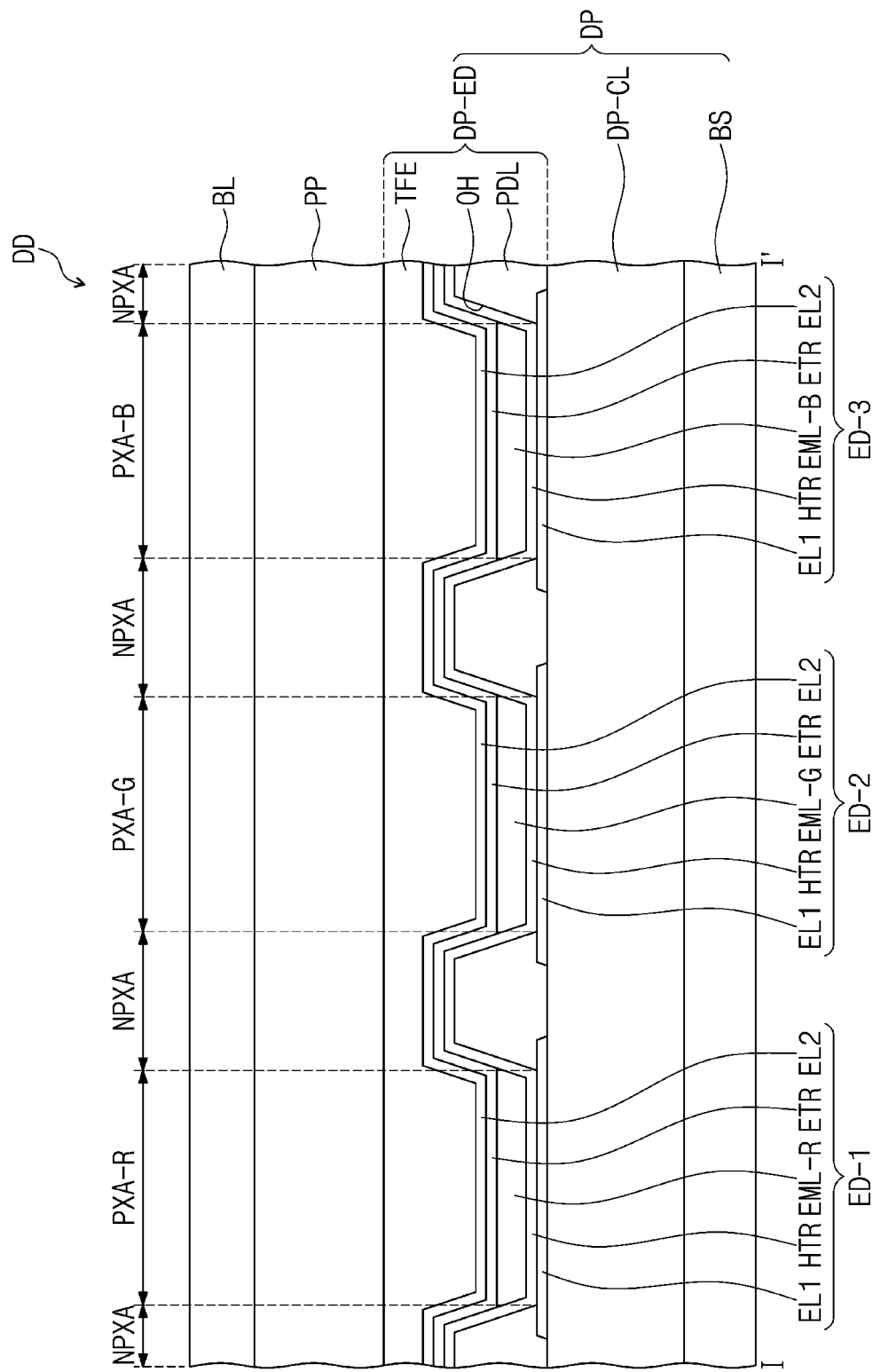
FIG. 2 is a schematic cross-sectional view showing a display apparatus according to an embodiment.

FIG. 1 is a plan view showing an embodiment of a display apparatus DD. FIG. 2 is a schematic cross-sectional view showing a display apparatus DD of an embodiment. FIG. 2 is a schematic cross-sectional view showing a part corresponding to line I-I' in FIG. 1. The display apparatuses DD and DD-TD of embodiments may include a light emitting device ED according to an embodiment. At least one among light emitting devices ED-1, ED-2, and ED-3, which will be explained later, may be the light emitting device ED according to an embodiment. At least one among light emitting devices ED-1, ED-2, and ED-3 may include a polycyclic compound of an embodiment. A light emitting device ED-BT (FIG. 8) with a tandem structure, which will be explained later, may include the polycyclic compound of an embodiment in at least one emission layer among multiple emission layers. The light emitting device ED of an embodiment including the polycyclic compound of an embodiment may have an external quantum efficiency in a range of about 24% to about 30%. The polycyclic compound of an embodiment will be explained later.

The display apparatus DD according to an embodiment may be an apparatus activated by electrical signals. For example, the display apparatus DD may be a personal computer, a laptop computer, a personal digital terminal, a car navigation unit, a game console, a smart phone, a tablet, or a camera. These are only examples of embodiments, and embodiments of the disclosure are not limited thereto.

The display apparatus DD may include a display panel DP and an optical layer PP disposed on the display panel DP. The display panel DP may include light emitting devices ED-1, ED-2, and ED-3. The display panel DP may include multiple light emitting devices ED-1, ED-2, and ED-3. The optical layer PP may be disposed on the display panel DP and may control light reflected from an external light at the display panel DP. The optical layer PP may include, for example, a polarization layer or a color filter layer. Although not shown in the drawings, the optical layer PP may be omitted in the display apparatus DD of an embodiment.

On the optical layer PP, a base substrate BL may be disposed. The base substrate BL may be a member providing a base surface for disposing the optical layer PP. The base substrate BL may be a glass substrate, a metal substrate, a plastic substrate, etc. However, embodiments are not limited thereto. The base substrate BL may include an inorganic layer, an organic layer, or a composite material layer. Although not shown in the drawings, the base substrate BL may be omitted in an embodiment.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one among an acrylic resin, a silicon-based resin, and an epoxy-based resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2, and ED-3 disposed between the pixel definition layers PDL, and an encapsulating layer TFE disposed on the light emitting devices ED-1, ED-2, and ED-3.

The base layer BS may be a member providing a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include multiple transistors (not shown). Each of the transistors (not shown) may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2, and ED-3 may have the structure of a light emitting device ED of an embodiment according to FIG. 3 to FIG. 6, which will be explained later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

In FIG. 2, shown is an embodiment where the emission layers EML-R, EML-G, and EML-B of the light emitting devices ED-1, ED-2, and ED-3 are disposed in opening parts OH defined in the pixel definition layer PDL, and the hole transport region HTR, the electron transport region ETR, and the second electrode EL2 are provided as common layers in all light emitting devices ED-1, ED-2, and ED-3. However, embodiments are not limited thereto. Although not shown in FIG. 2, in an embodiment, the hole transport region HTR and the electron transport region ETR may be patterned and provided in the opening parts OH defined in the pixel definition layer PDL. For example, in an embodiment, the hole transport region HTR, the emission layers EML-R, EML-G and EML-B, and the electron transport region ETR of the light emitting devices ED-1, ED-2, and ED-3 may be patterned by an ink jet printing method and provided.

The encapsulating layer TFE may cover the light emitting devices ED-1, ED-2, and ED-3. The encapsulating layer TFE may be disposed on the second electrode EL2 and may be disposed to fill an opening part OH. The encapsulating layer TFE may encapsulate the display device layer DP-ED. The encapsulating layer TFE may be a thin film encapsulating layer. The encapsulating layer TFE may be one layer or a stack of layers. The encapsulating layer TFE may include at least one insulating layer. The encapsulating layer TFE according to an embodiment may include at least one inorganic layer (hereinafter, an encapsulating inorganic layer). The encapsulating layer TFE according to an embodiment may include at least one organic layer (hereinafter, an encapsulating organic layer) and at least one encapsulating inorganic layer.

The encapsulating inorganic layer may protect the display device layer DP-ED from moisture/oxygen, and the encapsulating organic layer may protect the display device layer DP-ED from foreign materials such as dust particles. The encapsulating inorganic layer may include a silicon nitride layer, a silicon oxy nitride layer, a silicon oxide layer, a titanium oxide layer, or an aluminum oxide layer, without specific limitation. The encapsulating organic layer may include an acrylic compound, an epoxy-based compound, etc. The encapsulating organic layer may include a photo-polymerizable organic material, without specific limitation.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G and PXA-B may be areas separated by the pixel definition layer PDL. The non-luminous areas NPXA may be areas between neighboring luminous areas PXA-R, PXA-G, and PXA-B and may be areas corresponding to the pixel definition layer PDL. In the disclosure, each of the luminous areas PXA-R, PXA-G, and PXA-B may correspond to a pixel. The pixel definition layer PDL may divide the light emitting devices ED-1, ED-2, and ED-3. The emission layers EML-R, EML-G, and EML-B of the light emitting devices ED-1, ED-2, and ED-3 may be disposed and divided in the opening parts OH defined in the pixel definition layer PDL.

The luminous areas PXA-R, PXA-G, and PXA-B may be divided into groups according to the color of light produced from the light emitting devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, multiple light emitting devices ED-1, ED-2, and ED-3 may emit light having different wavelength regions. For example, in an embodiment, the display apparatus DD may include a first light emitting device ED-1 emitting red light, a second light emitting device ED-2 emitting green light, and a third light emitting device ED-3 emitting blue light. For example, each of the red luminous area PXA-R, the green luminous area PXA-G, and the blue luminous area PXA-B may correspond to the first light emitting device ED-1, the second light emitting device ED-2, and the third light emitting device ED-3.

However, embodiments are not limited thereto, and the first to third light emitting devices ED-1, ED-2, and ED-3 may emit light in a same wavelength region, or at least one thereof may emit light in a different wavelength region. For example, all of the first to third light emitting devices ED-1, ED-2 and ED-3 may emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G, and multiple blue luminous areas PXA-B may be arranged along a second directional axis DR2. The red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown as having a similar size, but embodiments are not limited thereto. The areas of the luminous areas PXA-R, PXA-G, and PXA-B may be different from each other according to the wavelength region of light emitted. The areas of the luminous areas PXA-R, PXA-G, and PXA-B may be areas in a plan view that are defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the properties of display quality required for the display apparatus DD. For example, the arrangement type of the luminous areas PXA-R, PXA-G, and PXA-B may be a PenTile® arrangement type, or a diamond arrangement type.

The areas of the luminous areas PXA-R, PXA-G, and PXA-B may be different from each other. For example, in an embodiment, the area of the green luminous area PXA-G may be smaller than the area of the blue luminous area PXA-B, but embodiments are not limited thereto.

Hereinafter, FIG. 3 to FIG. 6 are schematic cross-sectional views showing light emitting devices according to embodiments. The light emitting device ED according to an embodiment may include a first electrode EL1, a hole transport region HTR, an emission layer EML, an electron transport region ETR, and a second electrode EL2, stacked in that order.

Figure 3:
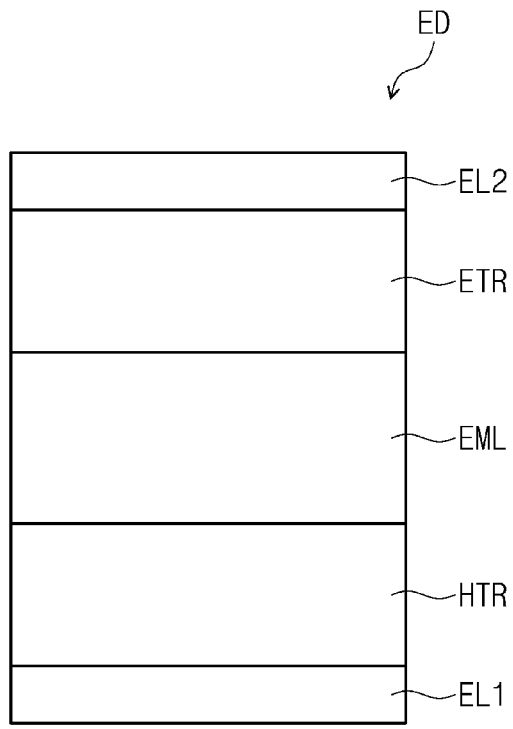
FIG. 3 is a schematic cross-sectional view showing a light emitting device of an embodiment.
Figure 4:
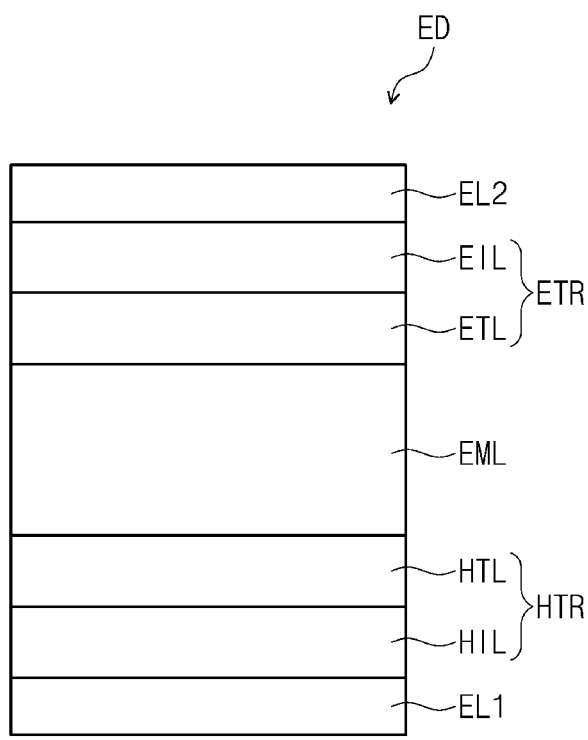
FIG. 4 is a schematic cross-sectional view showing a light emitting device of an embodiment.
Figure 5:
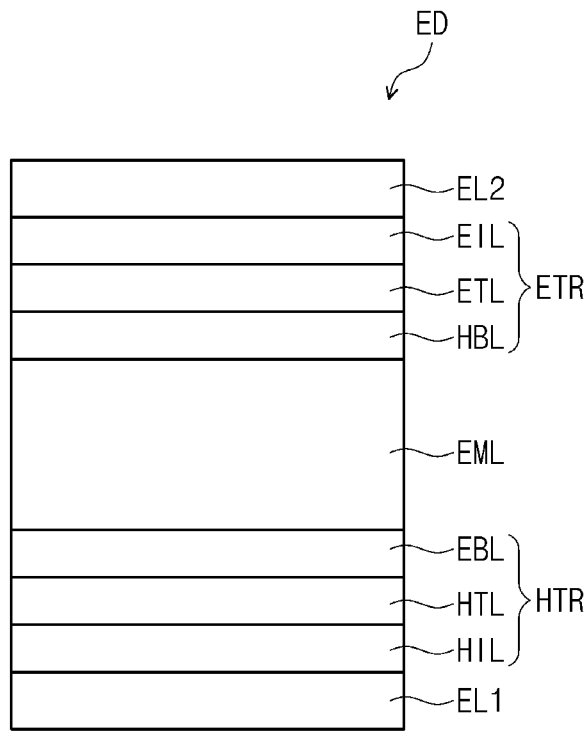
FIG. 5 is a schematic cross-sectional view showing a light emitting device of an embodiment.
Figure 6:
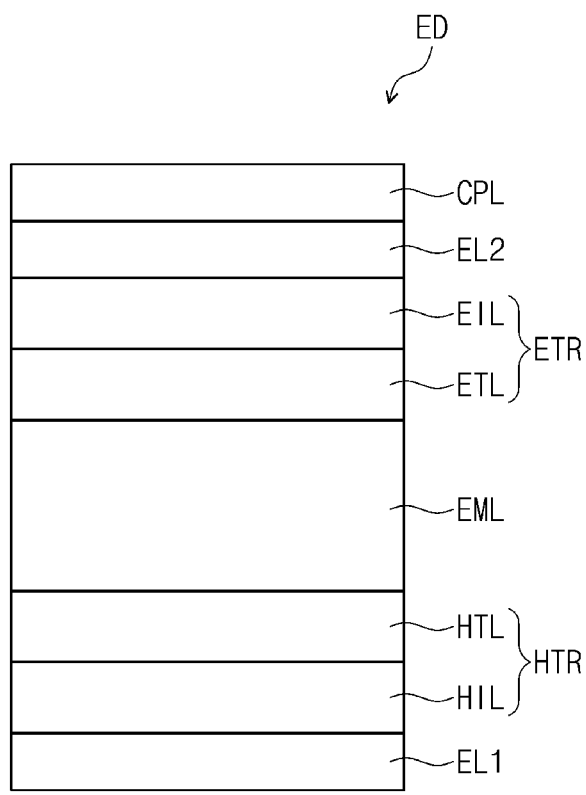
FIG. 6 is a schematic cross-sectional view showing a light emitting device of an embodiment.

In comparison to FIG. 3, FIG. 4 shows a schematic cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting device ED of an embodiment, including a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In an embodiment, the first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, embodiments are not limited thereto. The first electrode EL1 may include the aforementioned metal materials, combinations of two or more metal materials selected from the aforementioned metal materials, or oxides of the aforementioned metal materials, without limitation. A thickness of the first electrode EL1 may be in a range of about 700 Å to about 10,000 Å. For example, the thickness of the first electrode EL1 may be in a range of about 1,000 Å to about 3,000 Å.

The hole transport region HTR may be provided on the first electrode EL1. The hole transport region HTR may include at least one of a hole injection layer HIL, a hole transport layer HTL, a buffer layer (not shown), an emission auxiliary layer (not shown), and an electron blocking layer EBL. A thickness of the hole transport region HTR may be in a range of about 50 Å to about 15,000 Å.

The hole transport region HTR may have a single layer formed using a single material, a single layer formed using different materials, or a multilayer structure including layers formed using different materials.

For example, the hole transport region HTR may have the structure of a single layer of a hole injection layer HIL or a hole transport layer HTL, and may have a structure of a single layer formed using a hole injection material and a hole transport material. In another embodiment, the hole transport region HTR may have a structure of a single layer formed using different materials, or a structure stacked from the first electrode EL1 of hole injection layer HIL/hole transport layer HTL, hole injection layer HIL/hole transport layer HTL/buffer layer (not shown), hole injection layer HIL/buffer layer (not shown), hole transport layer HTL/buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

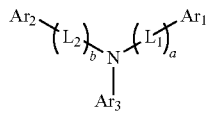

[Formula H-1]

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently an integer from 0 to 10. If a or b is an integer of 2 or more, multiple $L_1$(s) and $L_2$(s) may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

The compound represented by Formula H-1 may be a monoamine compound. In another embodiment, the compound represented by Formula H-1 may be a diamine compound in which at least one among $Ar_1$ to $Ar_3$ includes an amine group as a substituent. The compound represented by Formula H-1 may be a carbazole-based compound in which a substituted or unsubstituted carbazole group is included in at least one among $Ar_1$ and $Ar_2$, or a fluorene-based compound in which a substituted or unsubstituted fluorene group is included in at least one among $Ar_1$ and $Ar_2$.

The compound represented by Formula H-1 may be represented by any one among the compounds represented in Compound Group H below. However, the compounds illustrated in Compound Group H are embodiments, and the compound represented by Formula H-1 is not limited to those represented in Compound Group H below.

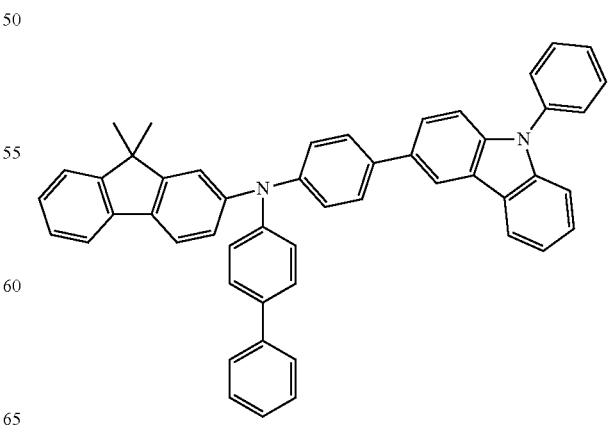

-continued
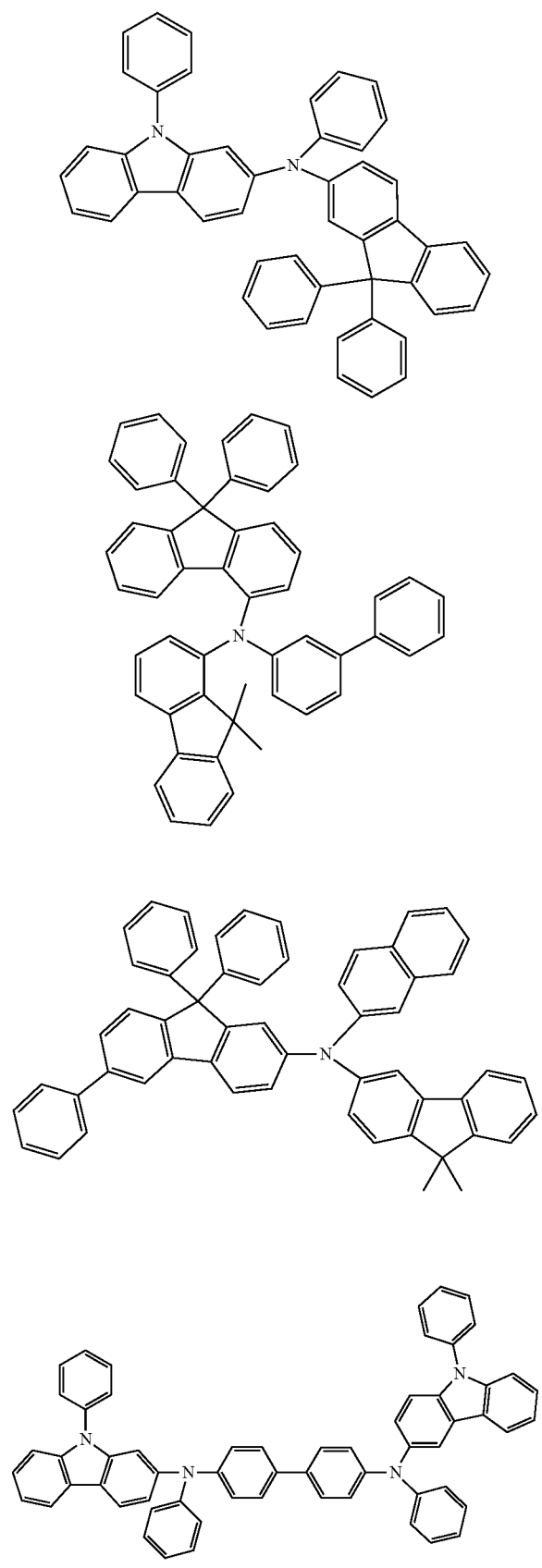
-continued
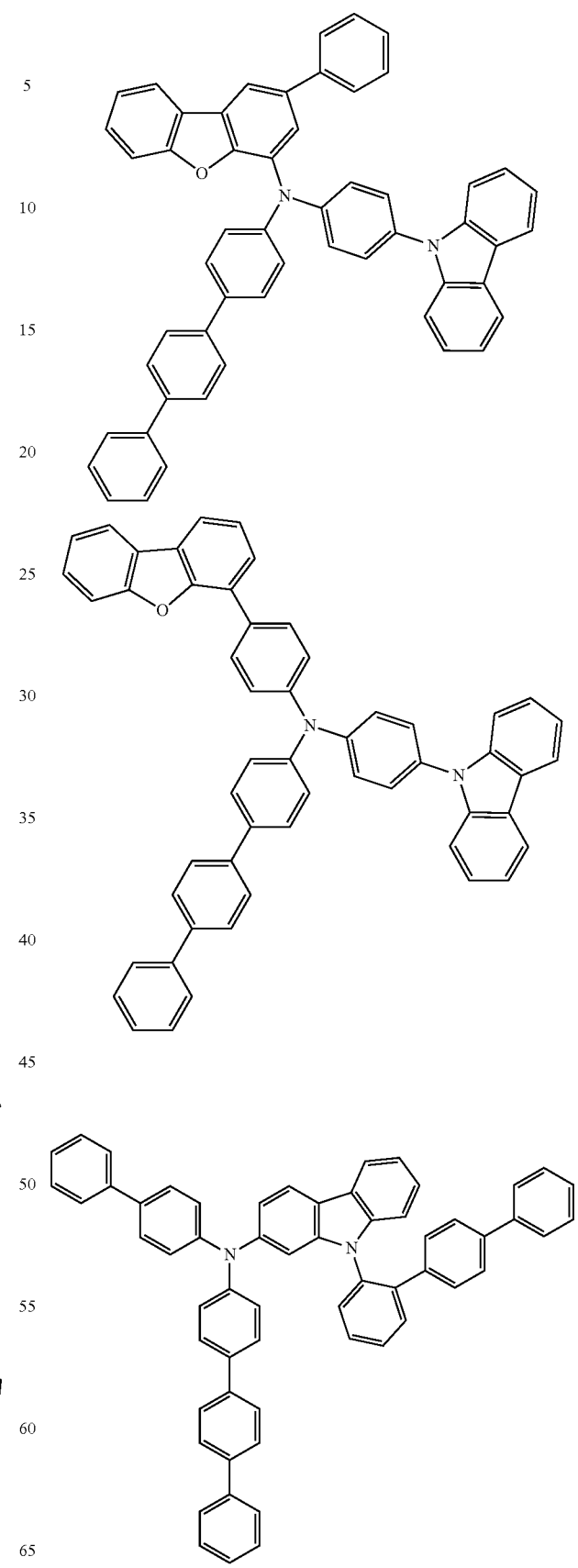

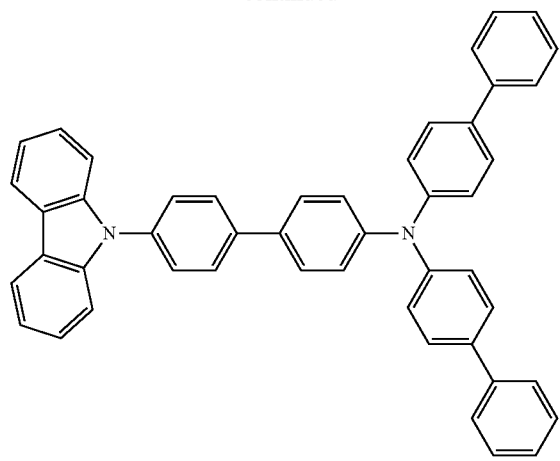
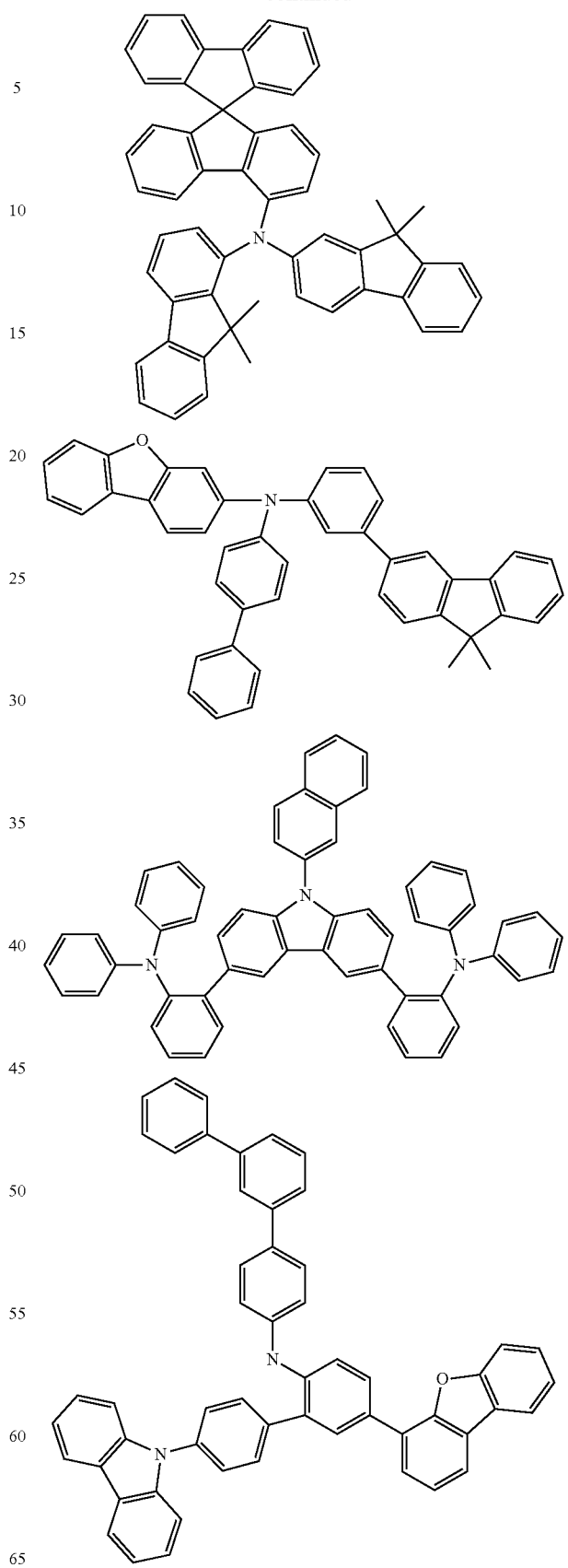

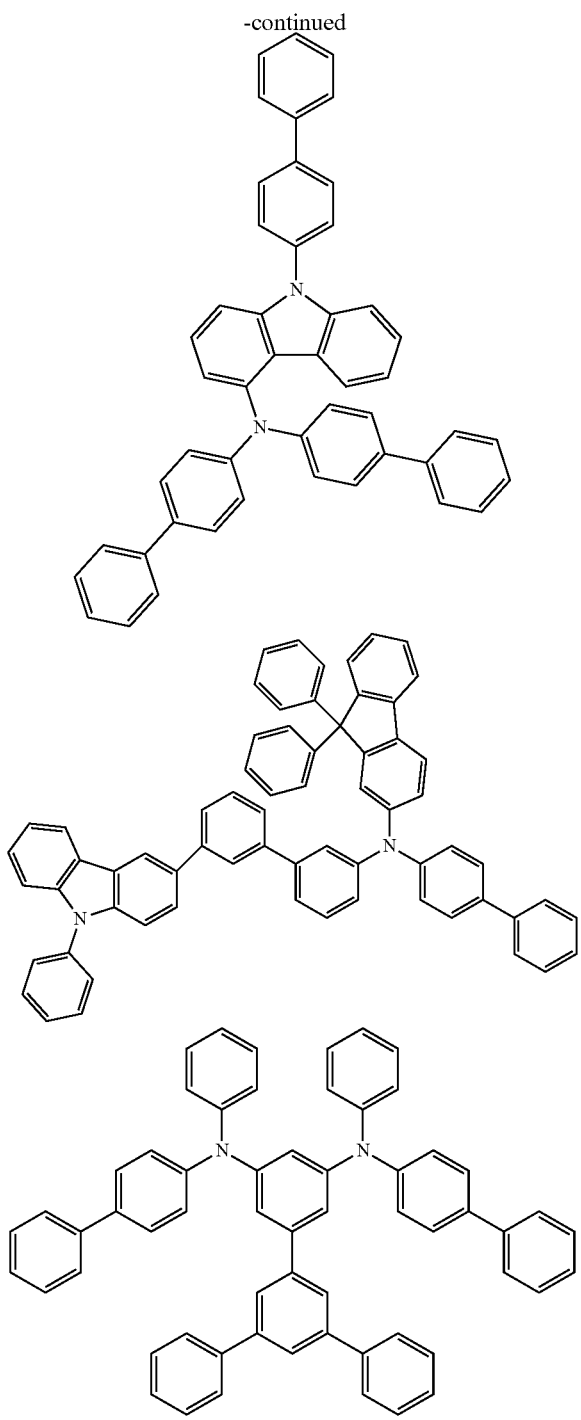

The hole transport region HTR may include, for example, a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalen-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1, r-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. In case where the hole transport region HTR includes a hole injection layer HIL, a thickness of the hole injection region HIL may be, for example, in a range of about 30 Å to about 1,000 Å. In case where the hole transport region HTR includes a hole transport layer HTL, a thickness of the hole transport layer HTL may be in a range of about 30 Å to about 1,000 Å. For example, in case where the hole transport region HTR includes an electron blocking layer EBL, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may include at least one among halogenated metal compounds, quinone derivatives, metal oxides, and cyano group-containing compounds, without limitation. For example, the p-dopant may include halogenated metal compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, and/or cyano group-containing compounds such as dipyrazino[2,3-f:2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile, without limitation.

As described above, the hole transport region HTR may further include at least one of a buffer layer (now shown) and an electron blocking layer EBL in addition to the hole injection layer HIL and the hole transport layer HTL. The buffer layer (not shown) may compensate an optical resonance distance according to the wavelength of light emitted from an emission layer EML and may increase light emission efficiency. Materials which may be included in a hole transport region HTR may be used as materials included in a buffer layer (not shown). The electron blocking layer EBL may be a layer that prevents electron injection from the electron transport region ETR to the hole transport region HTR.

The emission layer EML is provided on the hole transport region HTR. In the light emitting device ED of an embodiment, the emission layer EML may include the polycyclic compound of an embodiment.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring may include an aliphatic hydrocarbon ring and an aromatic hydrocarbon ring. The heterocycle may include an aliphatic heterocycle and an aromatic heterocycle. The ring formed by the combination with an adjacent group may be a monocyclic ring or a polycyclic ring. A ring formed via combination with an adjacent group may be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, examples of the halogen atom may include a fluorine atom, a chlorine atom, a bromine atom, and an iodine atom.

In the description, the alkyl group may be a linear, branched, or cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkenyl group may be a hydrocarbon group including one or more carbon double bonds in the middle of or at the terminal of an alkyl group of two or more carbon atoms. The alkenyl group may be a linear chain or a branched chain. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the hydrocarbon ring group may be an optional functional group or substituent, which is derived from an aliphatic hydrocarbon ring group or an aromatic hydrocarbon ring group. The hydrocarbon ring group may be a monocycle or a polycycle. The number of ring-forming carbon atoms in the hydrocarbon ring group may be 5 to 30, or 5 to 20.

In the description, the aryl group may be an optional functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heterocyclic group may include one or more among B, O, N, P, Si, and S as heteroatoms. If the heterocyclic group includes two or more heteroatoms, the two or more heteroatoms may be the same or different. The heterocyclic group may be a monocyclic heterocyclic group or a polycyclic heterocyclic group and may include a heteroaryl group. The number of ring-forming carbon atoms in the heterocyclic group may be 2 to 30, 2 to 20, or 2 to 10.

In the description, the heteroaryl group may include one or more among B, O, N, P, Si, and S as heteroatoms. If the heteroaryl group includes two or more heteroatoms, two or more heteroatoms may be the same or different. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the thio group may include an alkyl thio group and an aryl thio group. The thio group may include the above-defined alkyl group or aryl group combined with a sulfur atom. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, the oxy group may include the above-defined alkyl group or aryl group combined with an oxygen atom. The oxy group may include an alkoxy group and an aryl oxy group. The alkoxy group may be a linear chain, a branched chain, or a ring chain. The number of carbon atoms in the alkoxy group is not specifically limited but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

In the description, the number of carbon atoms in the amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., without limitation.

In the description, a direct linkage may be a single bond.

In the description,

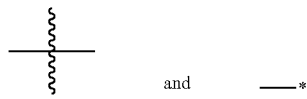

each indicate a binding site to a neighboring atom.

In the light emitting device ED of an embodiment, the emission layer EML may include a polycyclic compound represented by Formula 1 below.

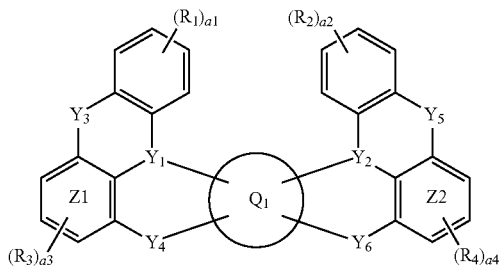

[Formula 1]

In Formula 1, $Q_1$ may be a substituted or unsubstituted hydrocarbon ring group, or a substituted or unsubstituted heterocyclic group. $Q_1$ may be a monocyclic ring group or a polycyclic ring group. $Q_1$ may be a monocyclic aromatic ring group or an aromatic ring group having three rings. The monocyclic aromatic ring group may be a hexagonal ring. The aromatic ring group having three rings may include one pentagonal ring and two hexagonal rings, and the pentagonal ring may include only carbon atoms or one heteroatom. The one heteroatom may be N, O, S, or Si. Carbon atoms among the ring-forming atoms of $Q_1$ may be combined with $Y_1$, $Y_2$, $Y_4$, and $Y_6$ to form a fused ring.

In an embodiment, the polycyclic compound represented by Formula 1 may have bilateral symmetry with respect to $Q_1$. For example, $Y_1$ and $Y_2$ may be the same, $Y_4$ and $Y_6$ may be the same, and $Y_3$ and $Y_5$ may be the same.

$Y_1$ and $Y_2$ may each independently be B, N, P, P=O, P=S, Al, Ga, As, Si($R_5$), or Ge($R_6$). In an embodiment, $Y_1$ and $Y_2$ may be the same. For example, $Y_1$ and $Y_2$ may each be a boron atom. Carbon atoms constituting $Y_1$, $Y_2$, $Y_4$, and $Y_6$ may be bonded to $Q_1$, respectively.

$Y_3$ to $Y_6$ may each independently be N($R_7$), O, or S, and at least one of $Y_3$ to $Y_6$ may be N($R_7$). At least one of $Y_3$ and $Y_4$ may be N($R_7$), or at least one of $Y_5$ and $Y_6$ may be N($R_7$). In case where at least one of $Y_3$ and $Y_4$ is N($R_7$), $R_7$ may be combined with adjacent ring Z1 to form a ring. In another embodiment, in case where at least one of $Y_5$ and $Y_6$ is N($R_7$), $R_7$ may be combined with adjacent ring Z2 to form a ring.

For example, in case where $Y_4$ is N($R_7$), and $R_7$ is a phenyl group, $R_7$ may be combined with adjacent ring Z1 to form a fused ring. In case where $Y_3$ and $Y_4$ are each N($R_7$), and $R_7$ is a phenyl group, two $R_7$ groups may be combined with adjacent ring Z1 to form a fused ring. In case where $Y_5$ is N($R_7$), and $R_7$ is a phenyl group, $R_7$ may be combined with adjacent ring Z2 to form a fused ring. In case where $Y_5$ and $Y_6$ are each N($R_7$), and $R_7$ is a phenyl group, two $R_7$ groups may be combined with adjacent ring Z2 to form a fused ring.

In case where $Y_3$ to $Y_6$ are all N($R_7$), and $R_7$ is a phenyl group, two $R_7$ groups may be combined with adjacent ring Z1, and the remaining two $R_7$ groups may be combined with adjacent ring Z2 to form fused rings. In case where $Y_3$ to $Y_6$ are all N($R_7$), and $R_7$ is a phenyl group, one $R_7$ among four $R_7$ groups may be combined with adjacent ring Z1 or adjacent ring Z2 to form a fused ring. In case where $Y_3$ to $Y_6$ are all N($R_7$), and $R_7$ is a phenyl group, two $R_7$ groups among four $R_7$ groups may be combined with adjacent ring Z1 or adjacent ring Z2 to form fused rings.

In Formula 1, a1 and a2 may each independently be an integer from 0 to 4. If a1 is an integer of 2 or more, multiple $R_1$ groups may be the same or different. If a2 is an integer of 2 or more, multiple $R_2$ groups may be the same or different.

In Formula 1, a3 and a4 may each independently be an integer from 0 to 3. If a3 is an integer of 2 or more, multiple $R_3$ groups may be the same or different. If a4 is an integer of 2 or more, multiple $R_4$ groups may be the same or different.

In Formula 1, $R_1$ to $R_7$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, at least one among $R_1$ to $R_7$ may be a substituted or unsubstituted diphenylamine group. In an embodiment, the polycyclic compound represented by Formula 1 may include at least one substituted or unsubstituted diphenylamine group.

In an embodiment, in Formula 1, $R_3$ and $R_4$ may each independently be represented by R-1 or R-2 below. In R-2, Ph is a phenyl group. In R-1 and R-2,

indicates a binding site to a neighboring atom.

R-1

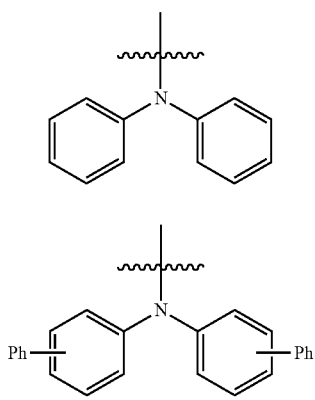

R-2

[Formula 1-3]

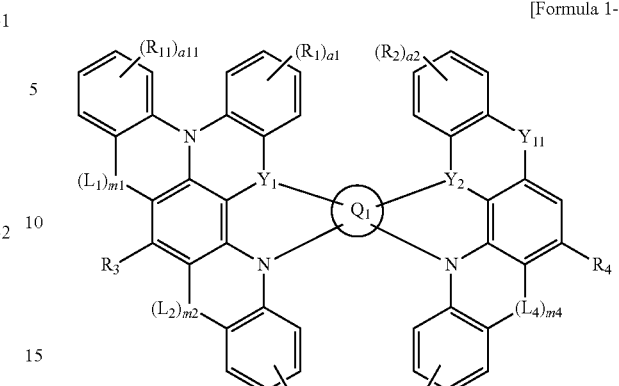

[Formula 1-4]

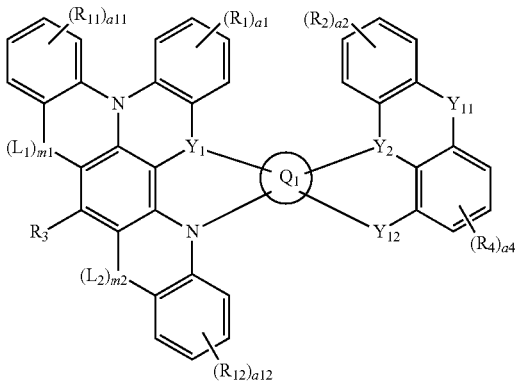

According to an embodiment, Formula 1 may be represented by any one among Formula 1-1 to Formula 1-4 below. Formula 1-1 represents a case where $Y_3$ to $Y_6$ are all $N(R_7)$, and $R_7$ is a phenyl group. Formula 1-2 represents a case where $Y_3$ to $Y_5$ are each $N(R_7)$, and $R_7$ is a phenyl group. Formula 1-3 represents a case where $Y_3$, $Y_4$, and $Y_6$ are each $N(R_7)$, and $R_7$ is a phenyl group. Formula 1-4 represents a case where $Y_3$ and $Y_4$ are each $N(R_7)$, and $R_7$ is a phenyl group.

[Formula 1-1]

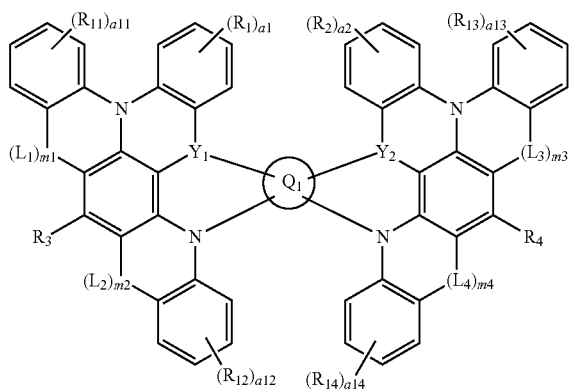

[Formula 1-2]

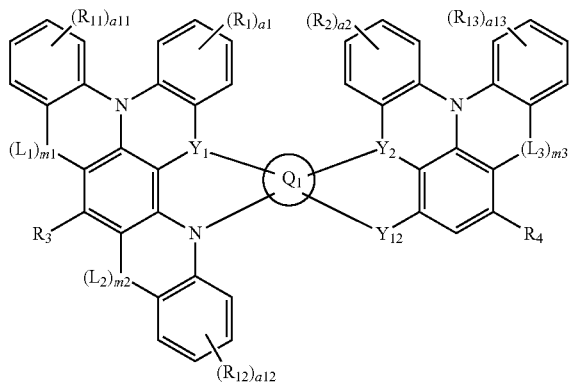

In Formula 1-1 to Formula 1-4, a1, a2, a4, $R_1$ to $R_4$, $Q_1$, $Y_1$, and $Y_2$ may be the same as defined in connection with Formula 1 above. According to an embodiment, in Formula 1-1, $Y_1$ and $Y_2$ may each independently be Al, Ga, or As. According to another embodiment, in Formula 1-1, $Y_1$ and $Y_2$ may each independently be $Si(R_5)$ or $Ge(R_6)$, and $R_5$ and $R_6$ may each be an unsubstituted phenyl group.

In Formula 1-2 to Formula 1-4, $Y_{11}$ and $Y_{12}$ may each independently be O or S. In Formula 1-4, $Y_{11}$ and $Y_{12}$ may be the same. For example, in Formula 1-4, $Y_{11}$ and $Y_{12}$ may each be O. In another embodiment, $Y_{11}$ and $Y_{12}$ may be different.

In Formula 1-1 to Formula 1-4, at least one of m1 to m4 may be 1, and the remainder of m1 to m4 may each independently be 0 or 1. In Formula 1-1 to Formula 1-4, $L_1$ to $L_4$ may each be a direct linkage. For example, in Formula 1-1, m1 and m2 may be 1, and m3 and m4 may be 0. In Formula 1-2, m1 and m2 may be 1, and m3 may be 0. In Formula 1-3, m1 and m2 may be 1, and m4 may be 0. In Formula 1-4, m1 and m2 may be 1.

In Formula 1-1 to Formula 1-4, a11 to a14 may each independently be an integer from 0 to 4. If a11 is an integer of 2 or more, multiple $R_{11}$ groups may be all the same or different. If a12 is an integer of 2 or more, multiple $R_{12}$ groups may be all the same or different. If a13 is an integer of 2 or more, multiple $R_{13}$ groups may be all the same or different. If a14 is an integer of 2 or more, multiple $R_{14}$ groups may be all the same or different.

In Formula 1-1 to Formula 1-4, $R_{11}$ to $R_{14}$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, in an embodiment, if a11 is an integer of 2 or more, multiple $R_{11}$ groups may be combined to form a ring. Multiple $R_{11}$ groups may be combined to form a substituted or unsubstituted heteroaryl group. Multiple $R_{11}$ groups may combine together with carbon of a benzene ring bonded to the multiple $R_{11}$ groups to form a pentagonal aromatic ring or a hexagonal aromatic ring. Multiple $R_{11}$ groups may combine together with carbon of a benzene ring bonded to the multiple $R_{11}$ groups to form an aromatic ring including a heteroatom as a ring-forming atom. The heteroatom may be N, O, or S.

According to an embodiment, $R_{11}$ to $R_{14}$ may each independently be a methyl group, a t-butyl group, an unsubstituted phenyl group, a substituted or unsubstituted diphenylamine group, or a substituted or unsubstituted carbazole group. Each of the phenyl groups included in the substituted or unsubstituted diphenylamine group may be substituted or unsubstituted. For example, $R_{11}$ to $R_{14}$ may be all methyl groups. $R_{11}$ to $R_{14}$ may be all t-butyl groups. $R_{13}$ and $R_{14}$ may be all unsubstituted carbazole groups. However, these are only illustrations, and embodiments are not limited thereto.

In an embodiment, Formula 1-1 may be represented by any one among Formula 1-1A to Formula 1-1C below. Formula 1-1A represents Formula 1-1 where m1 to m4 are each 1, and $L_1$ to $L_4$ are each a direct linkage. Formula 1-1B represents Formula 1-1 where m1 and m2 are each 1, m3 and m4 are 0, and $L_1$ to $L_4$ are each a direct linkage. Formula 1-1C represents Formula 1-1 where m2 is 1, m1, m3 and m4 are each 0, and $L_2$ is a direct linkage.

[Formula 1-1A]

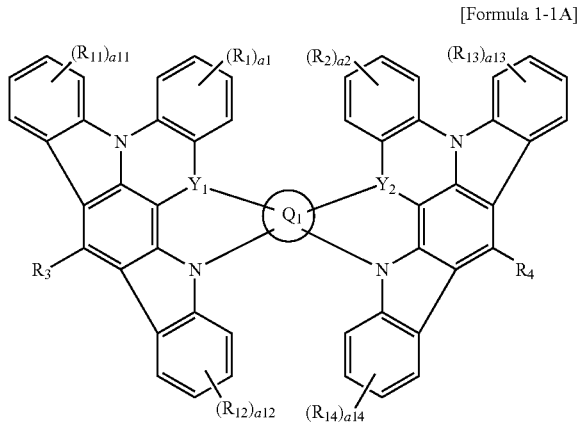

[Formula 1-1B]

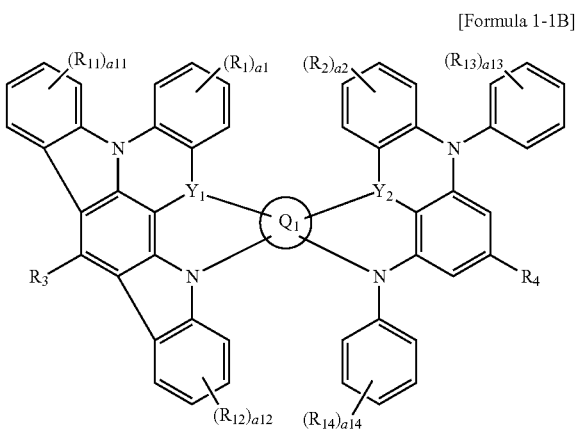

[Formula 1-1C]

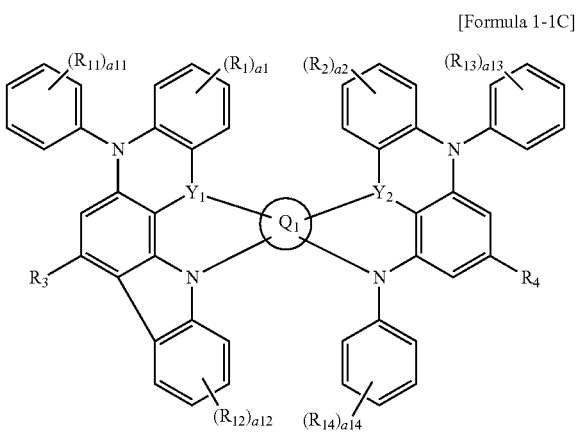

In Formula 1-1A to Formula 1-1C, a1, a2, a11 to a14, $R_1$ to $R_4$, $R_{11}$ to $R_{14}$, $Q_1$, $Y_1$, and $Y_2$ may be the same as defined in connection with Formula 1-1. In Formula 1-1A, $R_1$ to $R_4$, and $R_{11}$ to $R_{14}$ may be all deuterium atoms. The polycyclic compound represented by Formula 1 may include a deuterium atom.

According to an embodiment, Formula 1 may be represented by Formula 2-1 or Formula 2-2 below. Formula 2-1 may represent Formula 1 where $Q_1$ is a monocyclic ring group, and Formula 2-2 may represent Formula 1 where $Q_1$ is a polycyclic ring group. Formula 2-1 represents Formula 1 where $Q_1$ is a substituted or unsubstituted phenyl group, and carbon atoms of the phenyl group are bonded to $Y_1$, $Y_2$, $Y_4$, and $Y_6$. Formula 2-2 represents Formula 1 where $Q_1$ is a fused ring of three rings.

[Formula 2-1]

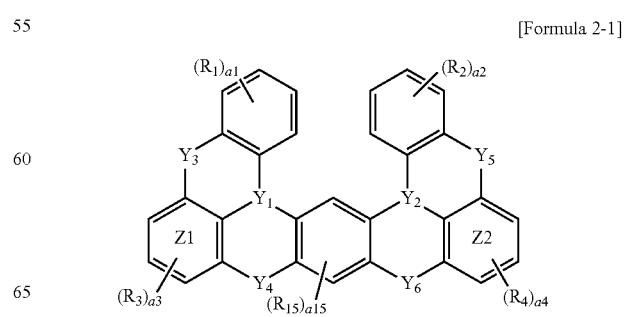

[Formula 2-2]

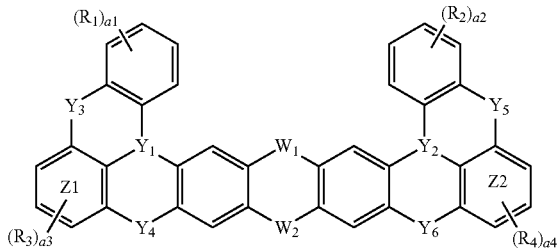

In Formula 2-1 and Formula 2-2, a1 to a4, $R_1$ to $R_4$, $Y_1$ to $Y_6$, Z1, and Z2 may be the same as defined in connection with Formula 1. In Formula 2-1, a15 may be an integer from 0 to 2. If a15 is 2, multiple $R_{15}$ groups may be the same or different. $R_{15}$ may be a hydrogen atom, a deuterium atom, a substituted or unsubstituted alkyl group of 1 to 20 carbon atoms, or a substituted or unsubstituted aryl group of 6 to 30 ring-forming carbon atoms. For example, $R_{15}$ may be a methyl group or an unsubstituted phenyl group.

Formula 2-1 may have bilateral symmetry with respect to a benzene ring including $R_{15}$. For example, $Y_1$ and $Y_2$ may be the same, $Y_3$ and $Y_5$ may be the same, and $Y_4$ and $Y_6$ may be the same. For example, $R_1$ and $R_2$ may be the same, and $R_3$ and $R_4$ may be the same.

In Formula 2-2, $W_1$ and $W_2$ may each independently be a direct linkage, $C(R_{21})(R_{22})$, $N(R_{23})$, O, S, or $Si(R_{24})(R_{25})$. In an embodiment, at least one of $W_1$ and $W_2$ may be a direct linkage. $R_{11}$ to $R_{25}$ may each independently be a hydrogen atom, a deuterium atom, or a substituted or unsubstituted aryl group of 6 to 30 ring-forming carbon atoms. For example, $R_{11}$ and $R_{22}$ may each be an unsubstituted phenyl group.

In an embodiment, Formula 2-2 may be represented by any one among Formula 2-2A to Formula 2-2C below. Formula 2-2A represents Formula 2-2 where $Y_3$ to $Y_6$ are each $N(R_7)$, four $R_7$ groups are substituted or unsubstituted phenyl groups, and two $R_7$ groups among four $R_7$ groups are combined with ring Z1 to form rings. Formula 2-2B represents Formula 2-2 where $Y_3$ to $Y_5$ are each $N(R_7)$, three $R_7$ groups are substituted or unsubstituted phenyl groups, and two $R_7$ groups among three $R_7$ groups are combined with ring Z1 to form rings. Formula 2-2C represents Formula 2-2 where $Y_3$ and $Y_4$ are each $N(R_7)$, two $R_7$ groups are substituted or unsubstituted phenyl groups, and two $R_7$ groups are combined with ring Z1 to form rings.

[Formula 2-2A]

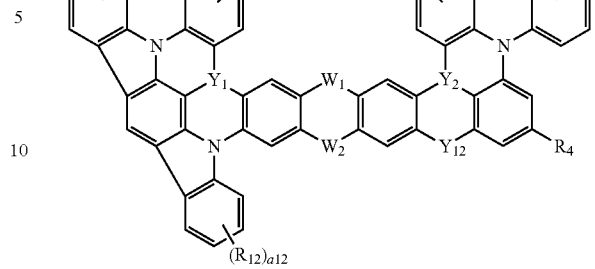

[Formula 2-2B]

![Formula 2-2B structure]

[Formula 2-2C]

![Formula 2-2C structure]

In Formula 2-2A to Formula 2-2C, a1, a2, $R_1$, $R_2$, $R_4$, $Y_1$, $Y_2$, $W_1$, and $W_4$ may be the same as defined in connection with Formula 2-2.

In Formula 2-2A, at least one of m3 and m4 may be 1, and the remainder of m3 and m4 may be 0 or 1. In Formula 2-2A, $L_3$ and $L_4$ may each be a direct linkage. In Formula 2-2B and Formula 2-2C, $Y_{11}$ and $Y_{12}$ may each independently be O or S. For example, in Formula 2-2C, $Y_{11}$ and $Y_{12}$ may each be O. For example, in Formula 2-2C, $Y_{11}$ may be S, and $Y_{12}$ may be O.

In Formula 2-2B, a16 may be an integer from 0 to 5. If a16 is an integer of 2 or more, multiple Rib groups may be the same or different. In Formula 2-2A to Formula 2-2C, a11 to a14 may each independently be an integer from 0 to 4. If a11 is an integer of 2 or more, multiple $R_{11}$ groups may be the same or different. If a12 is an integer of 2 or more, multiple $R_{12}$ groups may be the same or different. If a13 is an integer of 2 or more, multiple $R_{13}$ groups may be the same or different. If a14 is an integer of 2 or more, multiple $R_{14}$ groups may be the same or different.

In Formula 2-2A to Formula 2-2C, $R_{11}$ to $R_{14}$, and $R_{16}$ may each independently be a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

The polycyclic compound represented by Formula 1 may form a fused ring of ten or more rings. The polycyclic compound may include one or more of the structure represented by Formula Z below.

[Formula Z]

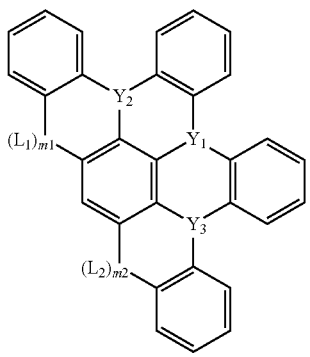

In Formula Z, $Y_1$ to $Y_3$ may be heteroatoms, and may be the same as defined in connection with Formula 1. In Formula Z, m1, m2, $L_1$, and $L_2$ may be the same as defined in connection with Formula 1-1. The polycyclic compound of an embodiment may include at least one single bond among at positions facing heteroatoms represented by $Y_2$ and $Y_3$. For example, at least one among $L_1$ and $L_2$ may be a single bond. Since at least one among $L_1$ and $L_2$ is a single bond, neighboring aromatic rings may be connected by the single bond, and a fused ring may be formed. Through the formation of the single bond at a position facing the heteroatom in the polycyclic compound, a pentagonal ring including a heteroatom may be formed. The polycyclic compound of an embodiment including the single bond may show planarity, and the $\Delta E_{ST}$ value of the polycyclic compound may show improved properties.

The polycyclic compound may be any one among the compounds represented in Compound Group 1 below. The light emitting device ED of an embodiment may include at least one polycyclic compound among the polycyclic compounds represented in Compound Group 1 in an emission layer EML.

[Compound Group 1]

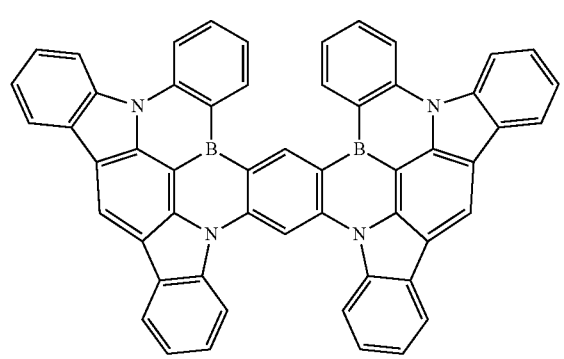

1

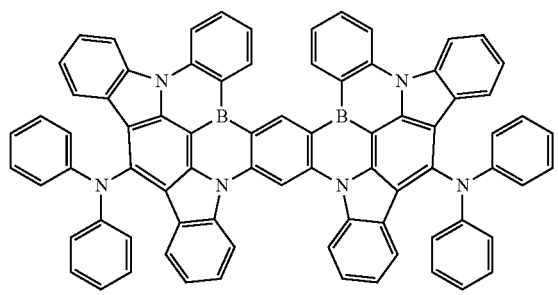

2

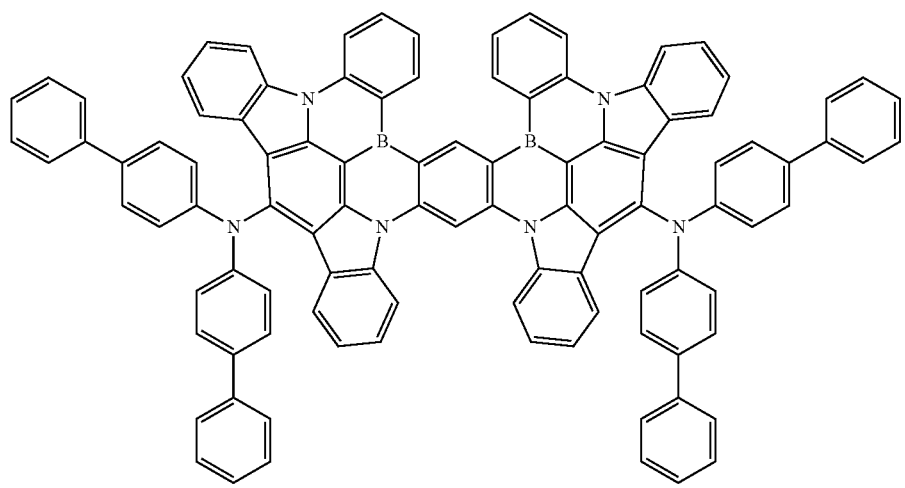

3

4
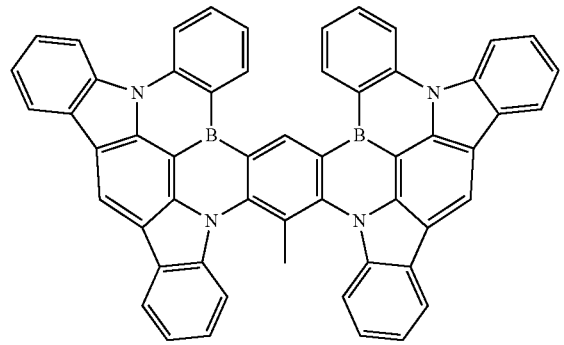
5
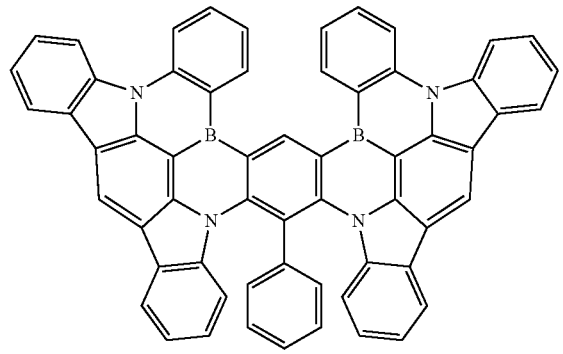
6
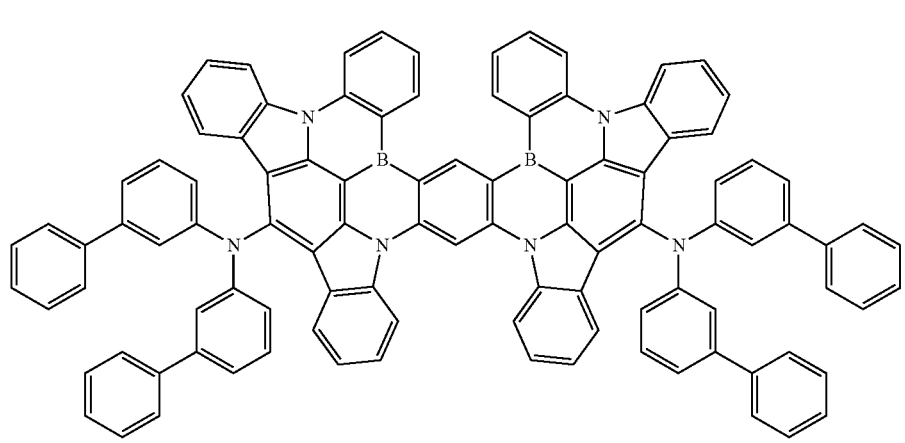
7
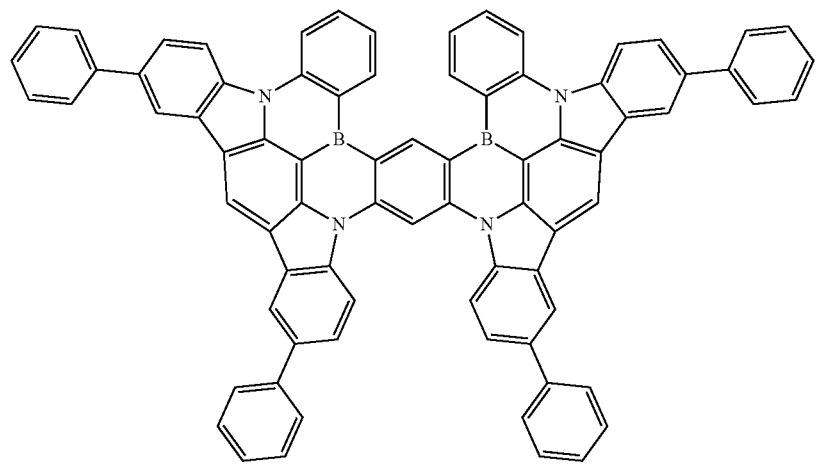
8
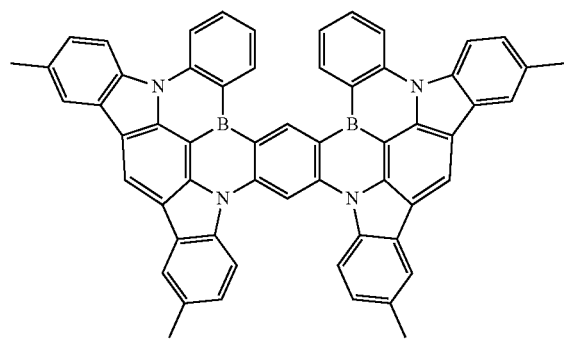
9
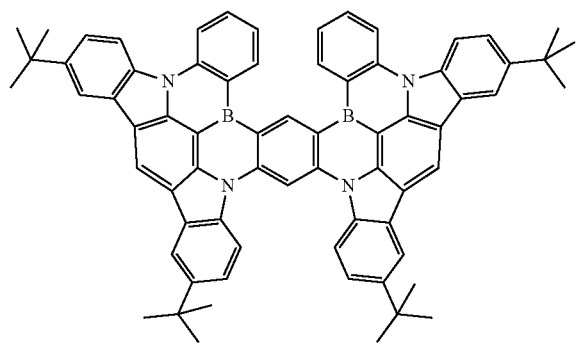

-continued
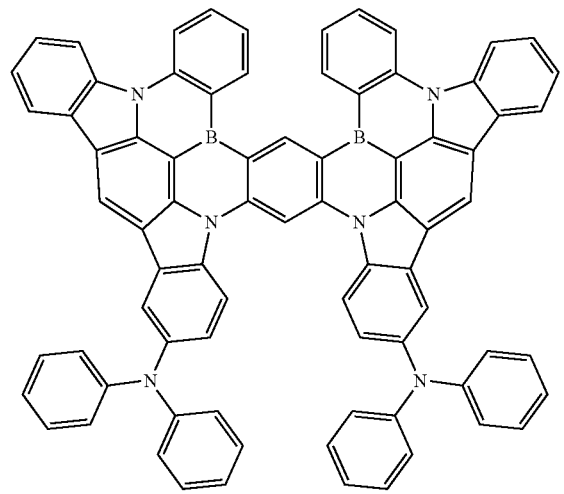
10
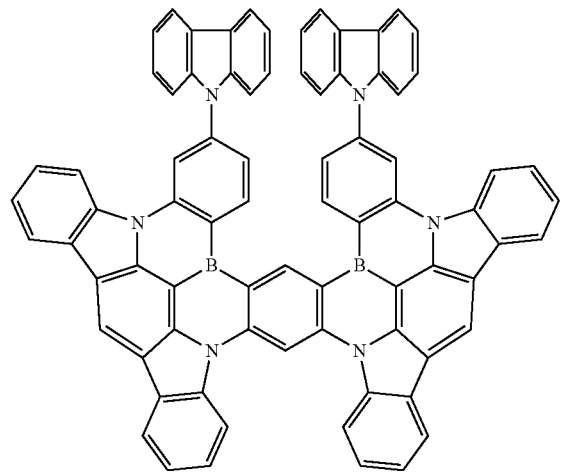
11
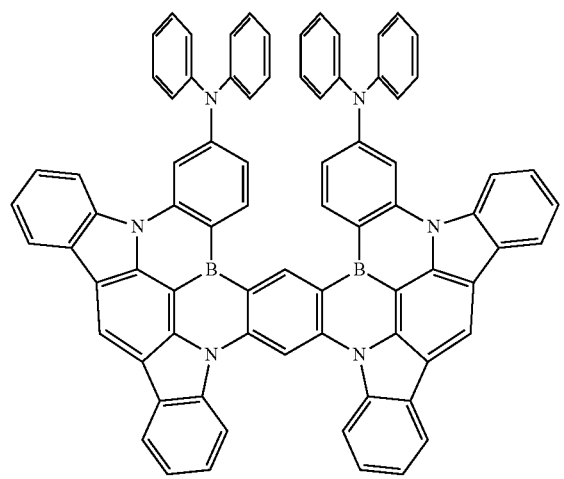
12
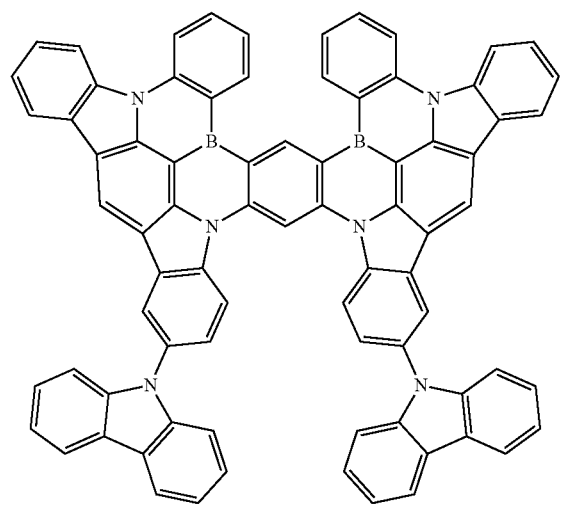
13
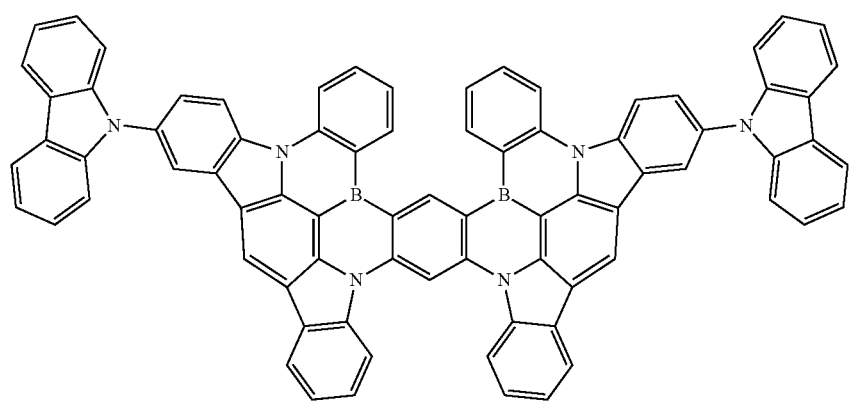
14

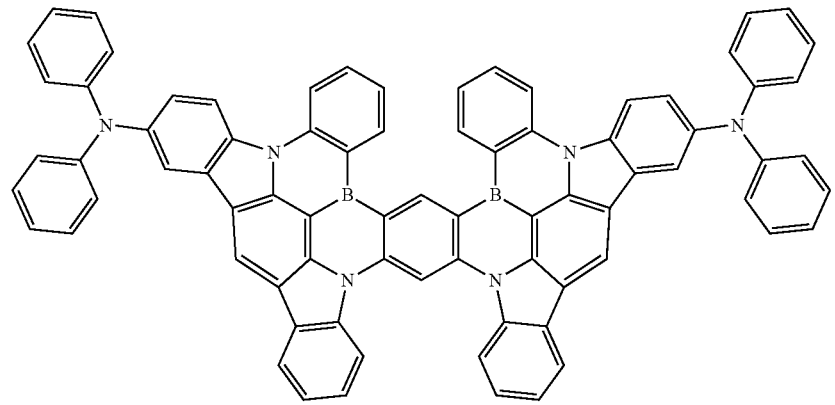
15
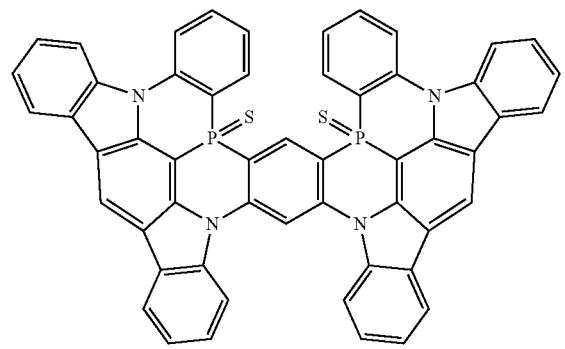
16
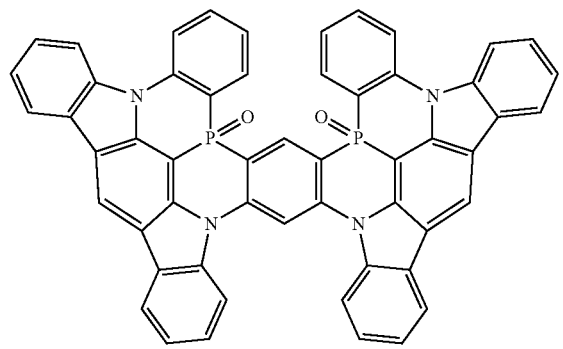
17
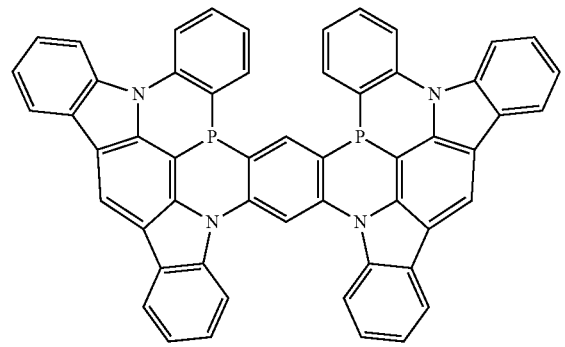
18
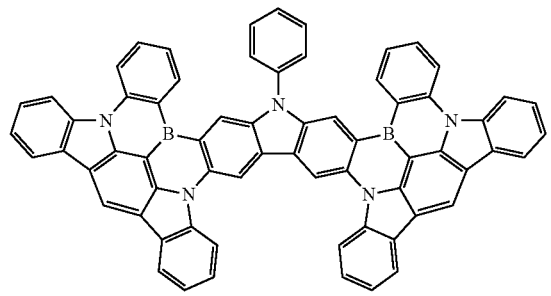
19
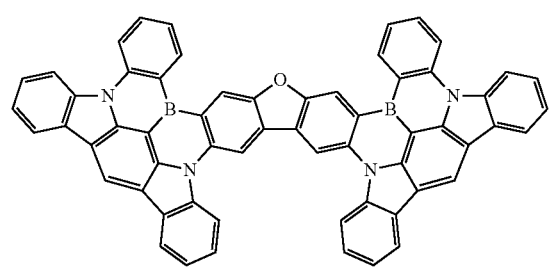
20
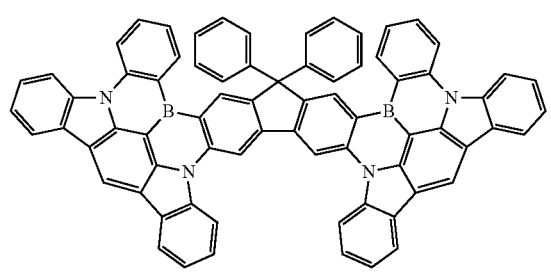
21

-continued
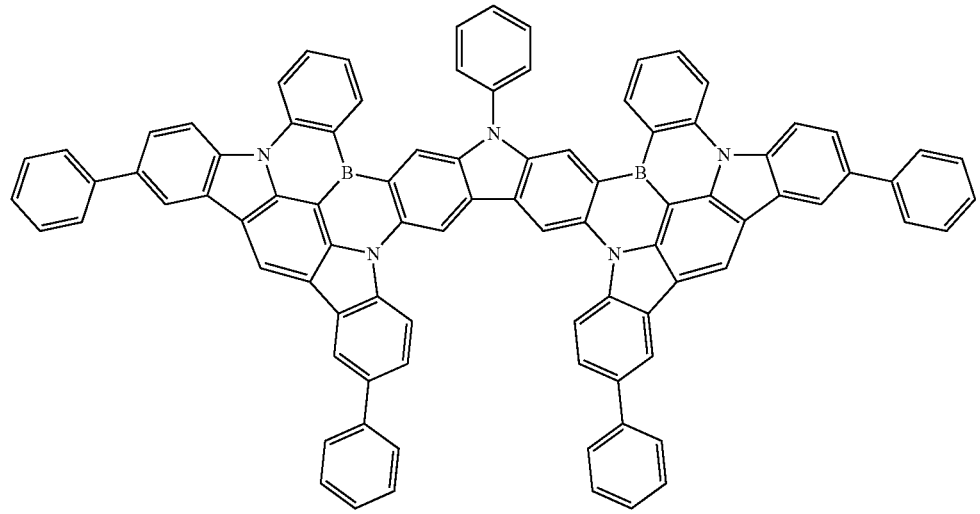
22
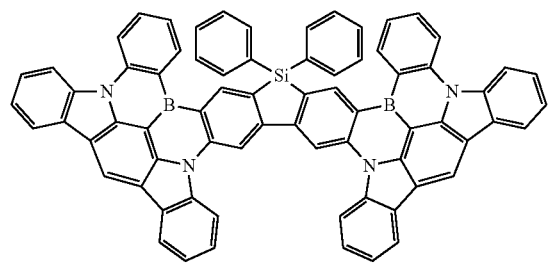
23
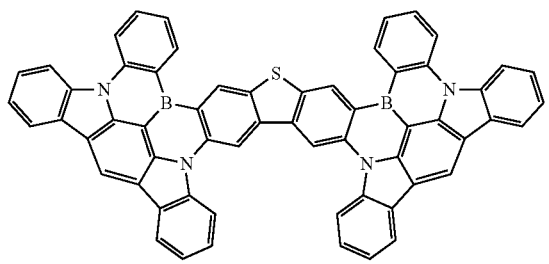
24
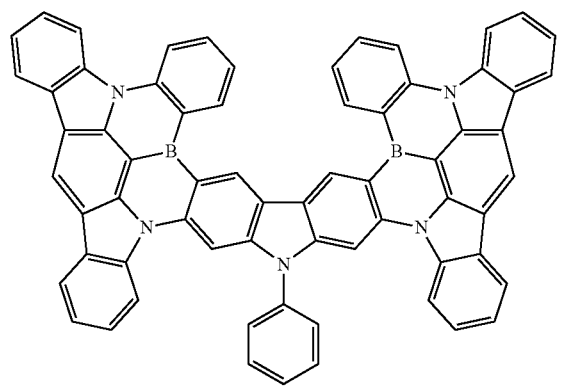
25
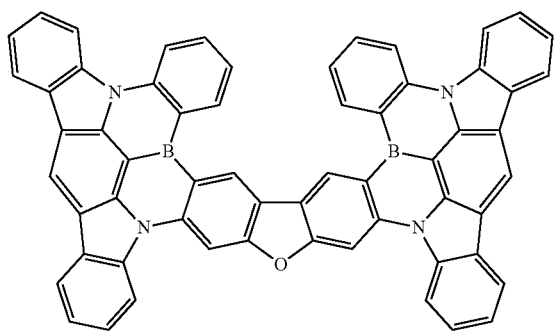
26
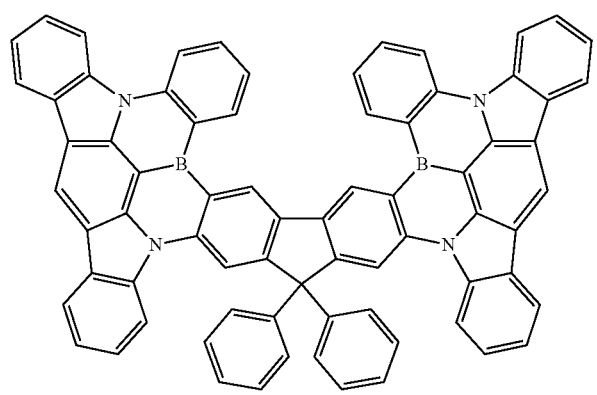
27

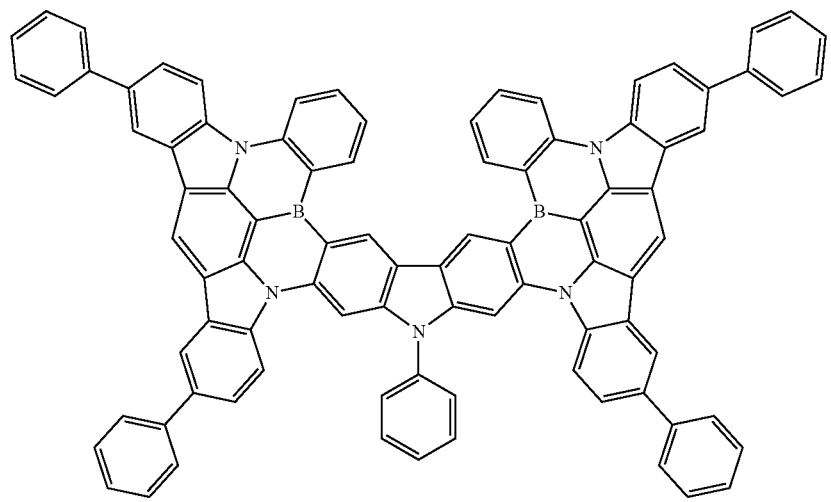
28
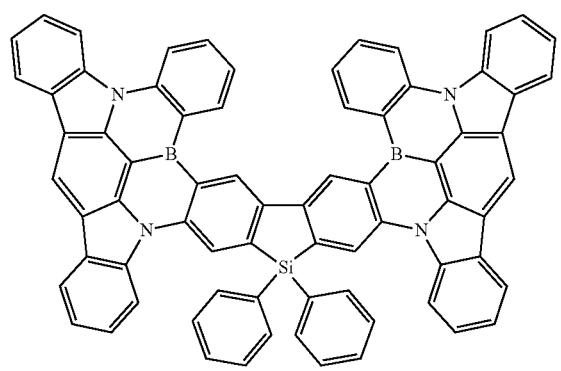
29
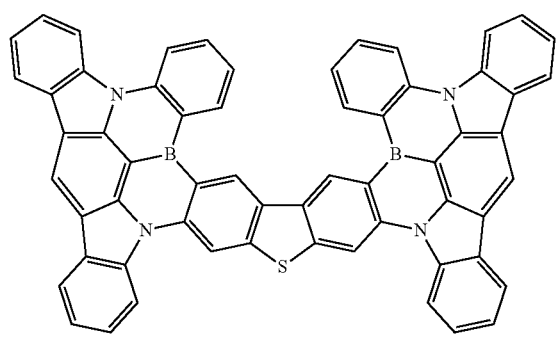
30
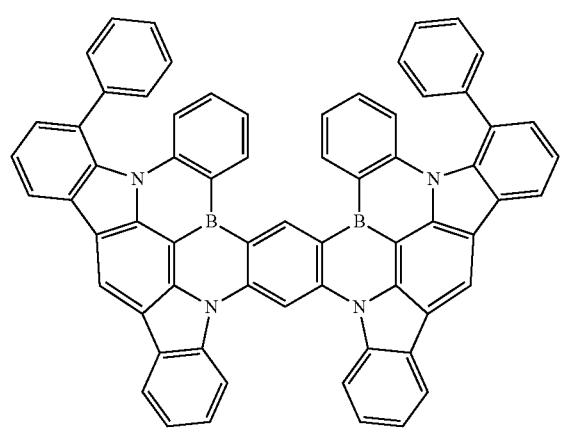
31
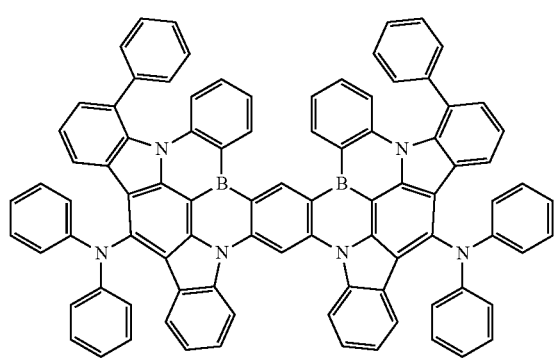
32

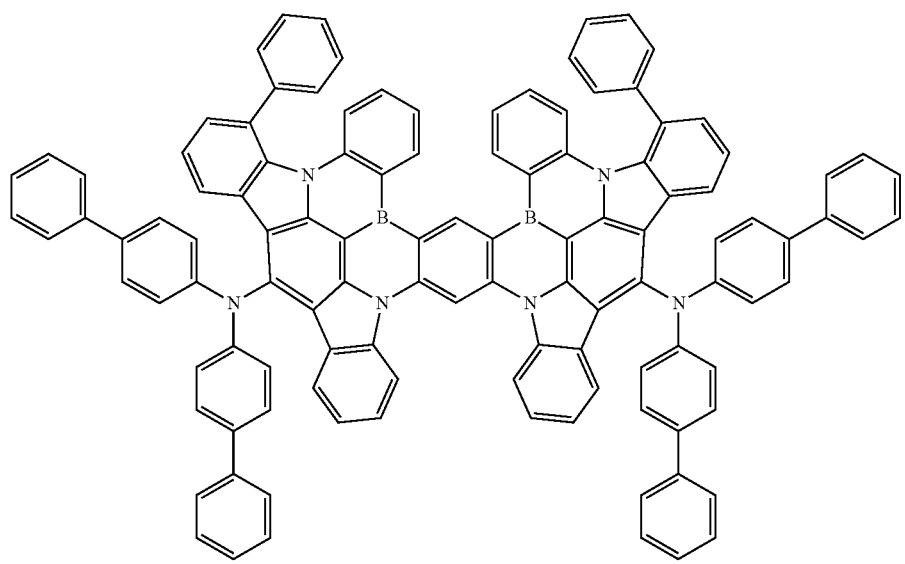
33
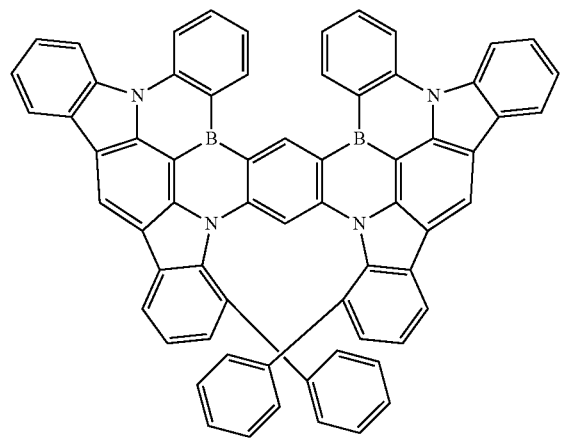
34
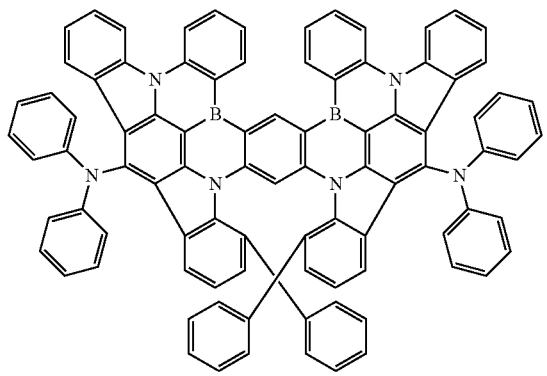
35
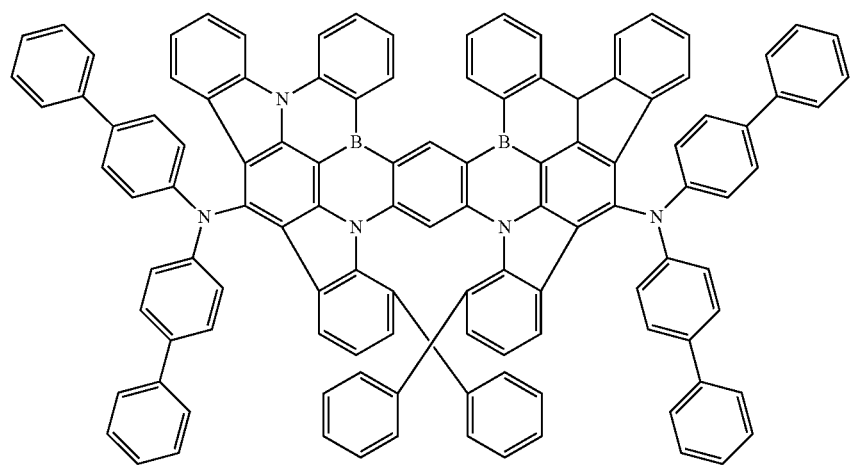
36

-continued
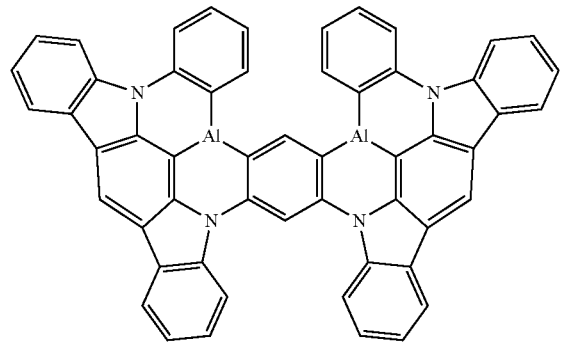
37
38
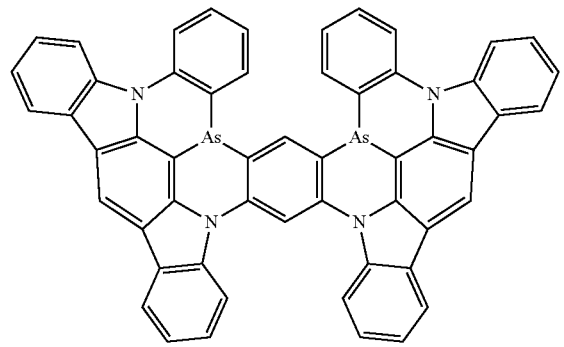
39
40
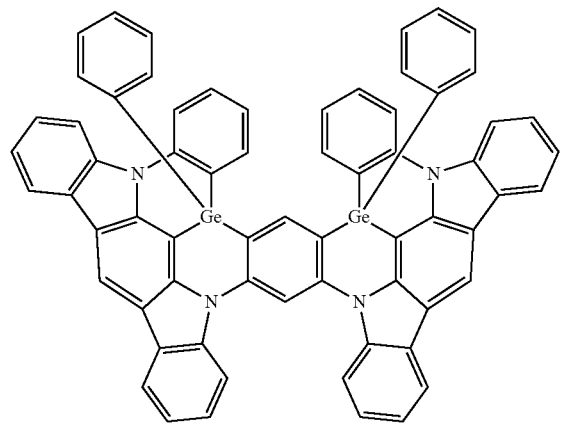
41
42
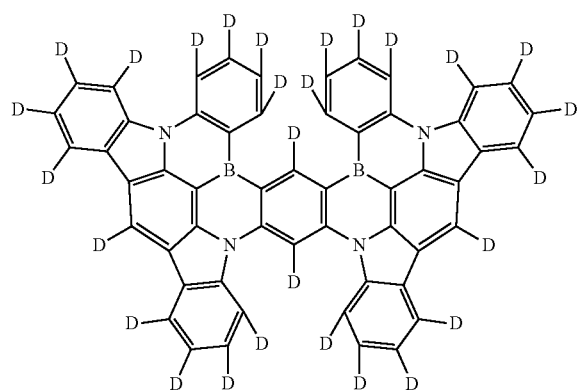
43
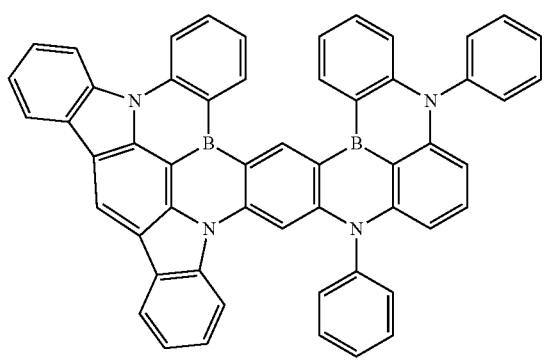
44

-continued
45
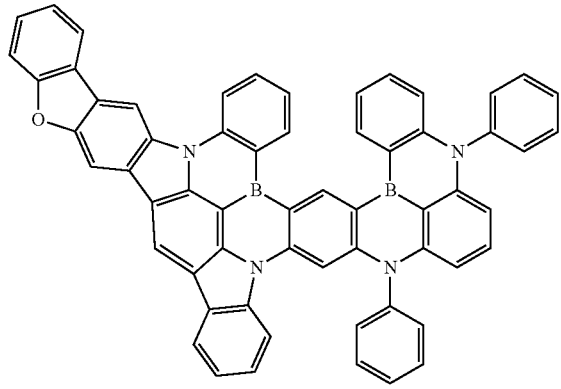
46
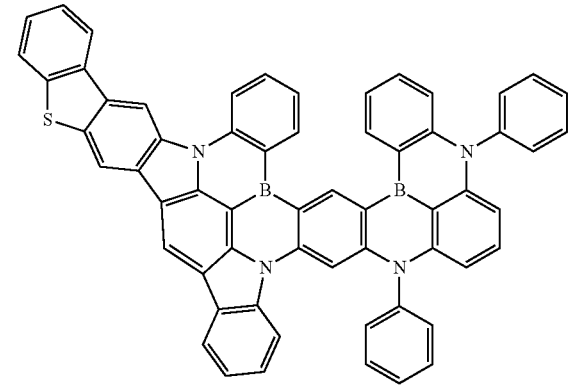
47
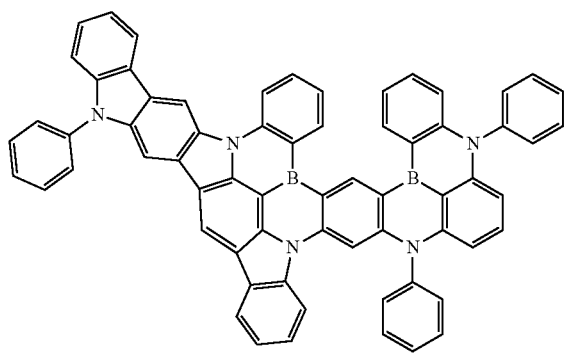
48
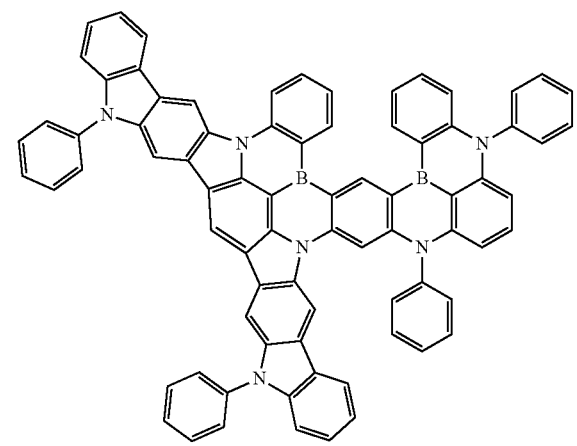
49
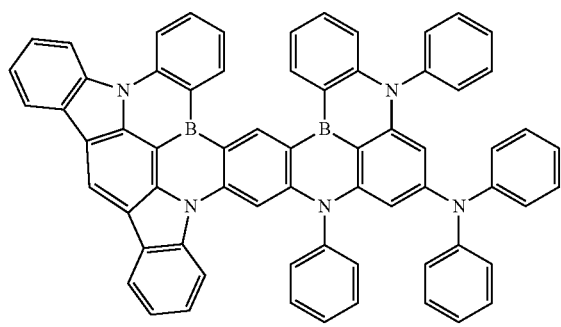
50
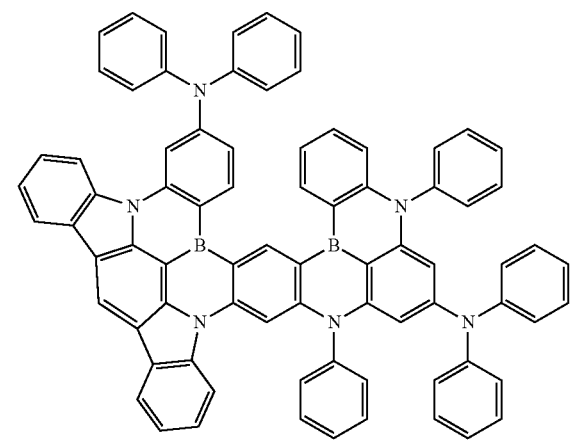

-continued
51
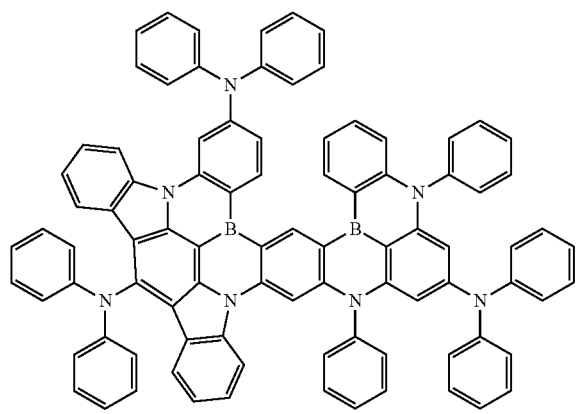
52
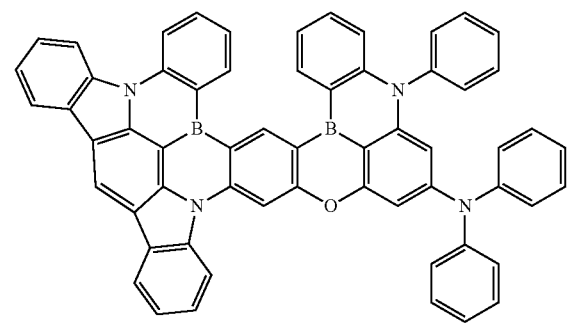
53
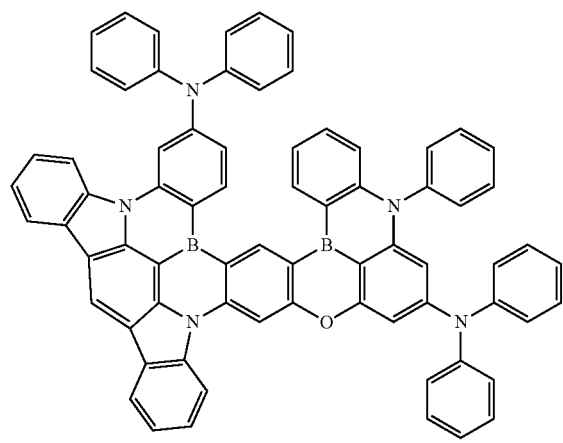
54
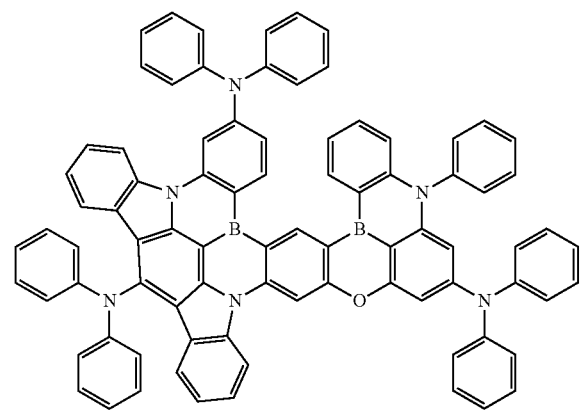
55
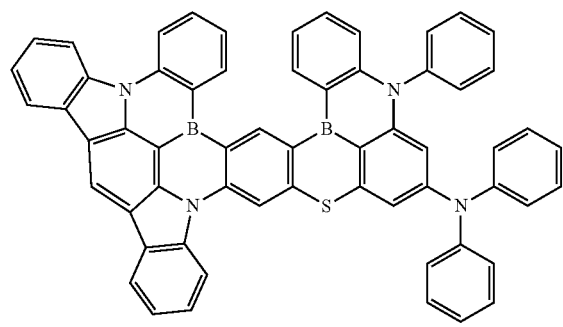
56
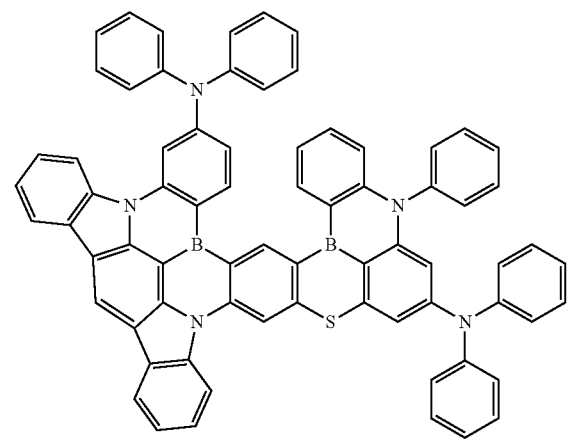

-continued
57
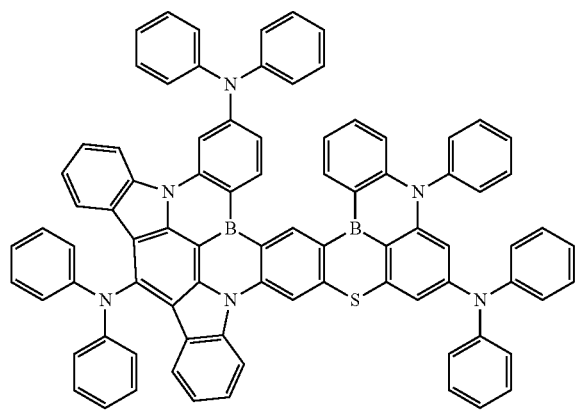
58
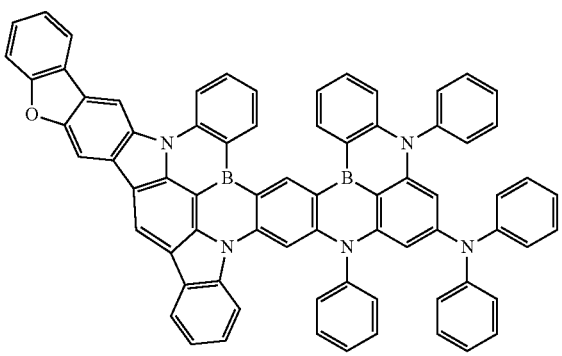
59
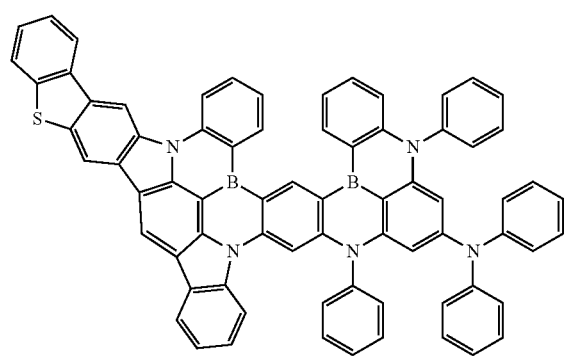
60
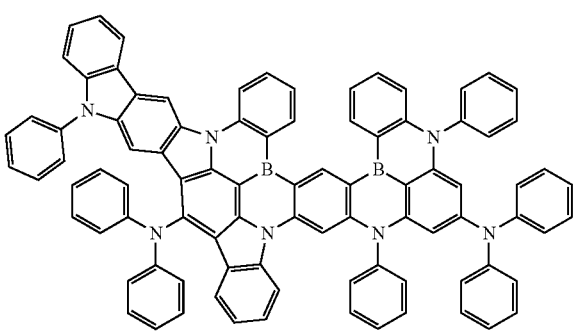
61
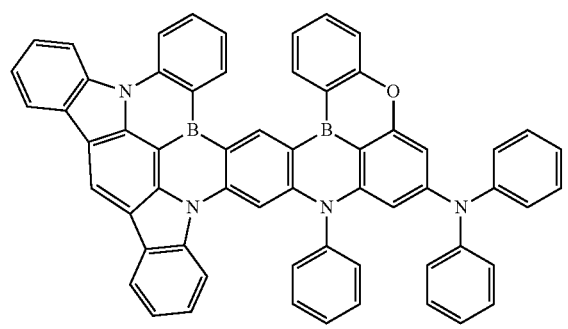
62
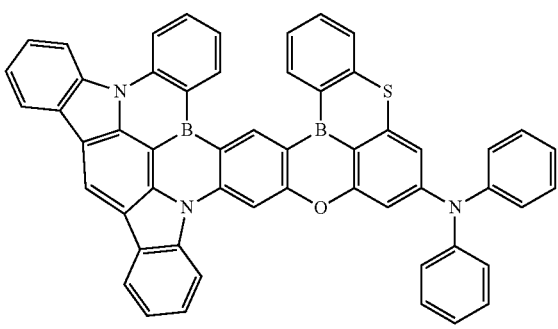
63
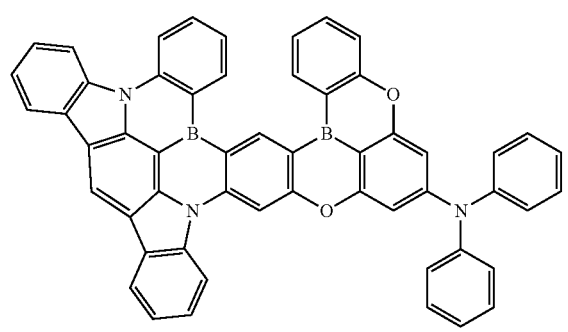
64
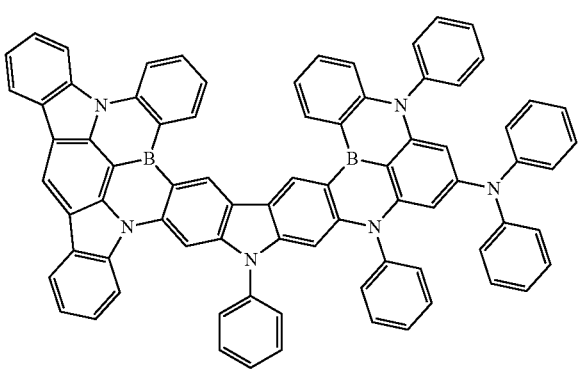

-continued
65
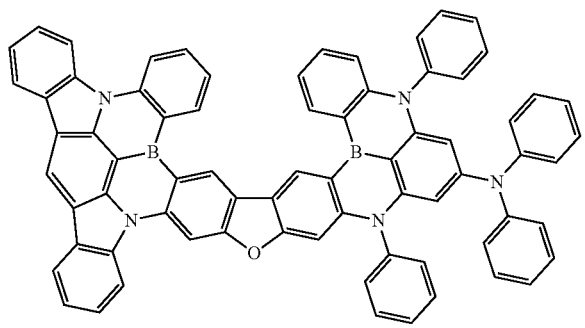
66
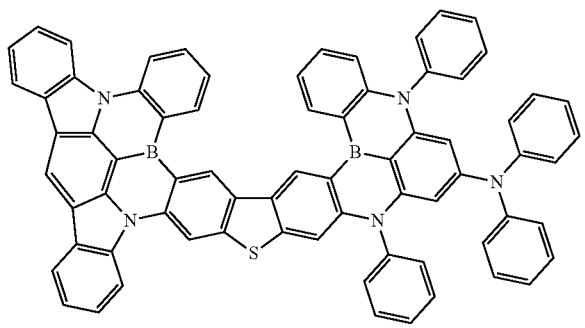
67
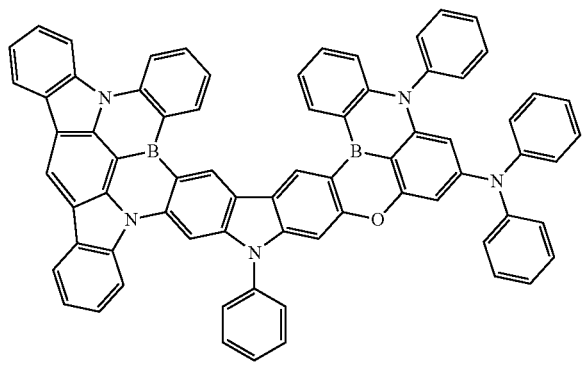
68
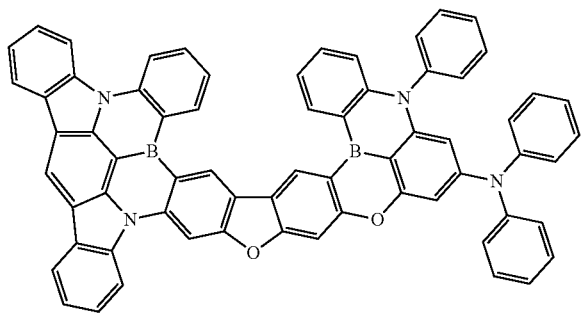
69
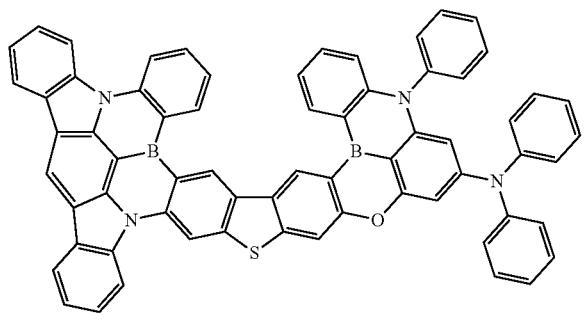
70
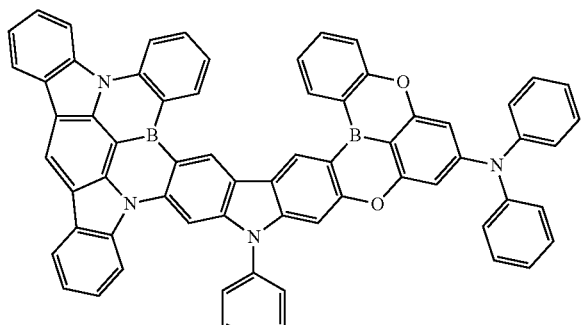
71
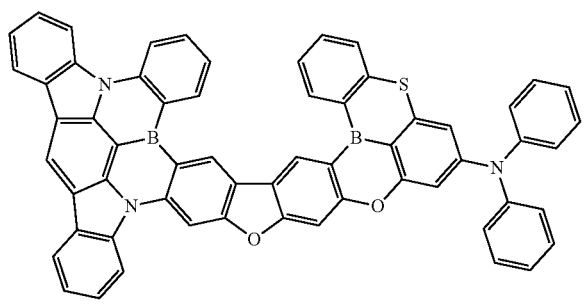
72
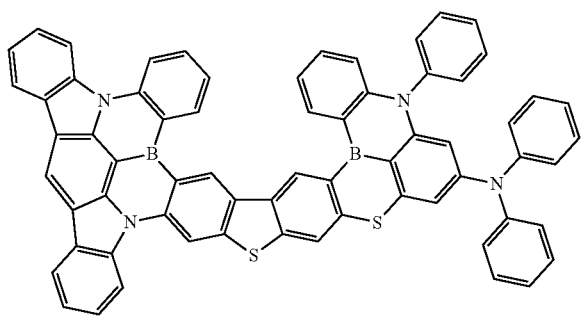

-continued
73
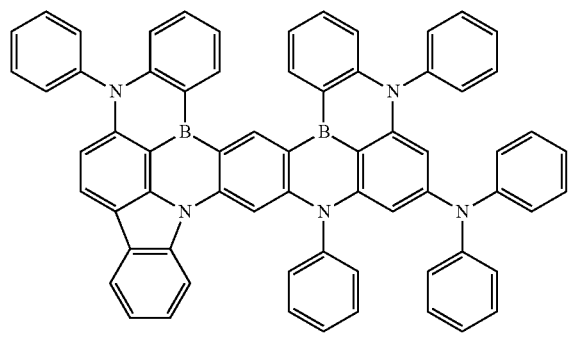
74
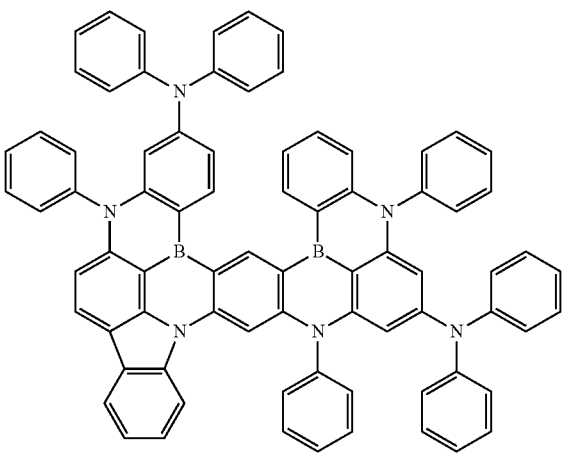
75
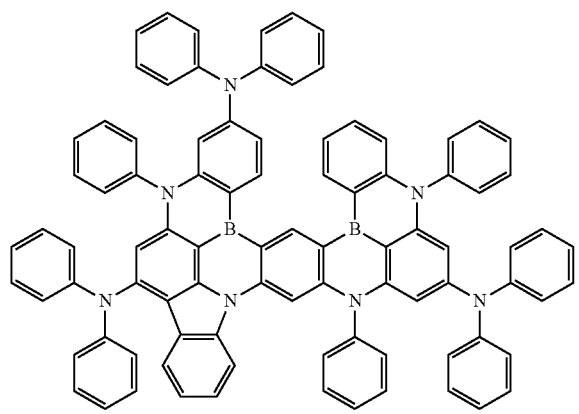
76
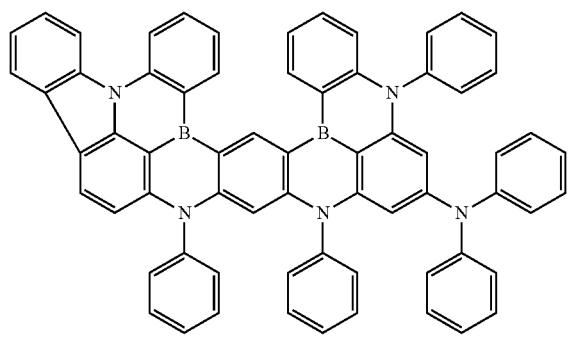
77
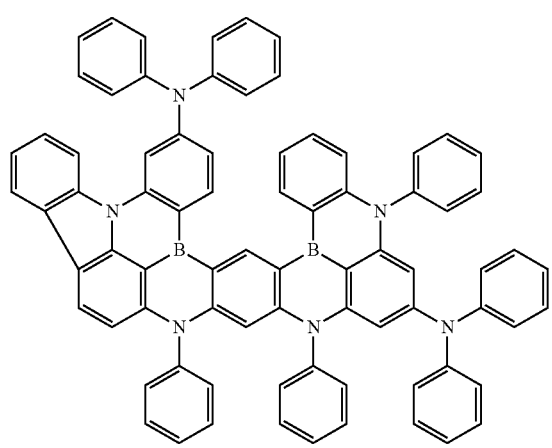
78
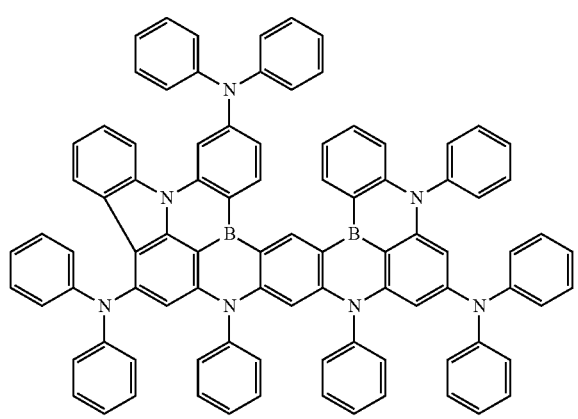

-continued

79

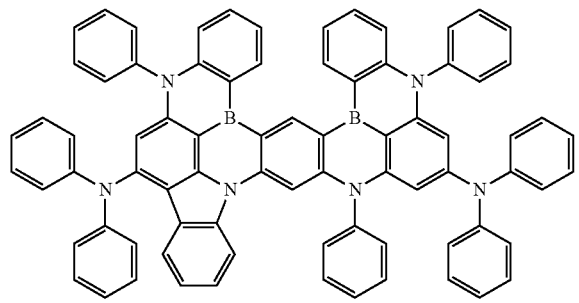

80

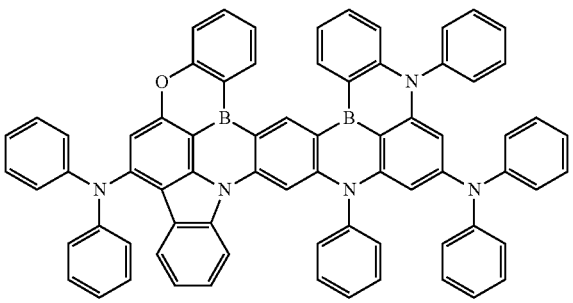

81

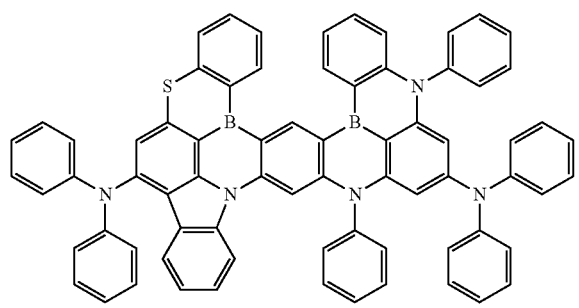

82

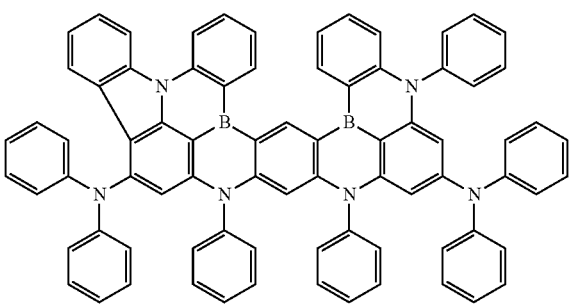

83

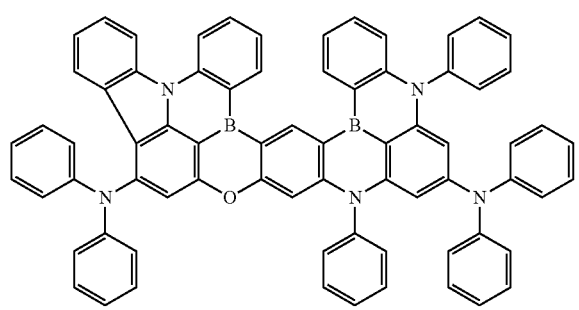

84

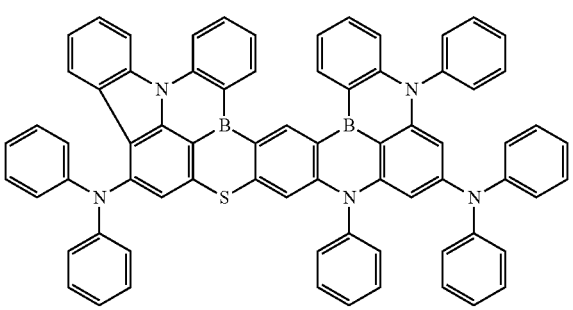

In Compound 43, D is a deuterium atom.

The polycyclic compound of an embodiment may emit blue light. The polycyclic compound may be included in the above-described third light emitting device ED-3 (FIG. 2). In another embodiment, the polycyclic compound may be included in all of the first to third light emitting devices ED-1, ED-2, and ED-3 (FIG. 2).

The polycyclic compound of an embodiment may be a material for emitting thermally activated delayed fluorescence. The polycyclic compound represented by Formula 1 may be a blue emitting thermally activated delayed fluorescence dopant. The polycyclic compound may be a light emitting material having a light emitting central wavelength in a wavelength region of about 430 nm to about 470 nm. In an embodiment, an emission layer EML including a polycyclic compound of an embodiment may emit light having a central wavelength in a range of about 430 nm to about 470 nm.

In the light emitting device ED of an embodiment, the emission layer EML may emit delayed fluorescence. For example, the emission layer EML may emit thermally activated delayed fluorescence (TADF).

In an embodiment, the emission layer EML includes a host and a dopant and may include the polycyclic compound as the dopant. For example, in the light emitting device ED of an embodiment, the emission layer EML may include a host for emitting delayed fluorescence and a dopant for emitting delayed fluorescence and may include the polycyclic compound as the dopant for emitting delayed fluorescence. The emission layer EML may include at least one of the polycyclic compounds represented in Compound Group 1 as a thermally activated delayed fluorescence dopant.

In an embodiment, the emission layer EML may be a delayed fluorescence emission layer, and the emission layer EML may include a host material and the above-described polycyclic compound of an embodiment. For example, in an embodiment, the polycyclic compound may be used as a TADF dopant.

The emission layer EML is provided on the hole transport region HTR. The emission layer EML may, for example, have a thickness in a range of about 100 Å to about 1,000 Å. For example, the emission layer EML may have a thickness in a range of about 100 Å to about 300 Å. The emission layer EML may be a single layer formed using a single material, a single layer formed using different materials, or a multilayer structure having layers formed using different materials.

In the light emitting device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting devices ED of embodiments, shown in FIG. 3 to FIG. 6, the emission layer EML may include a host and a dopant, and the emission layer EML may include a compound represented by Formula E-1 below. The compound represented by Formula E-1 below may be used as a fluorescence host material.

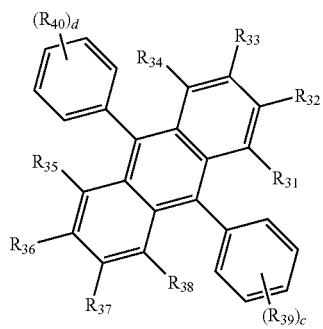

[Formula E-1]

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring or an unsaturated hydrocarbon ring. In Formula E-1, c and d may each independently be an integer from 0 to 5.

The compound represented by Formula E-1 may be selected from any one among Compound E1 to Compound E19 below.

E1

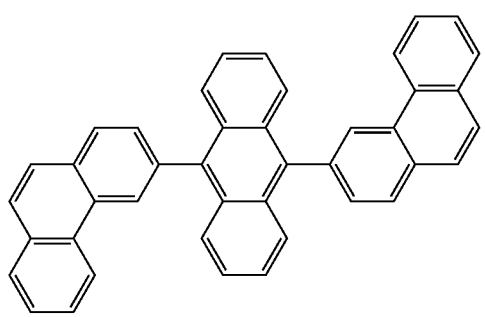

E2

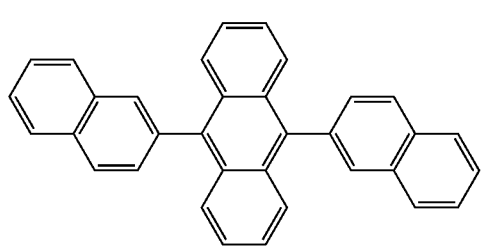

E3

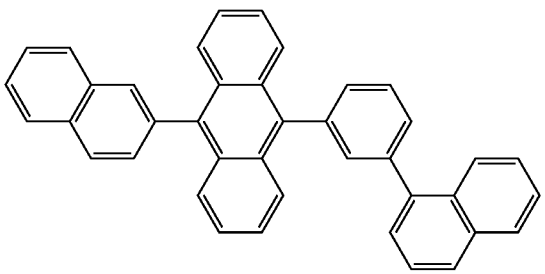

E4

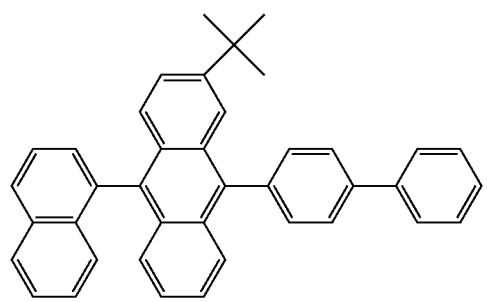

E5

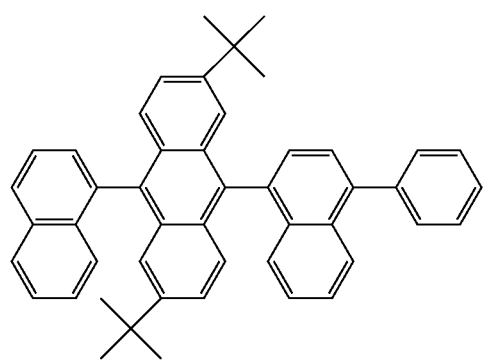

E6

E7

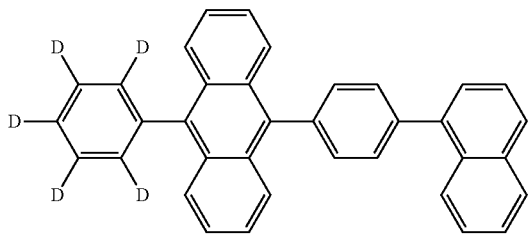

E8
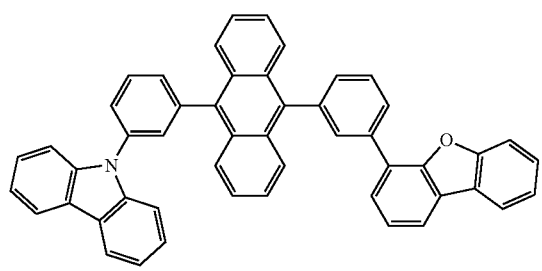
E9
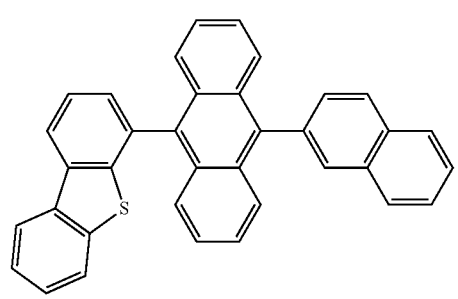
E10
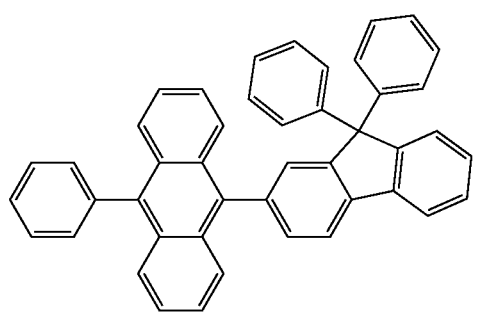
E11
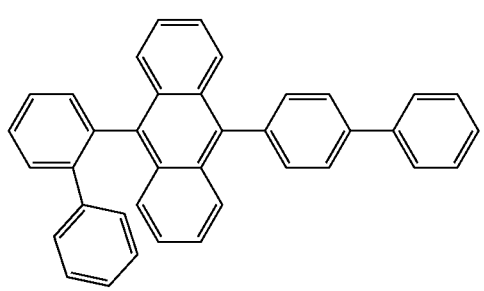
E12
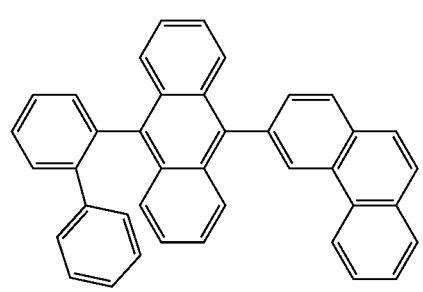
E13
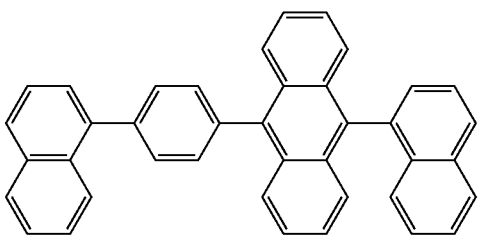
E14
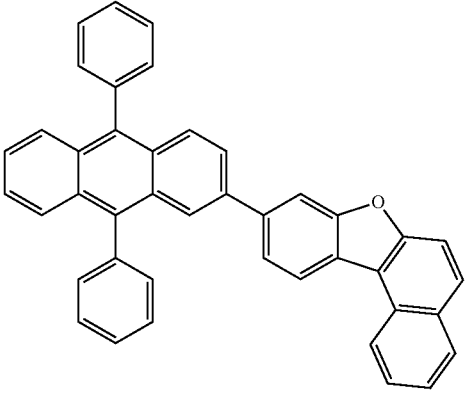
E15
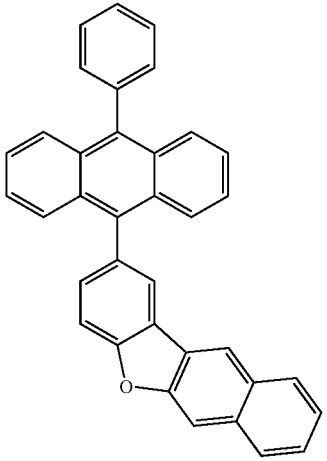
E16
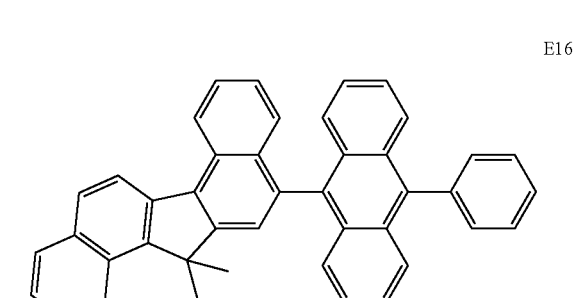

E17

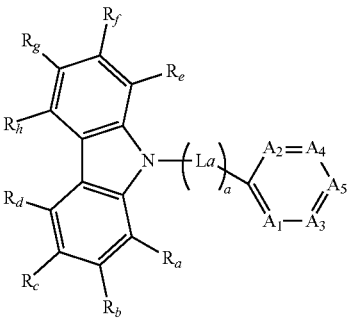

[Formula E-2a]

E18

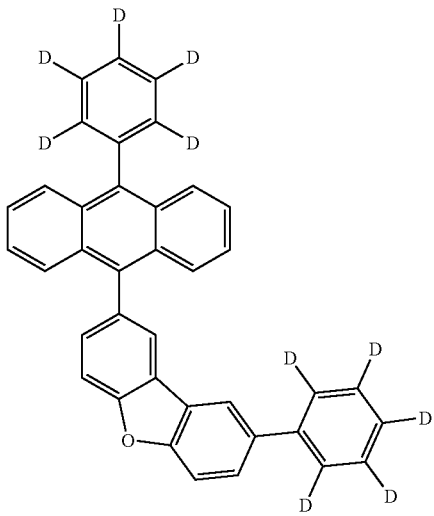

In Formula E-2b, a may be an integer from 0 to 10, and $L_a$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, if a is an integer of 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or C(Ri). $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to each other to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

E19

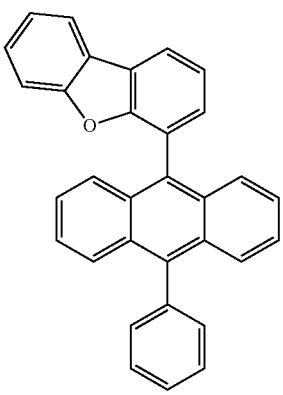

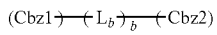

[Formula E-2b]

(Cbz1)—(L_b)_b—(Cbz2)

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one among the compounds in Compound Group E-2 below. However, the compounds shown in Compound Group E-2 below are only illustrations, and the compound represented by Formula E-2a or Formula E-2b is not limited to the compounds represented in Compound Group E-2 below.

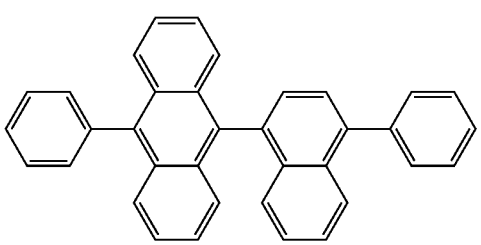

In an embodiment, the emission layer EML may include a compound represented by Formula E-2a or Formula E-2b below. The compound represented by Formula E-2a or Formula E-2b may be used as a phosphorescence host material.

[Compound Group E-2]
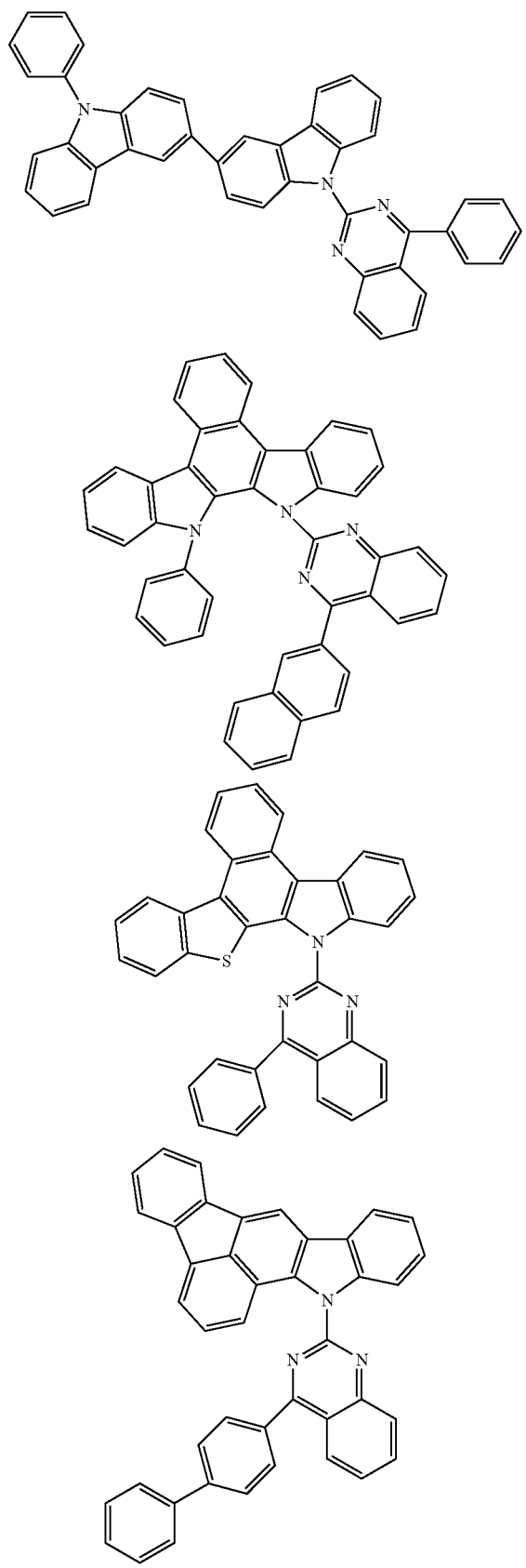
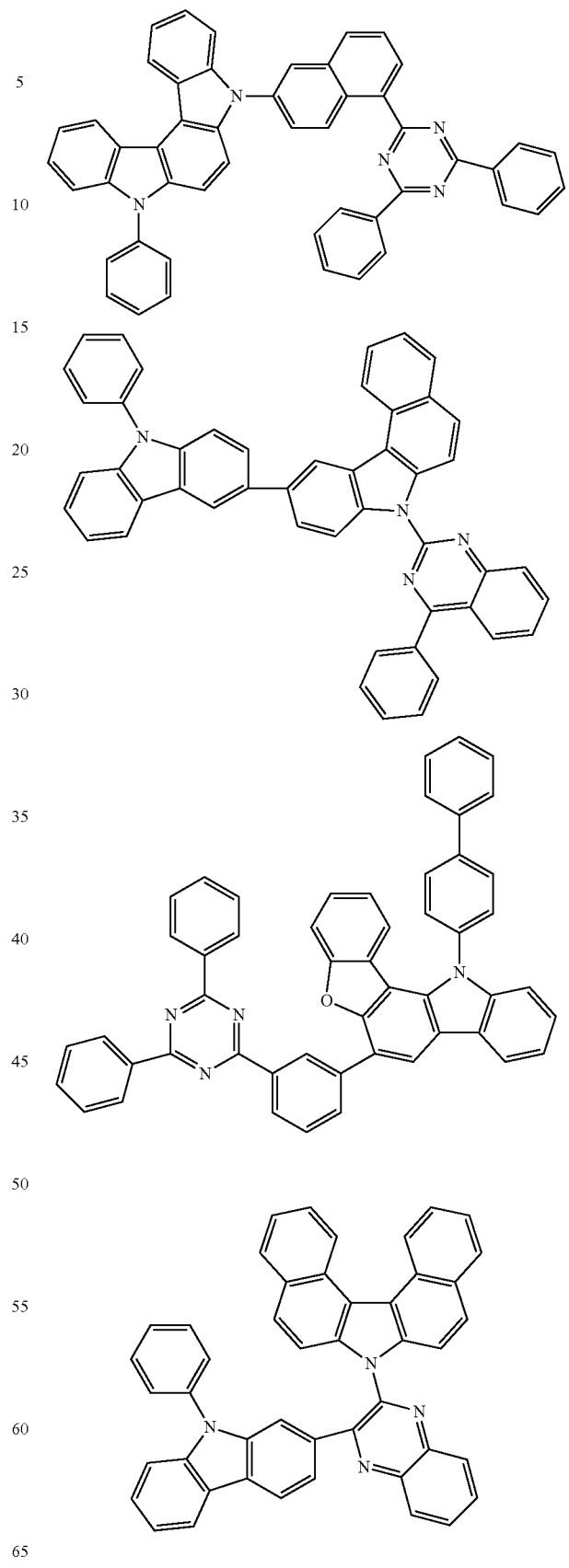

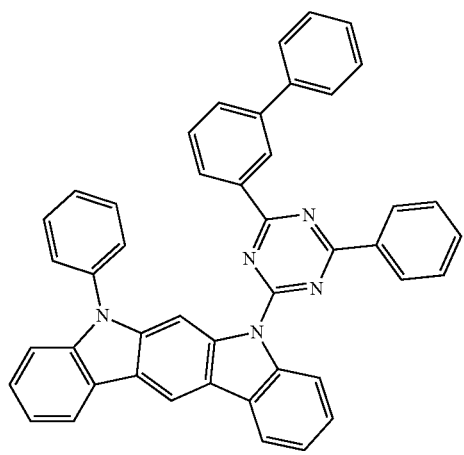
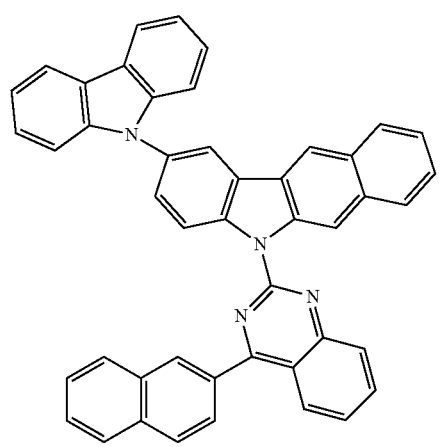
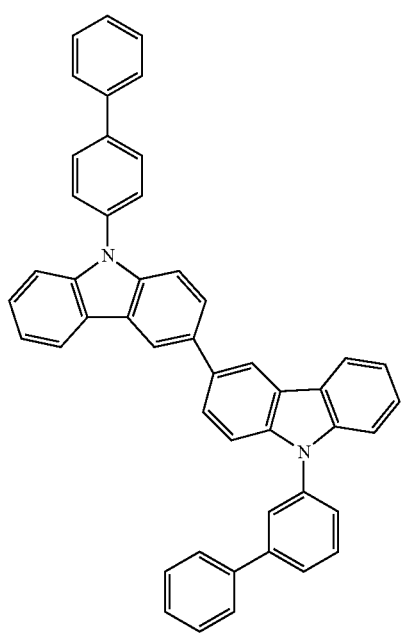
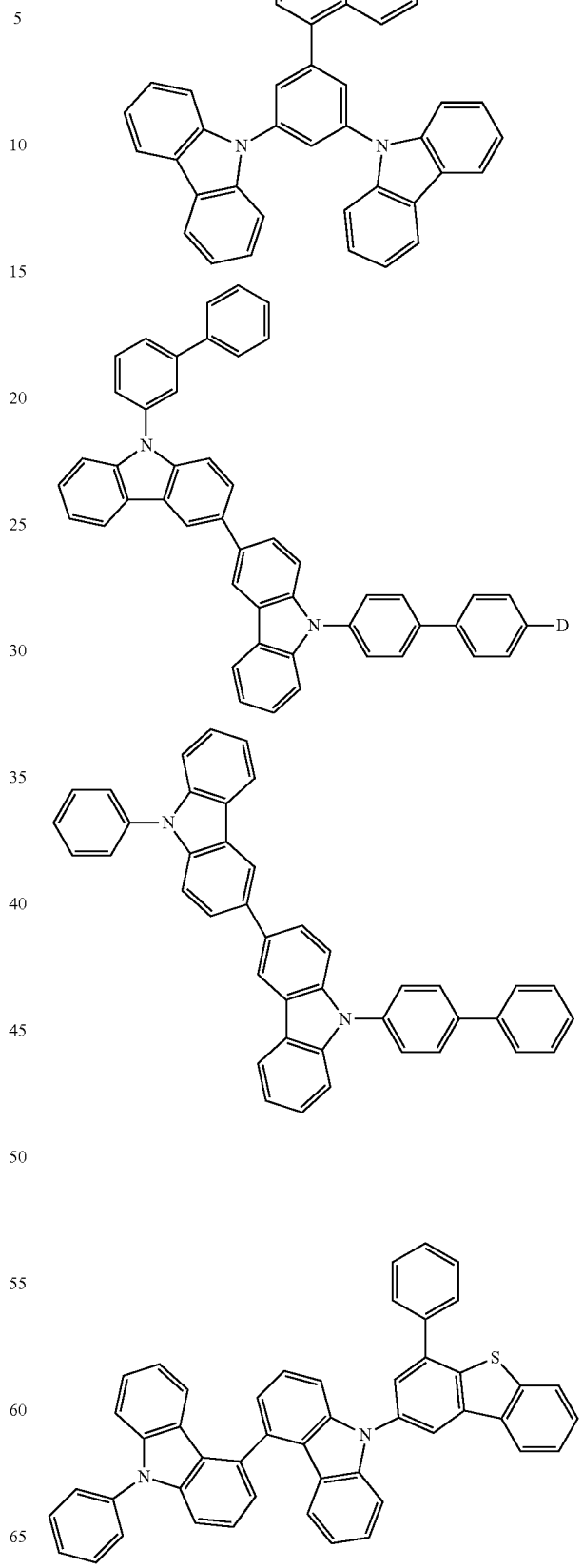

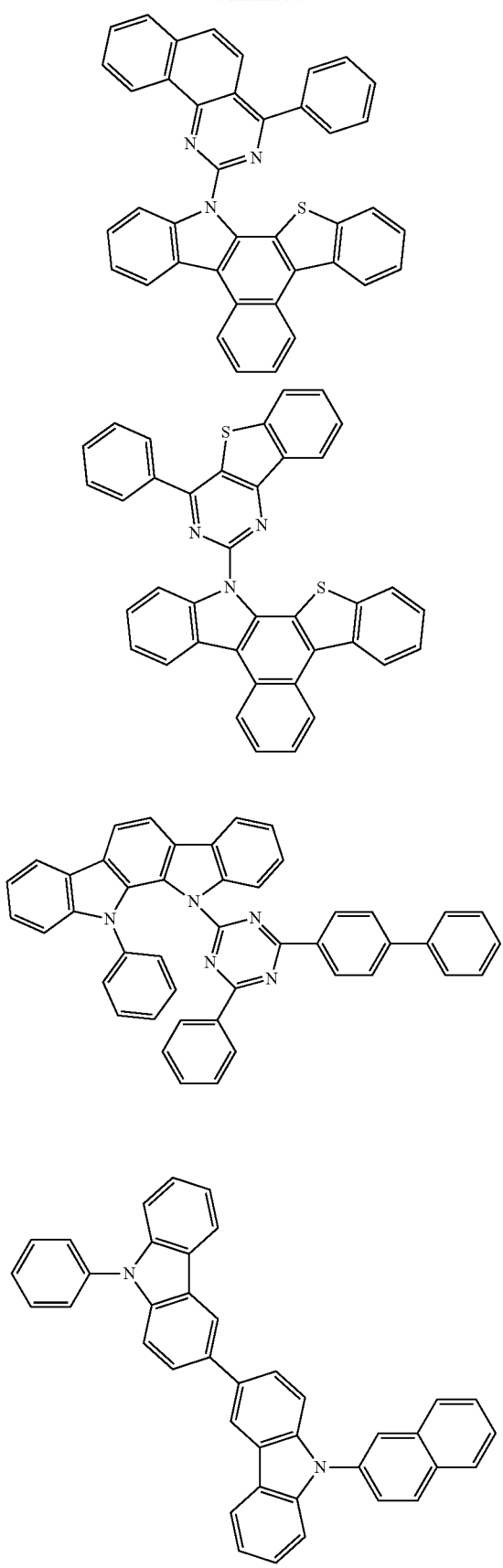
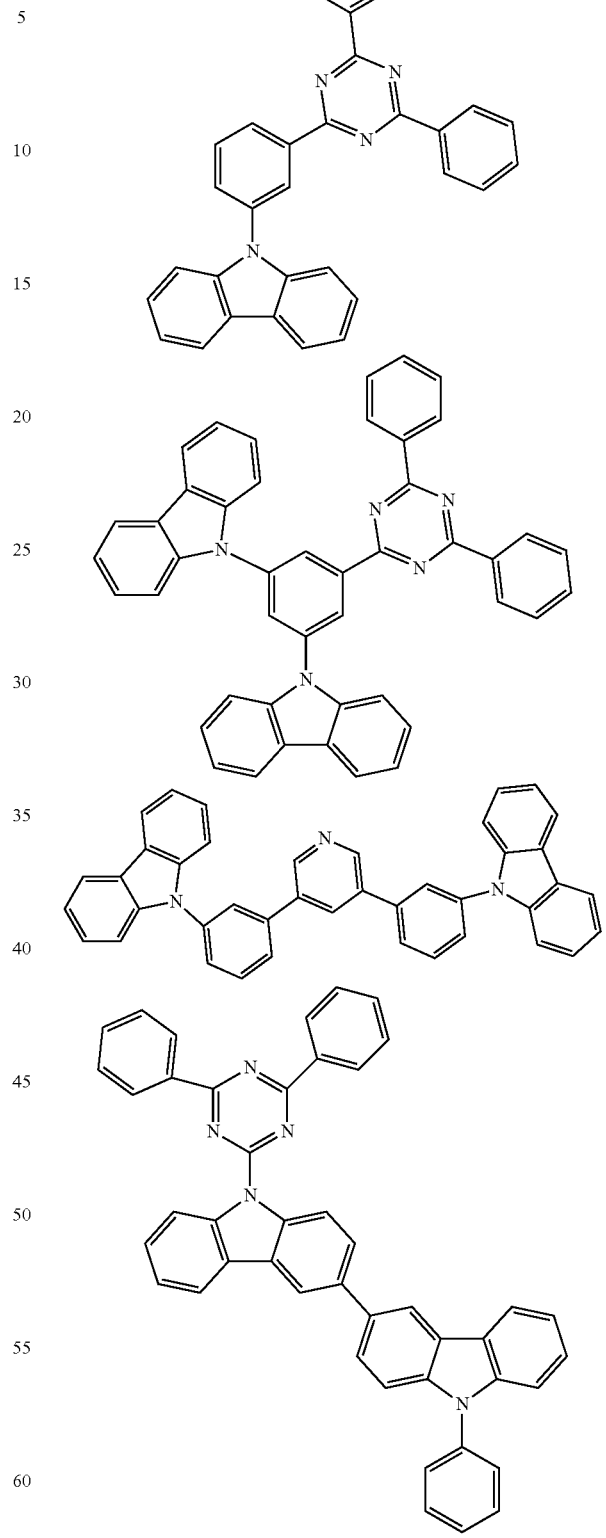
The emission layer EML may further include a common material in the art as a host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 4,4'-bis(N-carb azolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenyamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as the host material.

The emission layer EML may include a compound represented by Formula M-a or Formula M-b below. The compound represented by Formula M-a or Formula M-b may be used as a phosphorescence dopant material. The compound represented by Formula M-a may be used as a red phosphorescence dopant or a green phosphorescence dopant.

[Formula M-a]

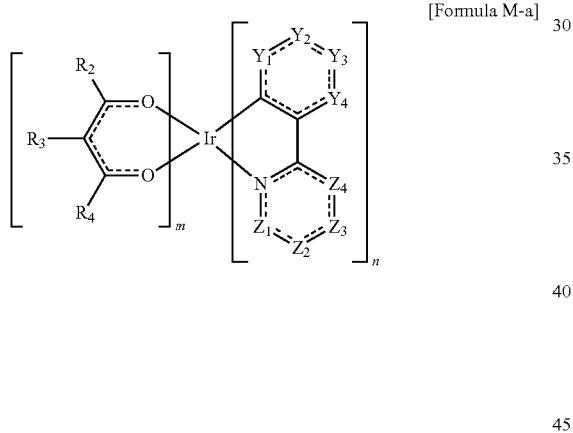

In Formula M-a, $Y_1$ to $Y_4$, and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be represented by any one among Compounds M-a1 to M-a19 below. However, Compounds M-a1 to M-a19 below are illustrations, and the compound represented by Formula M-a is not limited to the compounds represented by Compounds M-a1 to M-a19 below.

M-a1

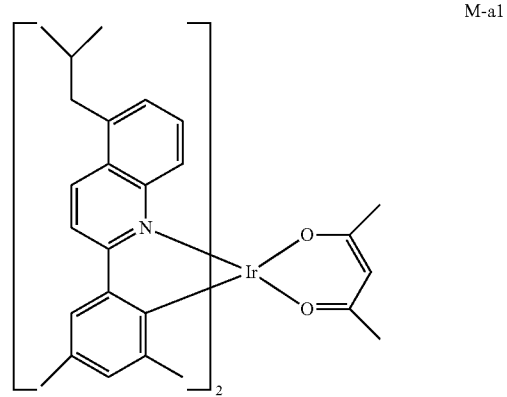

M-a2

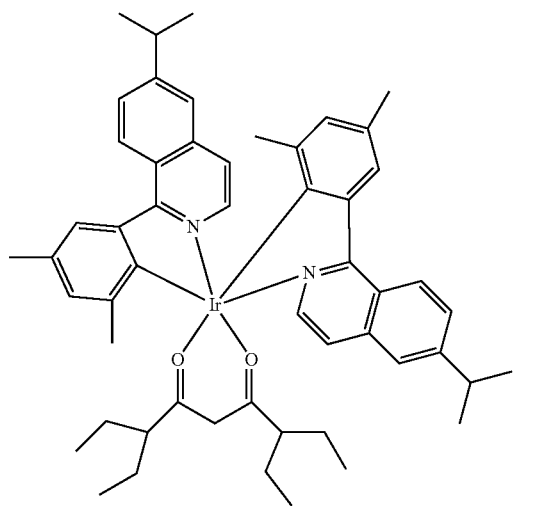

M-a3

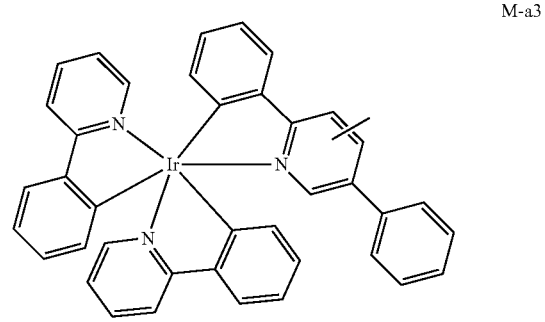

M-a4

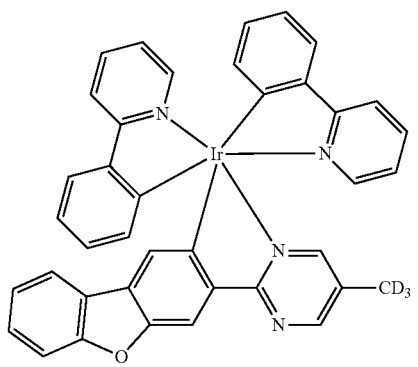

M-a5
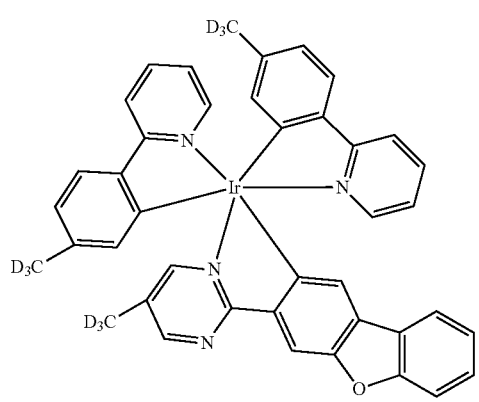
M-a6
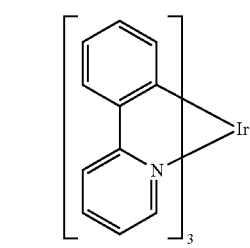
M-a7
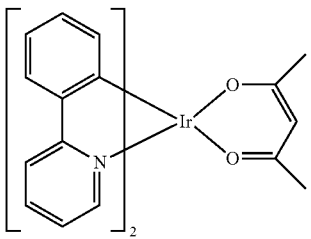
M-a8
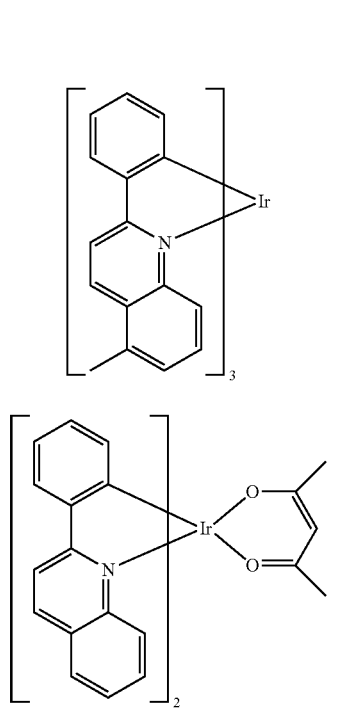
M-a9
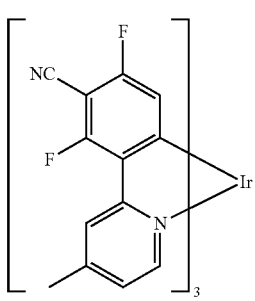
M-a10
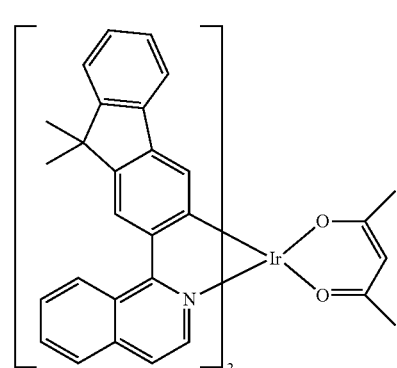
M-a11
M-a12
M-a13
M-a14

M-a15 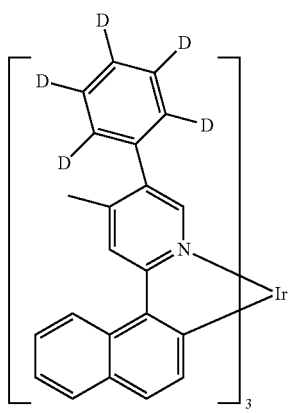

M-a16 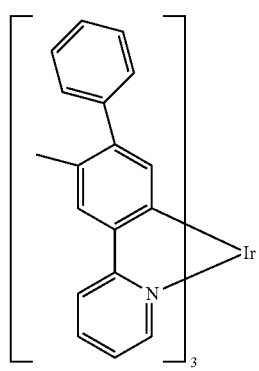

M-a17 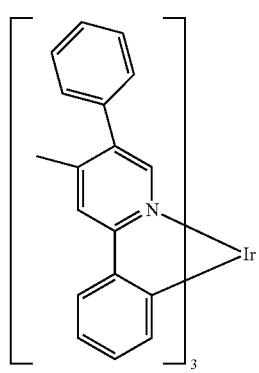

M-a18 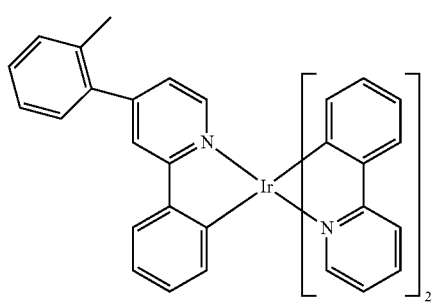

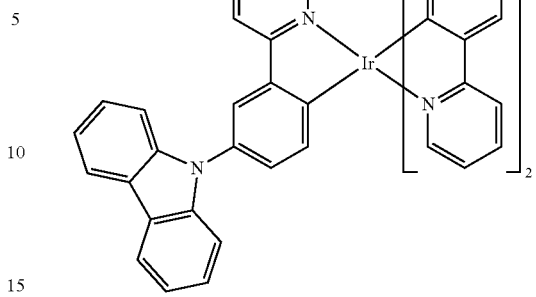 M-a19

Compound M-a1 and Compound M-a2 may be used as red dopant materials, and Compound M-a3 to Compound M-a5 may be used as green dopant materials.

[Formula M-b]

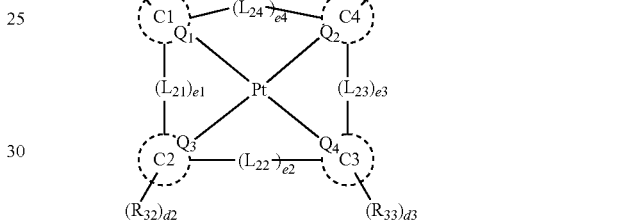

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

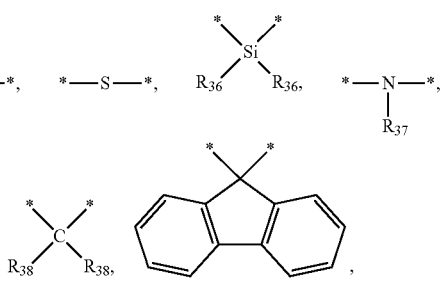

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be represented by any one among the compounds below. However, the compounds below are illustrations, and the compound represented by Formula M-b is not limited to the compounds represented below.

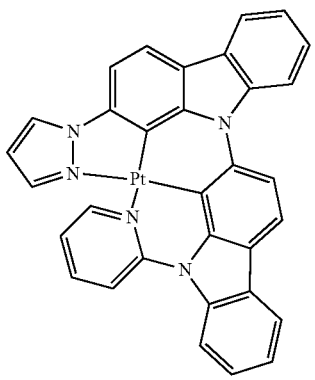

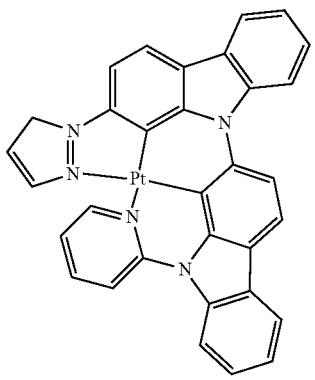

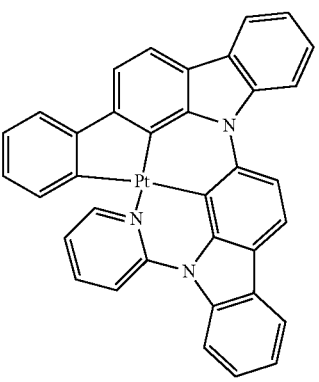

-continued

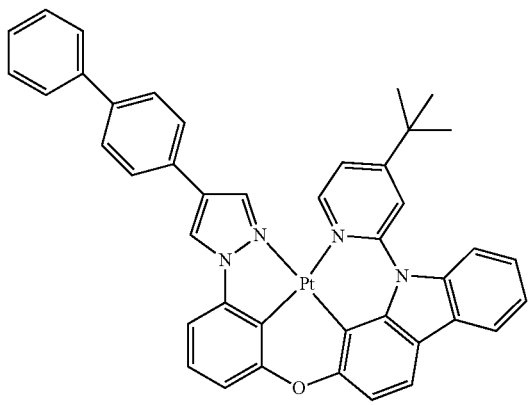

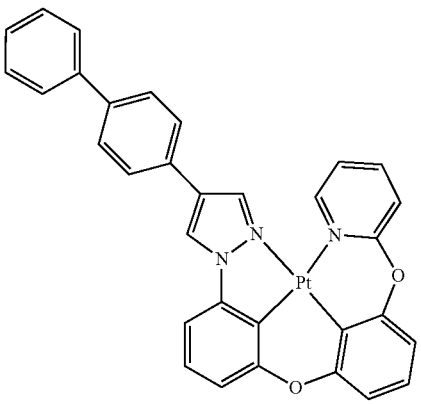

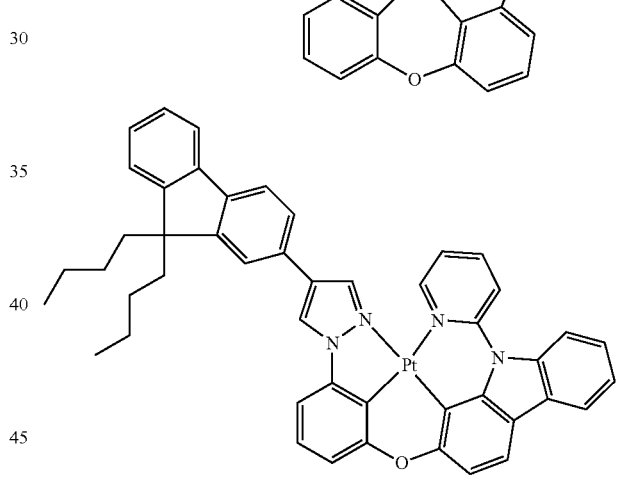

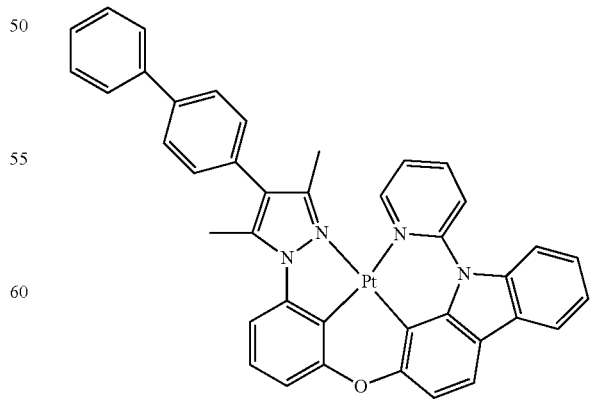

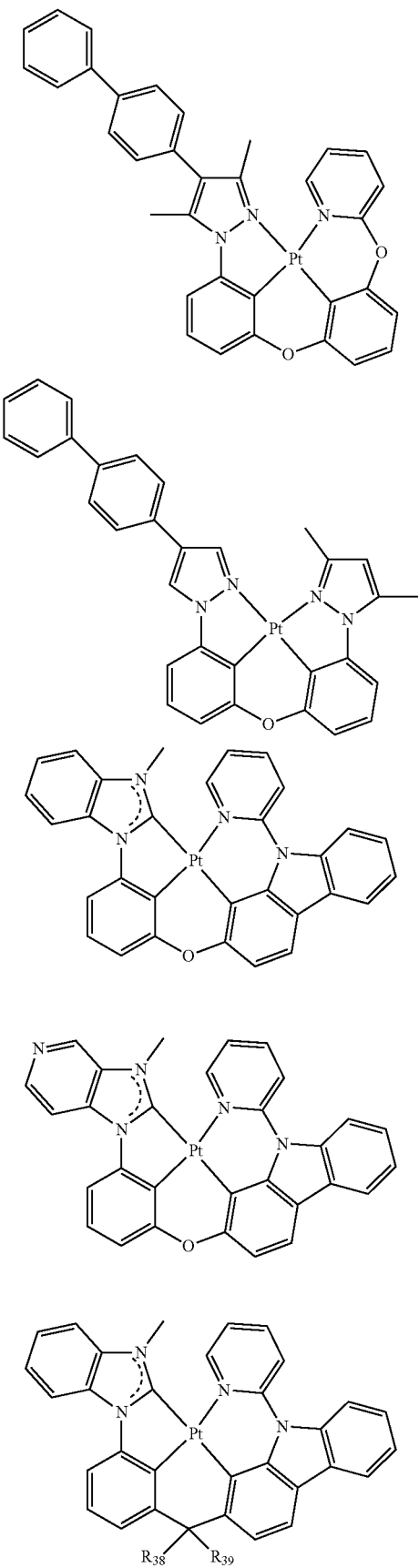

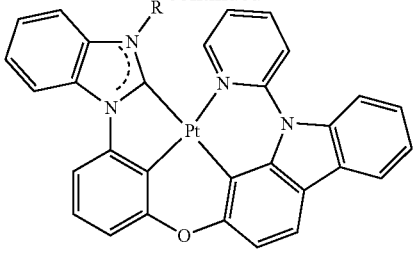

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one among Formula F-a and Formula F-b below. The compounds represented by Formula F-a and Formula F-b below may be used as fluorescence dopant materials.

[Formula F-a]

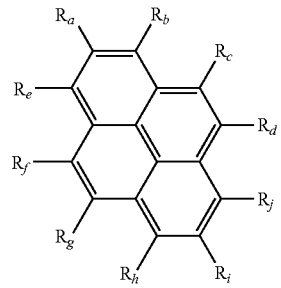

In Formula F-a, two selected from $R_a$ to $R_j$ may each independently be substituted with *—$NAr_1Ar_2$. The remainder of $R_a$ to $R_j$ not substituted with *$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In *$NAr_1Ar_9$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one among $Ar_1$ and $Ar_2$ may be a heteroaryl group including O or S as a ring-forming atom.

[Formula F-b]

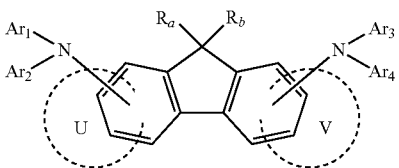

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, one ring forms a fused ring at the designated part by U or V, and if the number of U or V is 0, a ring is not present at the designated part by U or V. For example, if the number of U is 0, and the number of V is 1, or if the number of U is 1, and the number of V is 0, a fused ring having the fluorene core of Formula F-b may be a ring compound with four rings. If the number of both U and V is 0, the fused ring of Formula F-b may be a ring compound with three rings. If the number of both U and V is 1, a fused ring having the fluorene core of Formula F-b may be a ring compound with five rings.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

In the light emitting devices ED of embodiments, as shown in FIG. 3 to FIG. 6, the electron transport region ETR is provided on the emission layer EML. The electron transport region ETR may include at least one of an electron blocking layer HBL, an electron transport layer ETL, and an electron injection layer EIL. However, embodiments are not limited thereto.

The electron transport region ETR may have a single layer formed using a single material, a single layer formed using different materials, or a multilayer structure having layers formed using different materials.

For example, the electron transport region ETR may have a single layer structure of an electron injection layer EIL or an electron transport layer ETL, or a single layer structure formed using an electron injection material and an electron transport material. The electron transport region ETR may have a single layer structure having different materials, or a structure stacked from the emission layer EML of electron transport layer ETL/electron injection layer EIL, or hole blocking layer HBL/electron transport layer ETL/electron injection layer EIL, without limitation. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

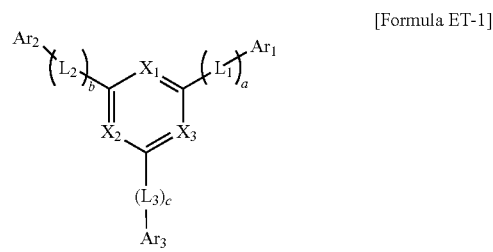

[Formula ET-1]

In Formula ET-1, at least one among $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula ET-1, when a to c are integers of 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthyl anthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), and mixtures thereof, without limitation.

The electron transport region ETR may include a metal halide such as LiF, NaCl, CsF, RbCl, RbI, CuI and KI, a lanthanide metal such as Yb, or a co-depositing material of the metal halide and the lanthanide metal. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR may also be formed using a mixture of an electron transport material and an insulating organo metal salt. The organo metal salt may be a material having an energy band gap of about 4 eV or more. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), and 4,7-diphenyl-1,10-phenanthroline (Bphen) in addition to the aforementioned materials. However, embodiments are not limited thereto.

The electron transport region ETR may include the above-described compounds of the electron transport region in at least one of an electron injection layer EIL, an electron transport layer ETL, and a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above described range, satisfactory electron transport properties may be obtained without inducing substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection properties may be obtained without substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may be formed using indium tin oxide (ITO), indium zinc oxide (IZO), zinc oxide (ZnP), indium tin zinc oxide (ITZO), etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In an embodiment, the second electrode EL2 may have a multi-layered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Though not shown, the second electrode EL2 may be electrically connected to an auxiliary electrode. If the second electrode EL2 is electrically connected to the auxiliary electrode, the resistance of the second electrode EL2 may decrease.

In the light emitting device ED of an embodiment, a capping layer CPL may be further disposed on the second electrode EL2. The capping layer CPL may include multiple layers or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $Mg_{F2}$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or includes an epoxy resin, or acrylate such as methacrylate. The capping layer CPL may include at least one of Compounds P1 to P5 below, but embodiments are not limited thereto.

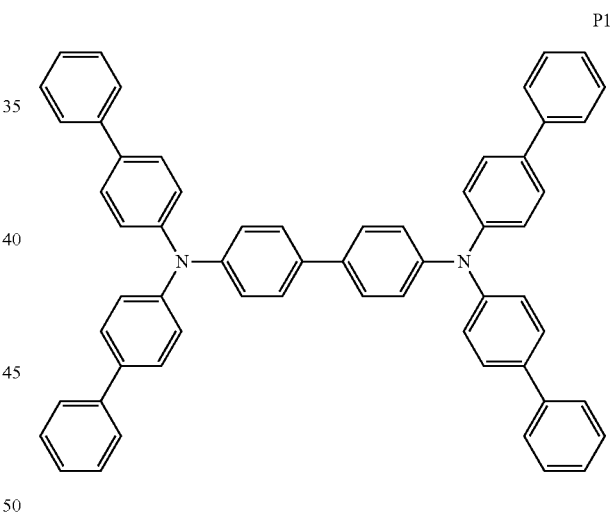

P1

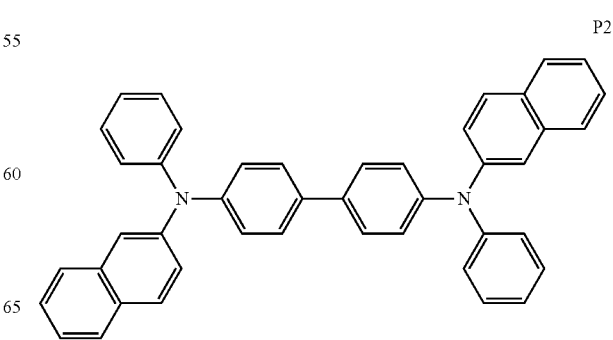

P2

-continued

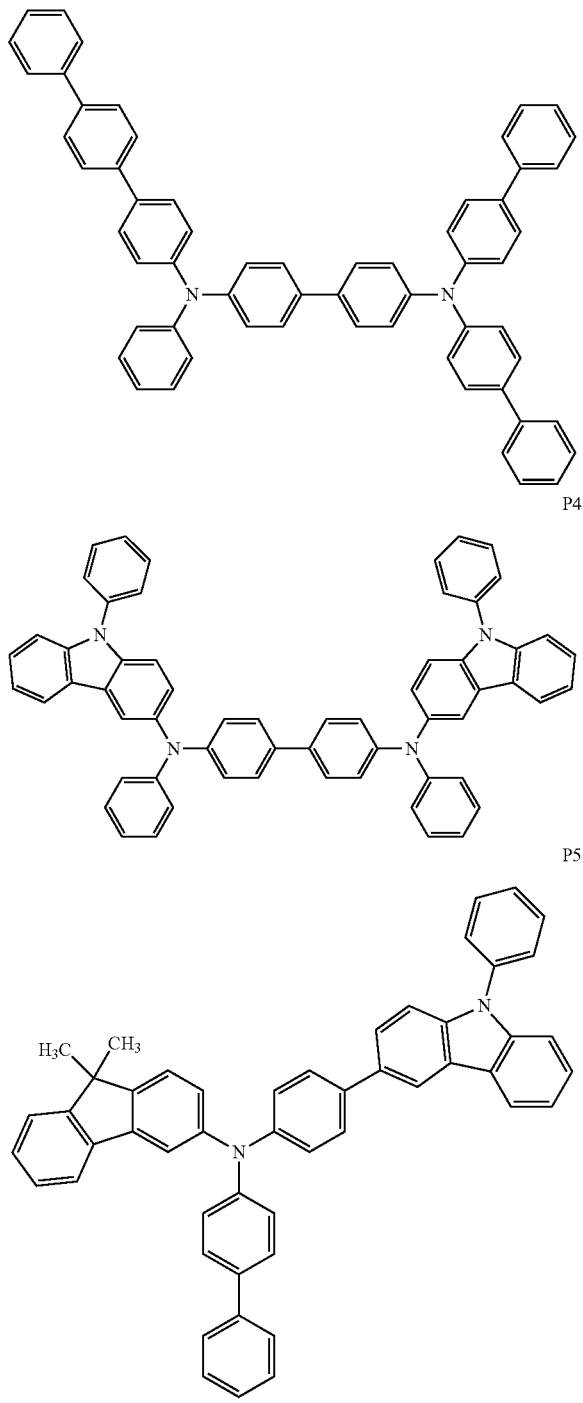

According to an embodiment, a refractive index of the capping layer CPL may be equal to or greater than about 1.6. For example, the refractive index of the capping layer CPL with respect to light in a wavelength range of about 550 nm to about 660 nm may be equal to or greater than about 1.6.

Figure 7:
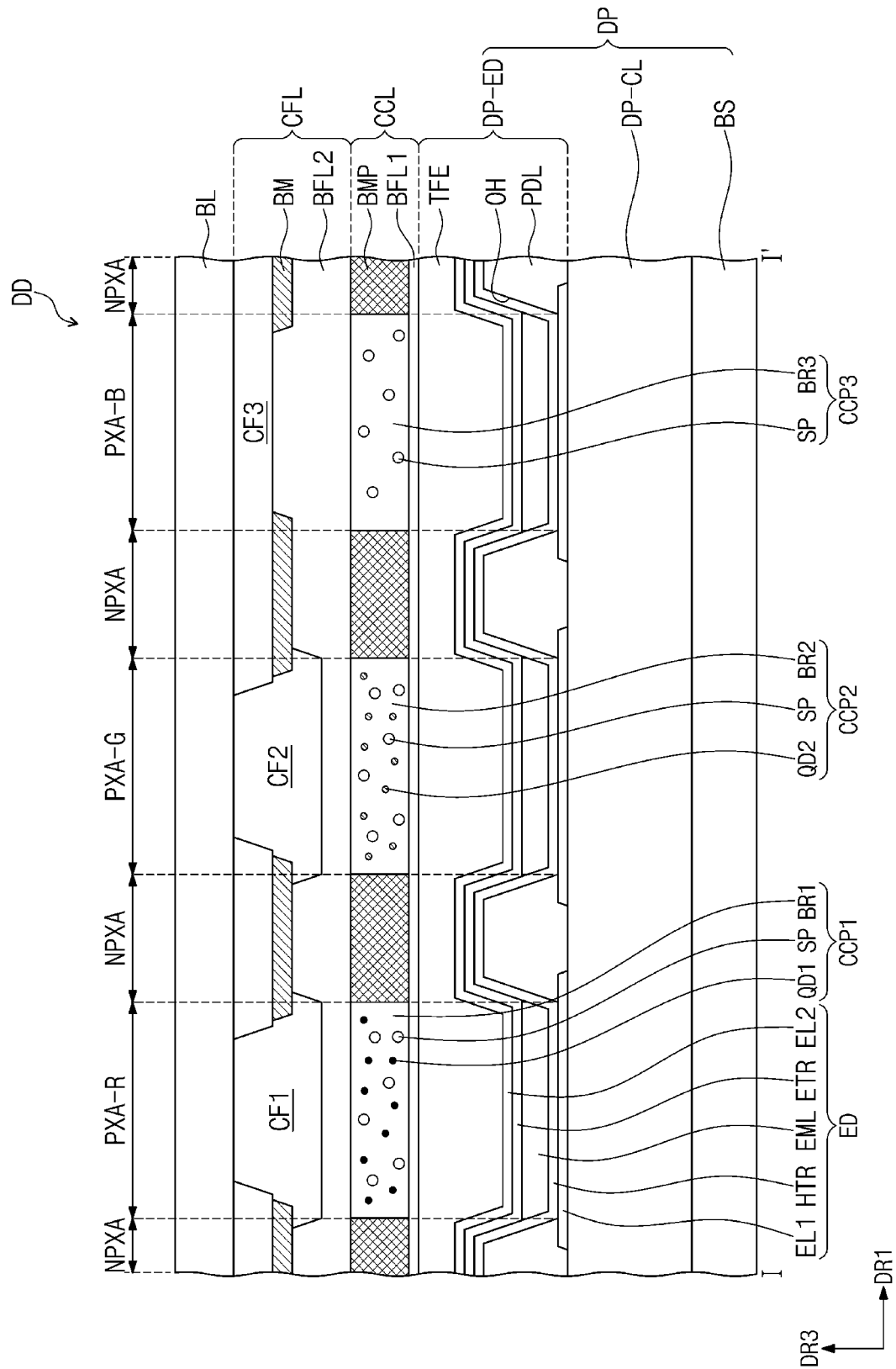
FIG. 7 is a schematic cross-sectional view showing a display apparatus according to an embodiment.
Figure 8:
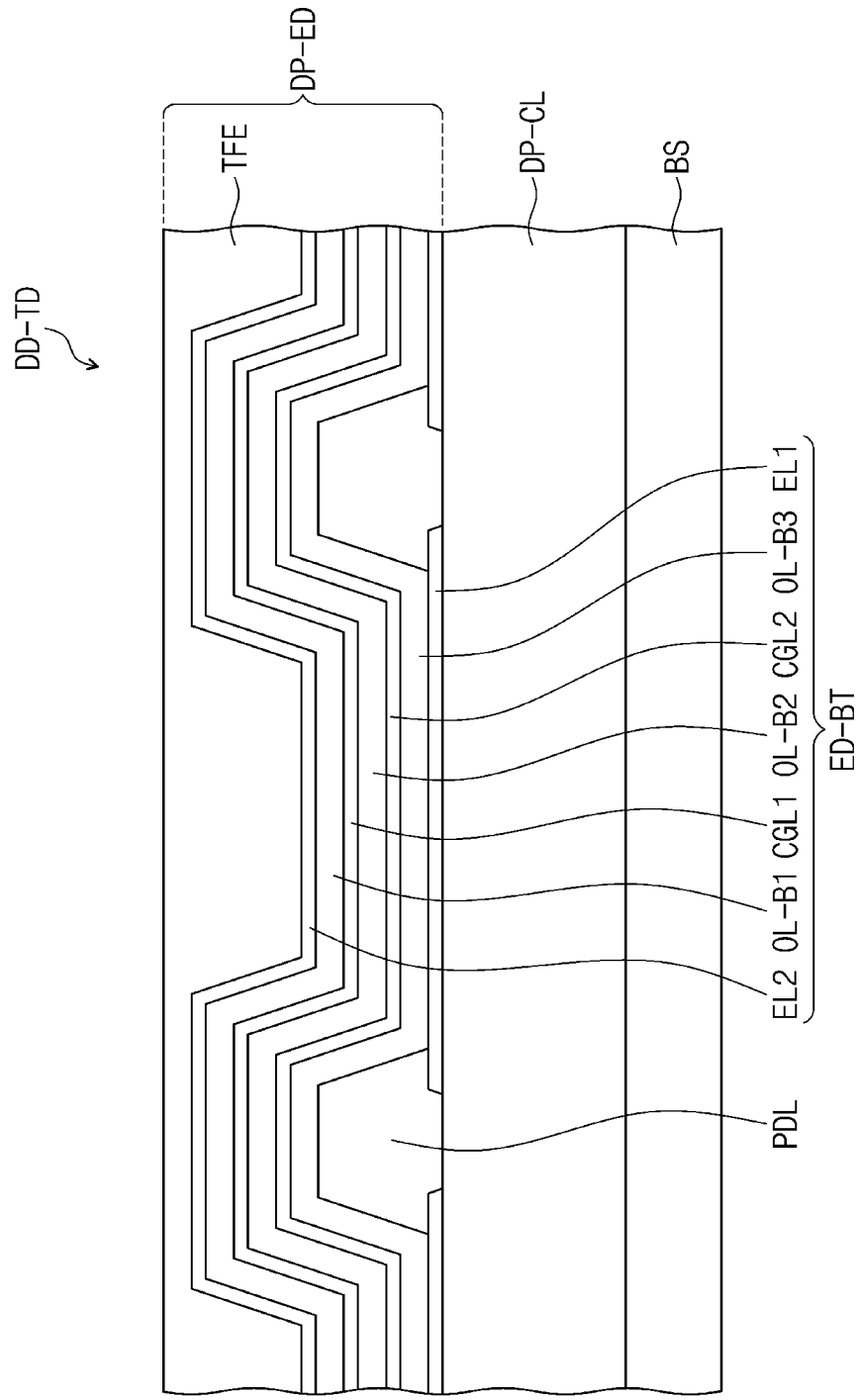
FIG. 8 is a schematic cross-sectional view showing a display apparatus according to an embodiment.

FIG. 7 and FIG. 8 are schematic cross-sectional views of display apparatuses according to embodiments. In the explanation on the display apparatuses of embodiments, referring to FIG. 7 and FIG. 8, the overlapping parts with the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting device ED.

The light emitting device ED may include a first electrode ELL a hole transport region HTR disposed on the first electrode ELL an emission layer EML disposed on the hole transport region HTR, an electron transport region ETR disposed on the emission layer EML, and a second electrode EL2 disposed on the electron transport region ETR. The same structures of the light emitting devices of FIG. 3 to FIG. 6 may be applied to the structure of the light emitting device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may transform the wavelength of light provided and then emit the transformed light. For example, the light controlling layer CCL may be a layer including a quantum dot or a layer including a phosphor.

The light controlling layer CCL may include multiple light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 7, the partition pattern BMP is shown to not overlap with the light controlling parts CCP1, CCP2, and CCP3, but at least a portion of the edge of the light controlling parts CCP1, CCP2, and CCP3 may be overlapped with the partition pattern BMP.

The light controlling layer CCL may include a first light controlling part CCP1 including a first quantum dot QD1 converting first color light provided from the light emitting device ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting device ED. For example, the first quantum dot QD1 may be a red quantum dot, and the second quantum dot QD2 may be a green quantum dot.

The quantum dots QD1 and QD2 are materials having a crystal structure with a few nanometer size, are composed of about hundreds to thousands of atoms, and show quantum confinement effects increasing an energy band gap due to a small size. If light having a wavelength with higher energy than the band gap is incident to the quantum dots QD1 and QD2, the quantum dots QD1 and QD2 may absorb light to achieve an excited state and then fall to a ground state while emitting light of a specific wavelength. The light of an emitted wavelength has a value corresponding to the band gap. If the size and composition of the quantum dots QD1 and QD2 are controlled, light-emitting properties by the quantum confinement effects may be controlled. The quantum dots QD1 and QD2 may be selected from II-VI group compounds, III-V group compounds, IV-VI group compounds, IV group elements, IV group compounds, I-III-VI group compounds, and combinations thereof. If the quantum dots QD1 and QD2 are binary compounds, ternary compounds, or quaternary compounds, each may be present in uniform concentration in a particle, or in a state with a partially different concentration distribution in the same particle. The quantum dots QD1 and QD2 may have a core/shell structure in which one quantum dot surrounds the other quantum dot. The interface of a core and a shell may have concentration gradient with the decreasing concentration of an element present in the shell toward the center.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one among $TiO_2$, ZnO, $Al_2O_3$, $SiO_2$, and hollow silica. The scatterer SP may include at least one among $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatter SP dispersed in the third base resin BR3. The base resins BR1, BR2, and BR3 are mediums in which the quantum dots QD1 and QD2 and the scatterer SP are dispersed, and may be composed of various resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light controlling layer CCL may include a barrier layer BFL1. The barrier layer BFL1 may prevent penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

Barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a metal thin film securing light transmittance. The barrier layers BFL1 and BFL2 may further include an organic layer. The barrier layers BFL1 and BFL2 may be composed of a single layer or of multiple layers.

In the display apparatus DD of an embodiment, the color filter layer CFL may be disposed on the light controlling layer CCL. For example, the color filter layer CFL may be disposed directly on the light controlling layer CCL. For example, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and not include a pigment or dye. The third filter CF3 may be transparent. The third filter CF3 may be formed using a transparent photosensitive resin.

In an embodiment, the first filter CF1 and the second filter CF2 may each be a yellow filter. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent light leakage and divide the boundaries among adjacent filters CF1, CF2, and CF3. In an embodiment, the light blocking part BM may be formed as a blue filter.

Each of the first to third filters CF1, CF2, and CF3 may be disposed to respectively correspond to each of a red luminous area PXA-R, a green luminous area PXA-G, and a blue luminous area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, the base substrate BL may be omitted in an embodiment.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the light emitting device ED-BT may include multiple light emitting structures OL-B1, OL-B2, and OL-B3. The light emitting device ED-BT may include oppositely disposed first electrode EL1 and second electrode EL2, and the multiple light emitting structures OL-B1, OL-B2, and OL-B3 stacked in order in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure including multiple emission layers. At least one emission layer among multiple emission layers may include the polycyclic compound of an embodiment.

In an embodiment shown in FIG. 8, light emitted from the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting device ED-BT including the multiple light emitting structures OL-B1, OL-B2, and OL-B3 emitting light in different wavelength regions may emit white light.

Between neighboring light emitting structures OL-B1, OL-B2, and OL-B3, charge generating layers CGL1 and CGL2 may be disposed. The charge generating layers CGL1 and CGL2 may include a p-type charge generating layer and/or an n-type charge generating layer.

Hereinafter, the compound according to an embodiment and the light emitting device of an embodiment will be explained referring to embodiments and comparative embodiments. The following embodiments are only illustrations to assist the understanding of the disclosure, and the scope of the disclosure is not limited thereto.

1. Synthesis of Polycyclic Compound of an Embodiment.

First, the synthesis method of the polycyclic compound according to an embodiment will be explained illustrating the synthesis methods of Compounds 1, 25, 44 and 52. The synthesis methods of the polycyclic compounds explained hereinafter are embodiments, and the synthetic method of the compound according to an embodiment is not limited to the embodiments below.

(1) Synthesis of Compound 1

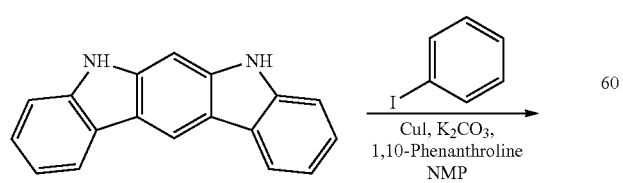

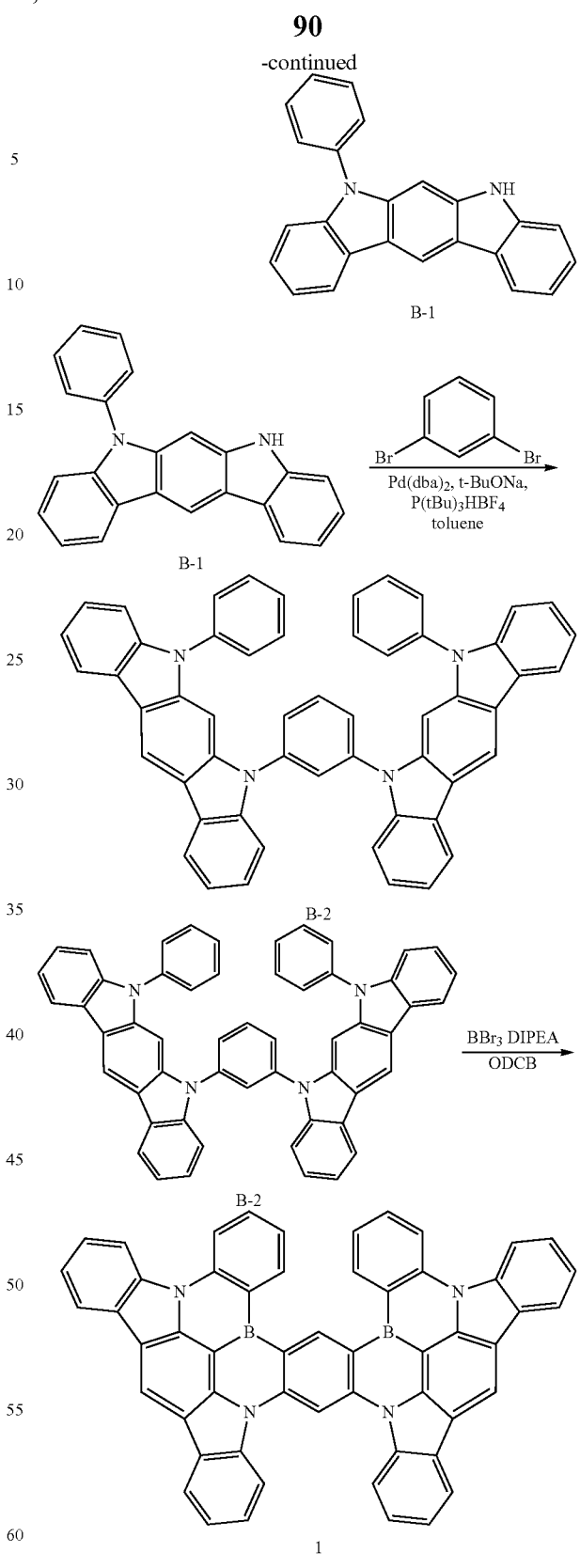

To a three-neck flask, 50 g (195 mmol) of 5,7-dihydroindolo[2,3-b]carbazole, 40 g (195 mmol) of iodobenzene, 4 g (21 mmol) of CuI, 8 g (21 mmol) of 1,10-phenanthroline and 198 g (858 mmol) of $K_2CO_3$ were added, and argon substitution was performed. 1,000 ml of NMP was added thereto and stirred at about 180° C. for about 8 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 64 g (yield 74%) of a white solid. By FABMS measurement of the separated product thus obtained, a molecular weight of 332 was secured, and the production of a target material, Intermediate B-1 was definitely confirmed.

To a three-neck flask, 32 g (98 mmol) of Intermediate B-1, 50 g (150 mmol) of dibromobenzene, 10 g (17 mmol) of Pd(dba)$_2$, 12 g (69 mmol) of P(tBu)$_3$HBF$_4$, and 17 g (180 mmol) of t-BuONa were added, and argon substitution was performed. 750 ml of toluene was added thereto and stirred at about 80° C. for about 6 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 88 g (yield 79%) of a white solid. By FABMS measurement of the separated product thus obtained, a molecular weight of 739 was secured, and the production of a target material, Intermediate B-2 was definitely confirmed.

To a three-neck flask, 50 g (68 mmol) of Intermediate B-2 was added, and argon substitution was performed. 300 ml of o-dichlorobenzene (ODCB) was added and dissolved, and 350 ml of a BBr$_3$ solution diluted into 1 M and 180 ml (135 mmol) of N,N'-diisopropylethylamine (DIPEA) were added, followed by stirring at about 190° C. for about 6 hours. 1,200 ml (880 mmol) of DIPEA was added to the reaction system and stirred at about 120° C. for about 30 minutes. The reaction solution was dispersed and washed using an excessive amount of acetonitrile, and individuals were recovered through filtering. The crude product thus obtained was separated by silica gel column chromatography (using a mixture solvent of hexane/dichloromethane) and recrystallized (using a mixture solvent of ethanol/toluene) to obtain 4 g (yield 8%) of a yellow solid. By FABMS measurement of the separated product thus obtained, a molecular weight of 754 was secured, and the production of Compound 1 was definitely confirmed.

(2) Synthesis of Compound 25

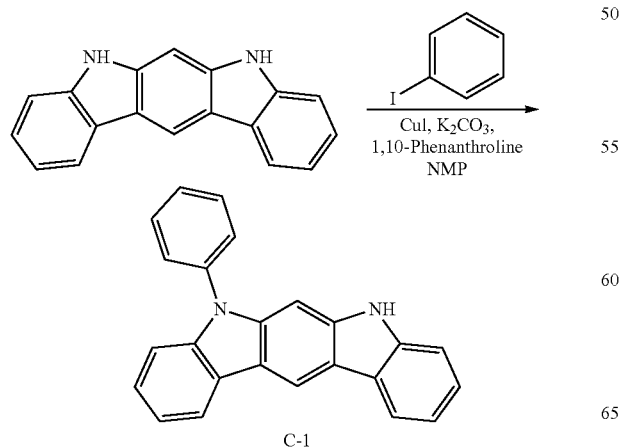

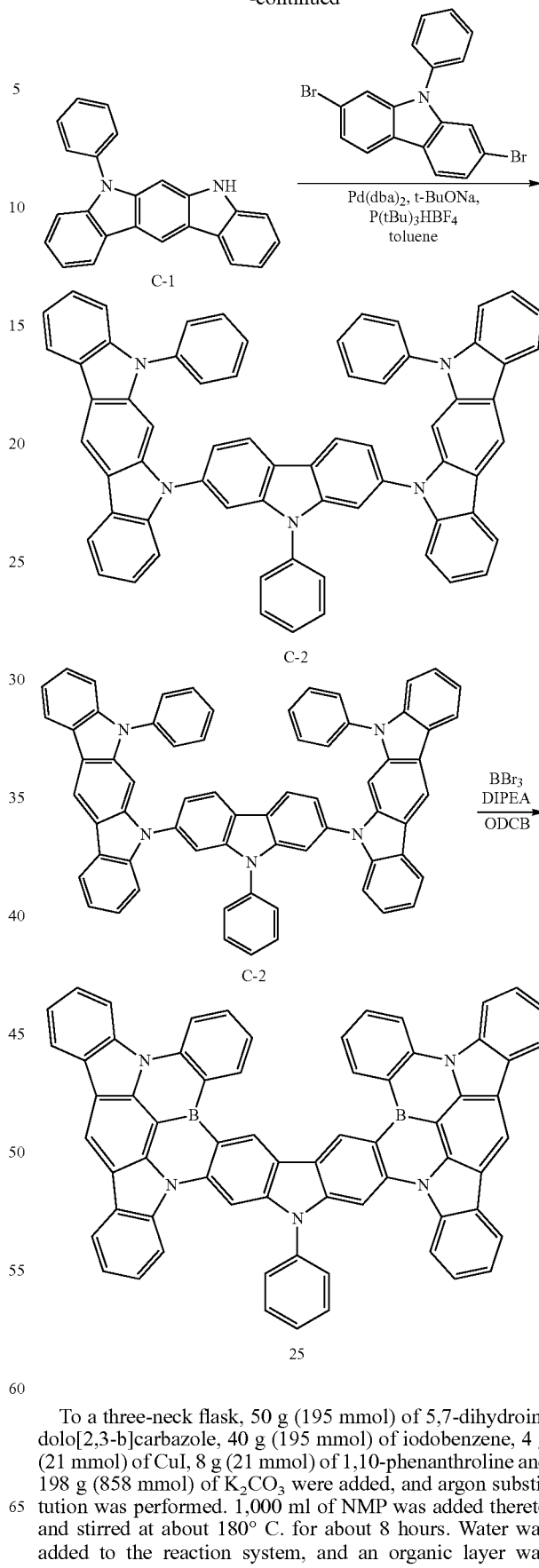

To a three-neck flask, 50 g (195 mmol) of 5,7-dihydroindolo[2,3-b]carbazole, 40 g (195 mmol) of iodobenzene, 4 g (21 mmol) of CuI, 8 g (21 mmol) of 1,10-phenanthroline and 198 g (858 mmol) of K$_2$CO$_3$ were added, and argon substitution was performed. 1,000 ml of NMP was added thereto and stirred at about 180° C. for about 8 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 64 g (yield 74%) of a white solid. By FABMS measurement of the separated product thus obtained, a molecular weight of 332 was secured, and the production of a target material, Intermediate C-1 was definitely confirmed.

To a three-neck flask, 48 g (143 mmol) of Intermediate C-1, 25 g (62 mmol) of 2,7-dibromo-9-phenylcarbazole, 4 g (7 mmol) of Pd(dba)$_2$, 5 g (29 mmol) of P(tBu)$_3$HBF$_4$, and 7 g (75 mmol) of t-BuONa were added, and argon substitution was performed. 300 ml of toluene was added thereto and stirred at about 80° C. for about 15 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 51 g (yield 91%) of a white solid. By FABMS measurement of the separated product thus obtained, a molecular weight of 904 was secured, and the production of a target material, Intermediate C-2 was definitely confirmed.

To a three-neck flask, 50 g (55 mmol) of Intermediate C-2 was added, and argon substitution was performed. 270 ml of ODCB was added and dissolved, and 550 ml of a BBr$_3$ solution diluted into 1 M and 370 ml (277 mmol) of DIPEA were added, followed by stirring at about 190° C. for about 6 hours. 1,500 ml (1,100 mmol) of DIPEA was added to the reaction system and stirred at about 120° C. for about 30 minutes. The reaction solution was dispersed and washed using an excessive amount of acetonitrile, and individuals were recovered through filtering. The crude product thus obtained was separated by silica gel column chromatography (using a mixture solvent of hexane/dichloromethane) and recrystallized (using a mixture solvent of ethanol/toluene) to obtain 250 mg (yield 0.5%) of a yellow solid. By FABMS measurement of the separated product thus obtained, a molecular weight of 920 was secured, and the production of Compound 25 was definitely confirmed.

(3) Synthesis of Compound 44

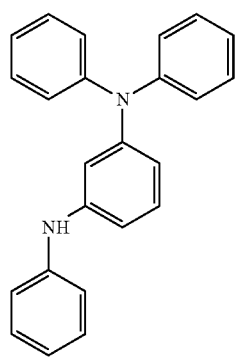

D-1

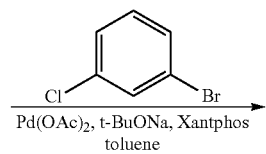

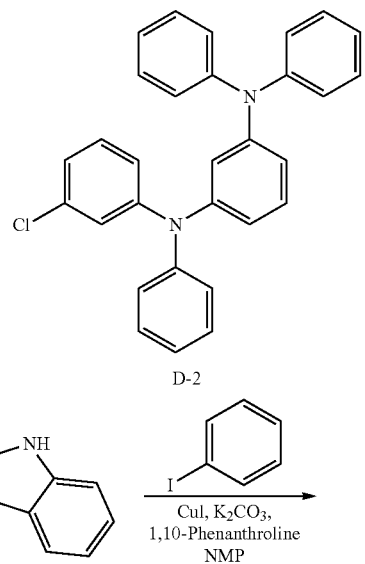

D-2

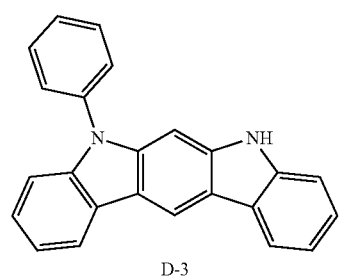

D-3

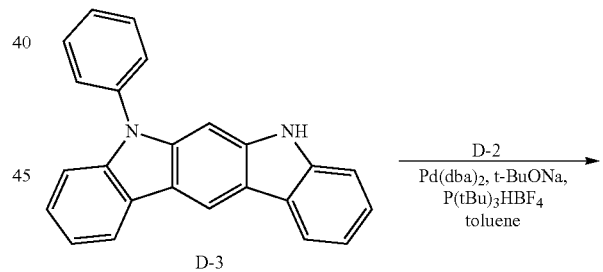

D-3

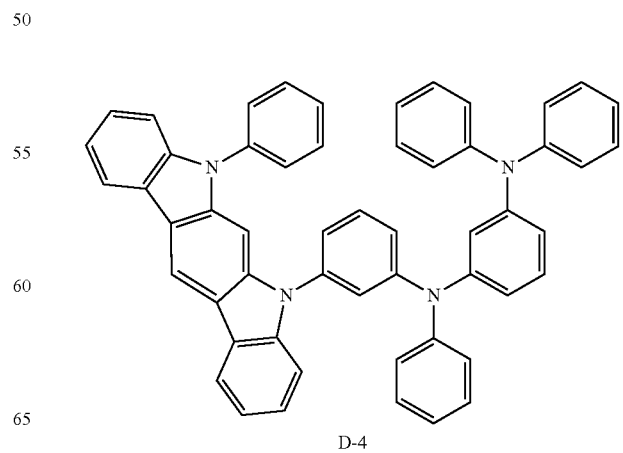

D-4

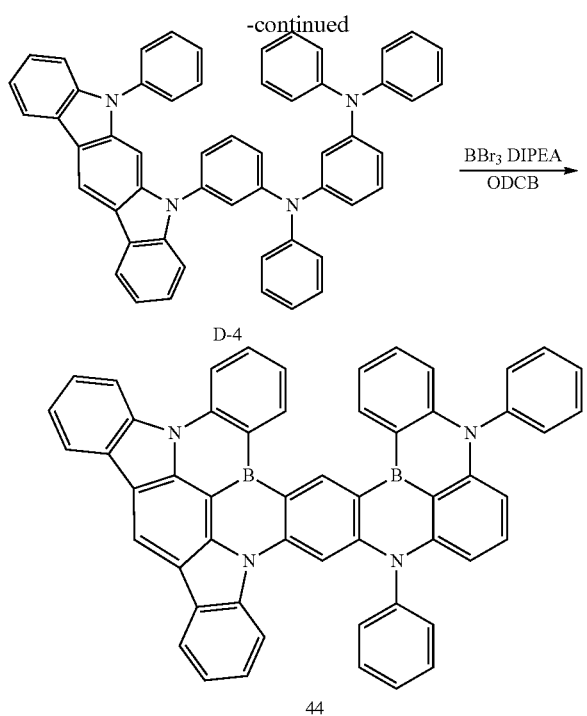

D-4

44

To a three-neck flask, 50 g (149 mmol) of Reactant D-1, 19 g (149 mmol) of 3-dibromochlorobenzene, 668 mg (3 mmol) of Pd(OAc)$_2$, 3.5 g (6 mmol) of XantPhos, and 17 g (179 mmol) of t-BuONa were added and argon substitution was performed. 300 ml of toluene was added thereto and stirred at about 80° C. for about 4 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 59 g (yield 89%) of a white solid. By FABMS measurement of the separated product thus obtained, a molecular weight of 447 was secured, and the production of a target material, Intermediate D-2 was definitely confirmed.

To a three-neck flask, 50 g (195 mmol) of 5,7-dihydroindolo[2,3-b]carbazole, 40 g (195 mmol) of iodobenzene, 4 g (21 mmol) of CuI, 8 g (21 mmol) of 1,10-phenanthroline and 198 g (858 mmol) of K$_2$CO$_3$ were added, and argon substitution was performed. 1,000 ml of NMP was added thereto and stirred at about 180° C. for about 8 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 64 g (yield 74%) of a white solid. By FABMS measurement of the separated product thus obtained, a molecular weight of 332 was secured, and the production of a target material, Intermediate D-3 was definitely confirmed.

To a three-neck flask, 25 g (56 mmol) of Intermediate D-3, 19 g (56 mmol) of Intermediate D-2, 2 g (3 mmol) of Pd(dba)$_2$, 2 g (11 mmol) of P(tBu)$_3$HBF$_4$, and 6 g (67 mmol) of t-BuONa were added, and argon substitution was performed. 280 ml of toluene was added thereto and stirred at about 120° C. for about 10 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 30 g (yield 71%) of a white solid. By FABMS measurement of the separated product thus obtained, a molecular weight of 743 was secured, and the production of a target material, Intermediate D-4 was definitely confirmed.

To a three-neck flask, 30 g (40 mmol) of Intermediate D-4 was added, and argon substitution was performed. 200 ml of ODCB was added and dissolved, and 400 ml of a BBr$_3$ solution diluted into 1 M and 270 ml (202 mmol) of DIPEA were added, followed by stirring at about 190° C. for about 24 hours. 1,100 ml (808 mmol) (808 mmol) of DIPEA was added to the reaction system and stirred at about 120° C. for about 30 minutes. The reaction solution was dispersed and washed using an excessive amount of acetonitrile, and individuals were recovered through filtering. The crude product thus obtained was separated by silica gel column chromatography (using a mixture solvent of hexane/dichloromethane) and recrystallized (using a mixture solvent of ethanol/toluene) to obtain 1.2 g (yield 4%) of a yellow solid. By FABMS measurement of the separated product thus obtained, a molecular weight of 789 was secured, and the production of Compound 44 was definitely confirmed.

(4) Synthesis of Compound 52

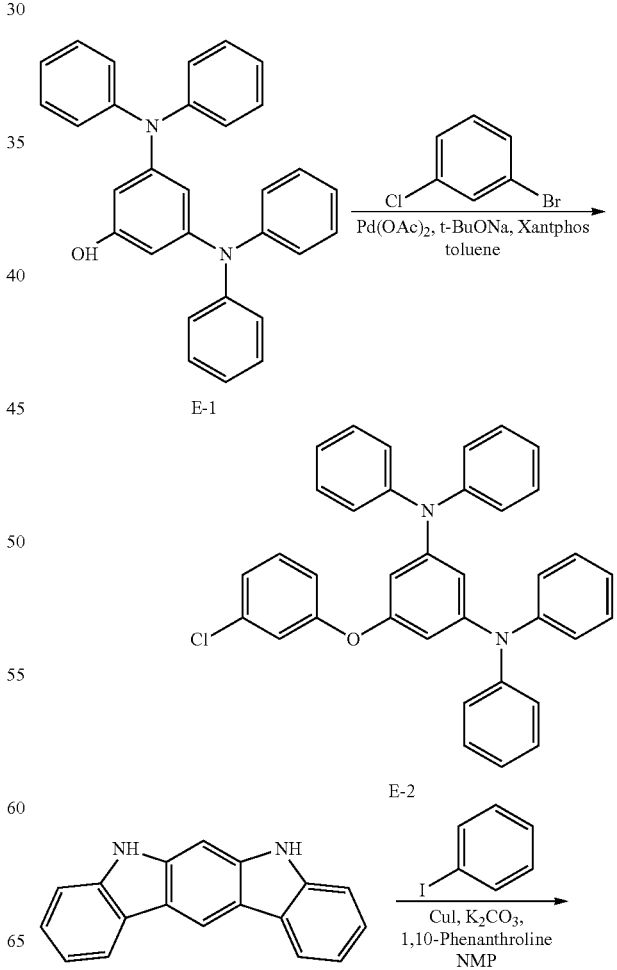

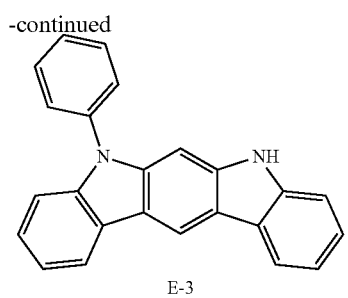

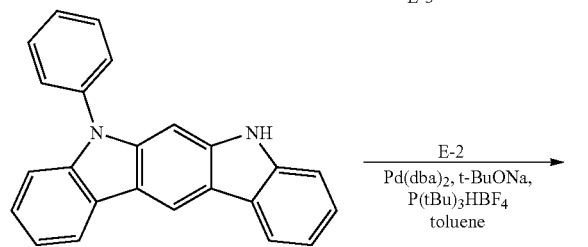

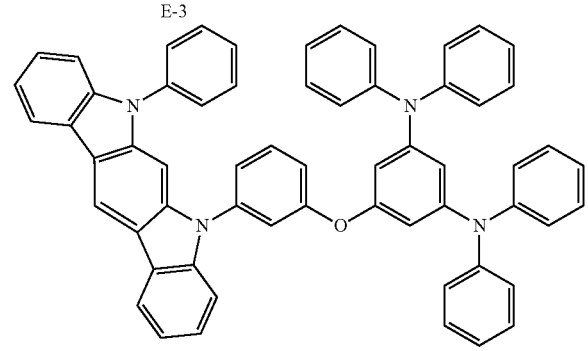

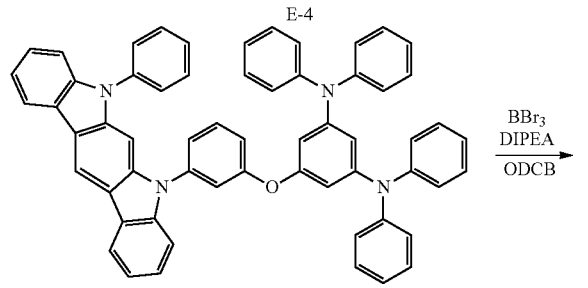

To a three-neck flask, 64 g (149 mmol) of Reactant E-1, 19 g (149 mmol) of 3-dibromochlorobenzene, 668 mg (3 mmol) of Pd(OAc)$_2$, 3.5 g (6 mmol) of XantPhos, and 17 g (179 mmol) of t-BuONa were added, and argon substitution was performed. 300 ml of toluene was added thereto and stirred at about 80° C. for about 6 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 60 g (yield 75%) of a white solid. By FABMS measurement of the separated product thus obtained, a molecular weight of 539 was secured, and the production of a target material, Intermediate E-2 was definitely confirmed.

To a three-neck flask, 50 g (195 mmol) of 5,7-dihydroindolo[2,3-b]carbazole, 40 g (195 mmol) of iodobenzene, 4 g (21 mmol) of CuI, 8 g (21 mmol) of 1,10-phenanthroline and 198 g (858 mmol) of K$_2$CO$_3$ were added, and argon substitution was performed. 1,000 ml of NMP was added thereto and stirred at about 180° C. for about 8 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 64 g (yield 74%) of a white solid. By FABMS measurement of the separated product thus obtained, a molecular weight of 332 was secured, and the production of a target material, Intermediate E-3 was definitely confirmed.

To a three-neck flask, 25 g (46 mmol) of Intermediate E-3, 15 g (46 mmol) of Intermediate E-2, 2 g (2 mmol) of Pd(dba)$_2$, 1.7 g (9 mmol) of P(tBu)$_3$HBF$_4$, and 5 g (56 mmol) of t-BuONa were added, and argon substitution was performed. 232 ml of toluene was added thereto and stirred at about 120° C. for about 20 hours. Water was added to the reaction system, and an organic layer was extracted using toluene and dried with magnesium sulfate. Solvents were removed by distillation. The crude product thus obtained was separated by silica gel column chromatography (using a mixture solvent of hexane/toluene) and recrystallized (using a mixture solvent of ethanol/toluene) to obtain 26 g (yield 68%) of a white solid. By FABMS measurement of the separated product thus obtained, a molecular weight of 835 was secured, and the production of a target material, Intermediate E-4 was definitely confirmed.

To a three-neck flask, 26 g (31 mmol) of Intermediate E-4 was added, and argon substitution was performed. 100 ml of ODCB was added and dissolved, and 311 ml of a BBr$_3$ solution diluted into 1 M and 210 ml (156 mmol) of DIPEA were added, followed by stirring at about 190° C. for about 3 hours. 840 ml (623 mmol) of DIPEA was added to the reaction system and stirred at about 120° C. for about 30 minutes. The reaction solution was dispersed and washed using an excessive amount of acetonitrile, and individuals were recovered through filtering. The crude product thus obtained was separated by silica gel column chromatography (using a mixture solvent of hexane/dichloromethane) and recrystallized (using a mixture solvent of ethanol/toluene) to obtain 2.9 g (yield 11%) of a yellow solid. By FABMS measurement of the separated product thus obtained, a molecular weight of 851 was secured, and the production of Compound 52 was definitely confirmed.

2. Evaluation of Polycyclic Compound

The evaluation of the polycyclic compounds of embodiments, Example Compounds 1, 25, 44 and 52, and Comparative Compounds X1 to X7 was conducted. The Example Compounds and Comparative Compounds are shown in Table 1 below.

TABLE 1
Compound 1
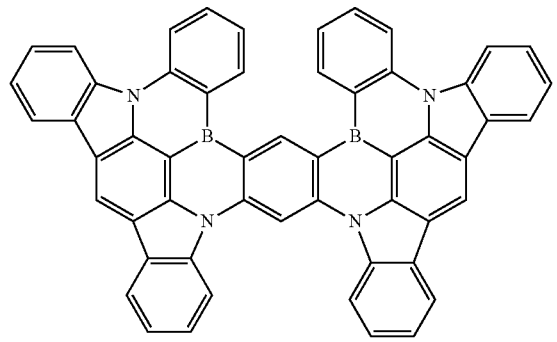
1
Compound 25
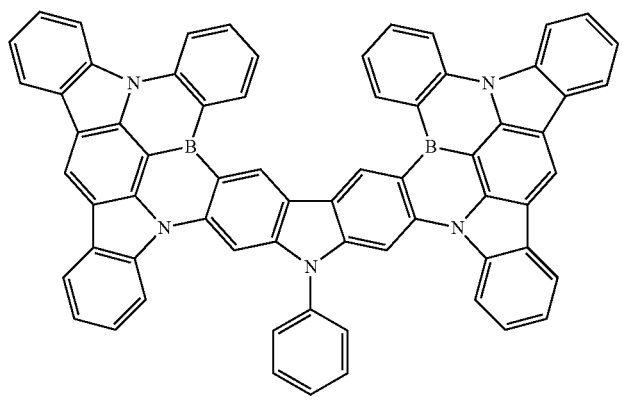
25
Compound 44
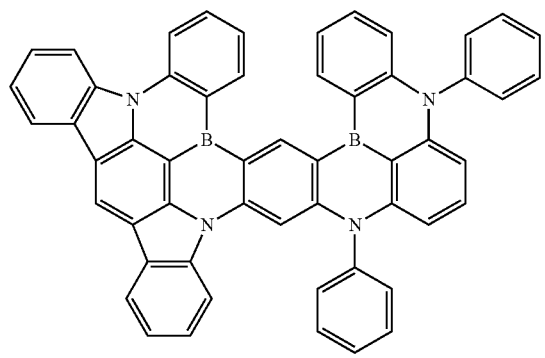
44
Compound 52
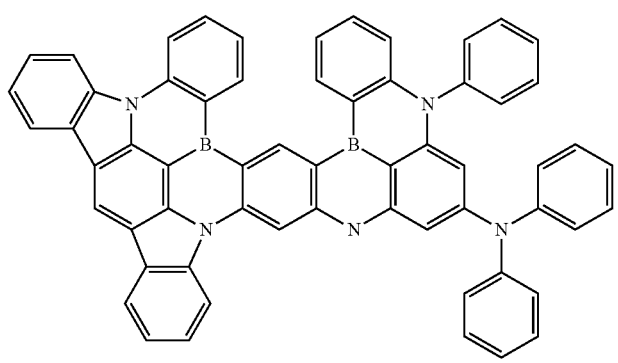
52

TABLE 1-continued
| Comparative Compound X1 | 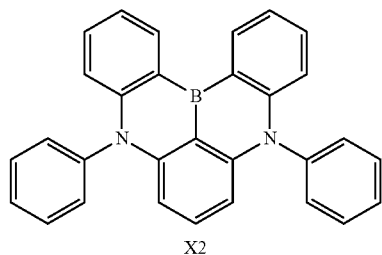 |
| --- | --- |
| | X2 |
| Comparative Compound X2 | 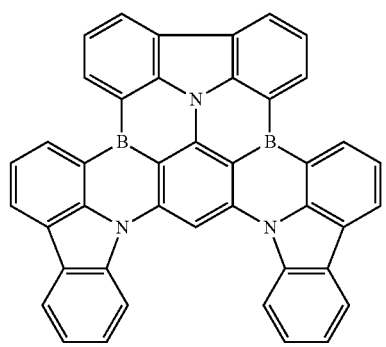 |
| | X2 |
| Comparative Compound X3 | 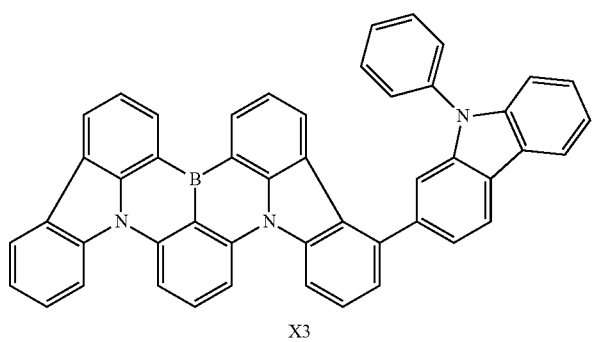 |
| | X3 |
| Comparative Compound X4 | 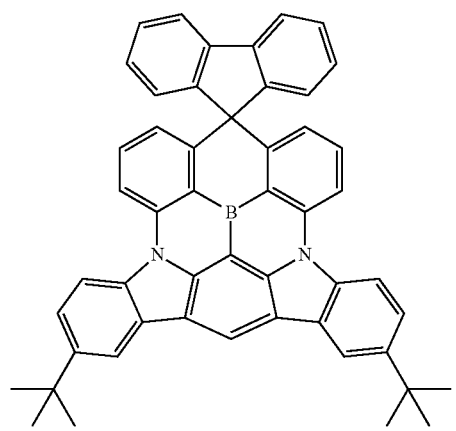 |
| | X4 |

TABLE 1-continued

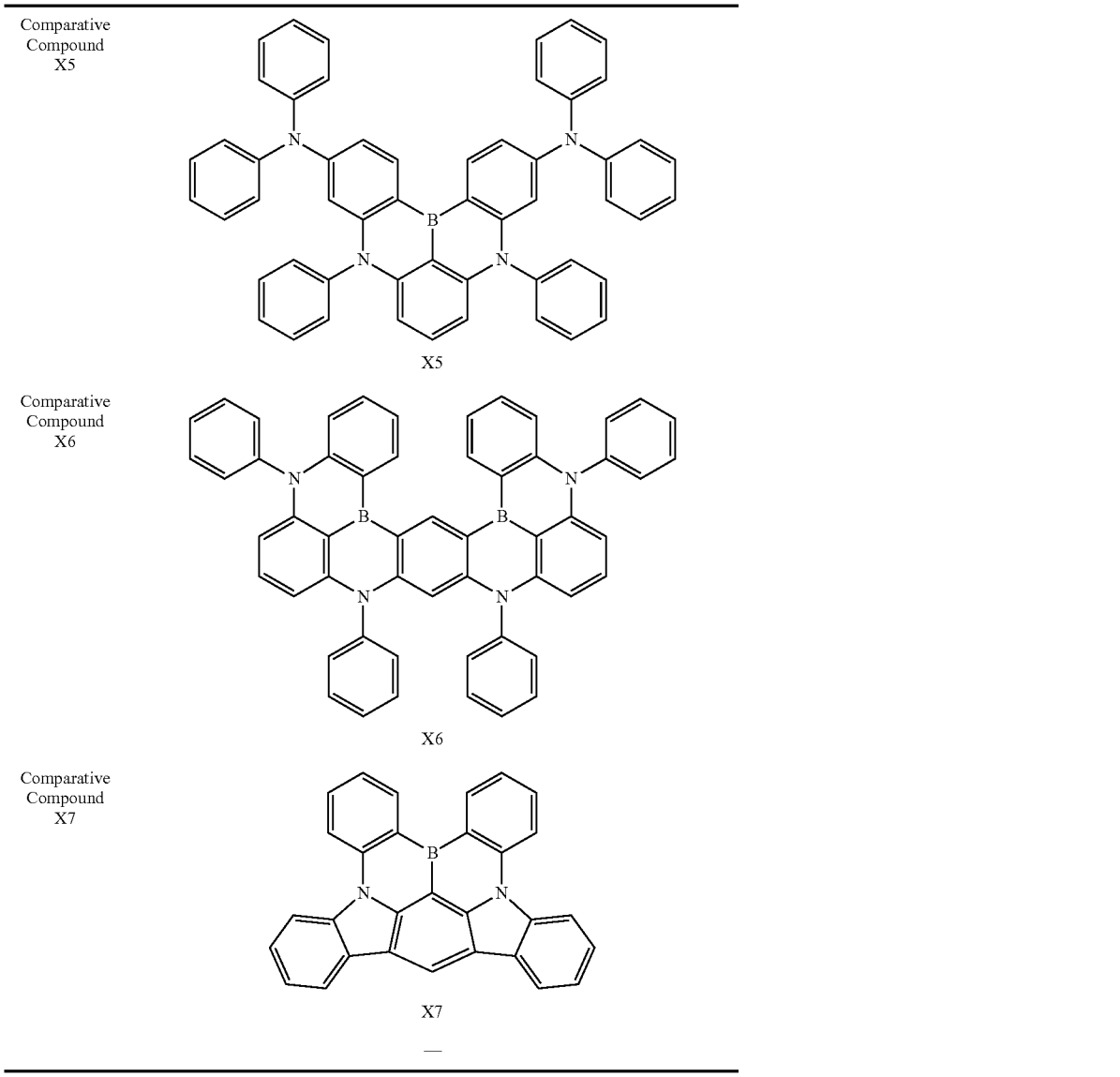

(Evaluation of Energy Level of Compounds)

In Table 2 below, the lowest singlet excitation energy levels (S1 level) and the lowest triplet excitation energy levels (T1 level) of the Example Compounds and Comparative Compounds, and $\Delta E_{ST}$ values are shown.

The energy level values in Table 2 were calculated by a non-empirical molecular orbital method. The calculation was conducted by B3LYP/6-31G(d) using Gaussian 09 of Gaussian Co. $\Delta E_{ST}$ represents a difference between the lowest singlet excitation energy level (S1 level) and the lowest triplet excitation energy level (T1 level).

TABLE 2

| Division | S1 (eV) | T1 (eV) | $\Delta E_{ST}$ (eV) |
| --- | --- | --- | --- |
| Compound 1 | 2.96 | 2.58 | 0.38 |
| Compound 25 | 2.99 | 2.57 | 0.42 |
| Compound 44 | 3.01 | 2.54 | 0.43 |
| Compound 52 | 3.08 | 2.66 | 0.42 |
| Comparative Compound X1 | 3.24 | 2.71 | 0.53 |
| Comparative Compound X2 | 2.98 | 2.59 | 0.39 |
| Comparative Compound X3 | 2.87 | 2.47 | 0.40 |
| Comparative Compound X4 | 3.17 | 2.68 | 0.49 |
| Comparative Compound X5 | 3.11 | 2.63 | 0.48 |
| Comparative Compound X6 | 3.02 | 2.67 | 0.35 |
| Comparative Compound X7 | 3.21 | 2.68 | 0.53 |

It could be found that the Example Compounds, Compounds 1, 25, 44 and 52 and Comparative Compounds X1 to X7 showed similar level of $\Delta E_{ST}$ values.

(Evaluation of Light Emitting Properties of Compounds)

A specimen for evaluating light emitting properties was manufactured by depositing a composition including each of the Example Compounds and Comparative Compounds for evaluation to form an organic layer on a quartz substrate. PPF was used as a host material during manufacturing the specimen. In the composition for manufacturing the specimen, the Example Compound or Comparative Compound was included in about 20 wt % with respect to the total weight of the composition.

Phosphorescence emission spectrum was measured using a JASCO V-670 spectrometer. The phosphorescence quantum yield was measured using a JAS COILF-835 integrating sphere system. Table 3 shows the maximum emission wavelength ($\lambda_{max}$) and phosphorescence quantum yield (PLQY) on the phosphorescence emission spectrum.

TABLE 3

| Division | $\lambda_{max}$ (nm) | PLQY (%) |
| --- | --- | --- |
| Compound 1 | 459 | 90.5 |
| Compound 25 | 457 | 79.6 |
| Compound 44 | 458 | 81.4 |
| Compound 52 | 456 | 87.5 |
| Comparative Compound X1 | 450 | 80.0 |
| Comparative Compound X2 | 496 | 85.7 |
| Comparative Compound X3 | 475 | 70.4 |
| Comparative Compound X4 | 452 | 66.5 |
| Comparative Compound X5 | 455 | 87.1 |
| Comparative Compound X6 | 458 | 80.4 |
| Comparative Compound X7 | 455 | 75.6 |

Referring to Table 3, it could be found that Example Compounds, Compounds 1, 25, 44 and 52 showed the maximum emission wavelength of about 490 nm or less and emitted deep blue light. The Example Compounds, Compounds 1, 25, 44 and 52, and Comparative Compounds X1, X2, X5 and X6 showed better phosphorescence quantum yield when compared with Comparative Compounds X3, X4 and X7. The Example Compounds, Compounds 1 and 52 showed better phosphorescence quantum yield than Comparative Compounds X1 to X7.

3. Manufacture and Evaluation of Light Emitting Device Including Polycyclic Compound The evaluation on the light emitting device of an embodiment, including the polycyclic compound of an embodiment in an emission layer was conducted by a method below. A method for manufacturing a light emitting device for evaluating a device is described below.

The light emitting devices of Example 1 to Example 4 were manufactured using the polycyclic compounds of Compounds 1, 25, 44 and 52 as the dopant materials of an emission layer. Comparative Example 1 to Comparative Example 7 were light emitting devices manufactured using Comparative Compounds X1 to X7 as the dopant materials of an emission layer.

(Manufacture of Light Emitting Device)

On a glass substrate, ITO with a thickness of about 1,500 Å was patterned and washed with ultra-pure water, cleaned with ultrasonic waves, exposed to UV for about 30 minutes and treated with ozone. HAT-CN was deposited to a thickness of about 100 Å, α-NPD was deposited to a thickness of about 400 Å, and mCP was deposited to a thickness of about 50 Å to form a hole transport region.

The above-described polycyclic compound or the Comparative Compound and mCBP were co-deposited in a ratio of 1:99 to form an emission layer with thickness of about 200 Å. The emission layer formed by the co-deposition was formed by mixing each of Compounds 1, 25, 44 and 52 with mCBP in Example 1 to Example 4, and each of Comparative Compounds X1 to X7 with mCBP in Comparative Example 1 to Comparative Example 7, and depositing.

On the emission layer, TPBi was deposited to a thickness of about 300 Å, and LiF was deposited to a thickness of about 5 Å to form an electron transport region. A second electrode with a thickness of about 1,000 Å was formed using aluminum (Al).

In the Examples, the hole transport region, the emission layer, the electron transport region, and the second electrode were formed using a vacuum deposition apparatus.

(Evaluation of Properties of Light Emitting Device)

In Table 4, the evaluation results of light emitting devices of the Examples and Comparative Examples are shown. In Table 4, the maximum emission wavelength ($\lambda_{max}$), external quantum efficiency ($EQE_{max}$) and device life ($LT_{50}$) in the light emitting devices thus manufactured are compared and shown. The device life ($LT_{50}$) represents time required for reducing the luminance of a device from about 100% to about 50%. The luminance and external quantum efficiency of the light emitting device were measured using an external quantum efficiency measurement apparatus of C9920-12 of Hamamatsu Photonics.

TABLE 4

| Division | Dopant material | $\lambda_{max}$ (nm) | $EQE_{max}$ (%) | $LT_{50}$ (hour) |
| --- | --- | --- | --- | --- |
| Example 1 | Compound 1 | 462 | 25.9 | 255 |
| Example 2 | Compound 25 | 460 | 25.3 | 245 |
| Example 3 | Compound 44 | 460 | 24.2 | 168 |
| Example 4 | Compound 52 | 458 | 27.1 | 158 |
| Compartive Example 1 | Comparative Compound X1 | 451 | 18.2 | 12 |
| Comparative Example 2 | Comparative Compound X2 | 468 | 22.6 | 60 |
| Comparative Example 3 | Comparative Compound X3 | 478 | 20.3 | 32 |
| Comparative Example 4 | Comparative Compound X4 | 453 | 16.6 | 5 |
| Comparative Example 5 | Comparative Compound X5 | 456 | 21.1 | 15 |
| Comparative Example 6 | Comparative Compound X6 | 458 | 23.0 | 23 |
| Comparative Example 7 | Comparative Compound X7 | 456 | 20.5 | 20 |

Referring to Table 4, it could be found that the light emitting devices of Comparative Example 1 to Comparative Example 7 and the light emitting devices of Example 1 to Example 4 emitted light in a blue wavelength region of about 480 nm or less. It could be found that the light emitting devices of Example 1 to Example 4 showed excellent values of the external quantum efficiency when compared with the light emitting devices of Comparative Example 1 to Comparative Example 7. The light emitting devices of the Examples showed the maximum value of the external quantum efficiency of about 24% to about 30%.

It can be seen that the light emitting devices of the Examples showed longer device life than the light emitting devices of the Comparative Examples. The light emitting devices of the Comparative Examples showed the device life of about 70 hours or less, but the light emitting devices of the Examples showed the device life of about 150 hours or more. The light emitting devices of the Examples include the polycyclic compound of an embodiment and showed improved emission efficiency and excellent device life.

The polycyclic compound of an embodiment may include a fused ring structure in which neighboring aromatic rings are connected via a single bond. The fused ring includes a heteroatom as a ring-forming atom, and the single bond may be formed at a position facing the heteroatom. One or more pentagonal rings including a single bond and a heteroatom may be formed. Accordingly, the polycyclic compound may show planarity, and a $\Delta E_{ST}$ value may show improved properties. The light emitting device including the polycyclic compound of an embodiment may show improved emission efficiency and excellent device life.

The light emitting device of an embodiment includes the polycyclic compound of an embodiment, and in the polycyclic compound of an embodiment, 10 or more aromatic rings may be fused. The fused ring structure of the polycyclic compound may show planarity, and a $\Delta E_{ST}$ value may show improved properties. Accordingly, the light emitting device of an embodiment may show excellent emission efficiency and long life characteristics.

The light emitting device of an embodiment may show improved device properties of high efficiency and long life characteristics in a blue wavelength region.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. A light emitting device, comprising:
a first electrode;
a second electrode disposed on the first electrode; and
an emission layer disposed between the first electrode and the second electrode and comprising a polycyclic compound represented by one of Formula 1-1 to Formula 1-4:

[Formula 1-1]
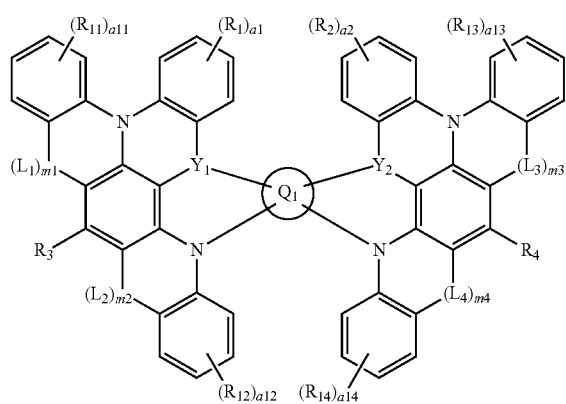

[Formula 1-2]
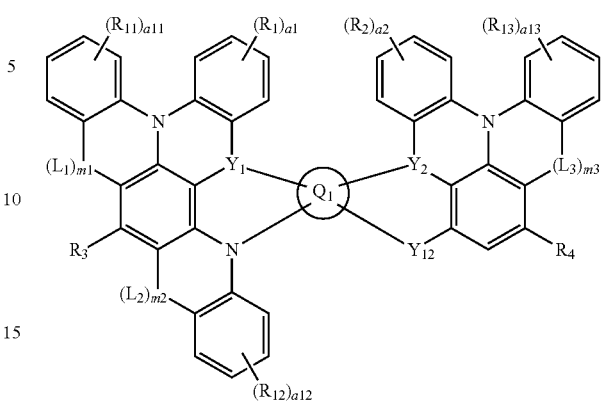

[Formula 1-3]
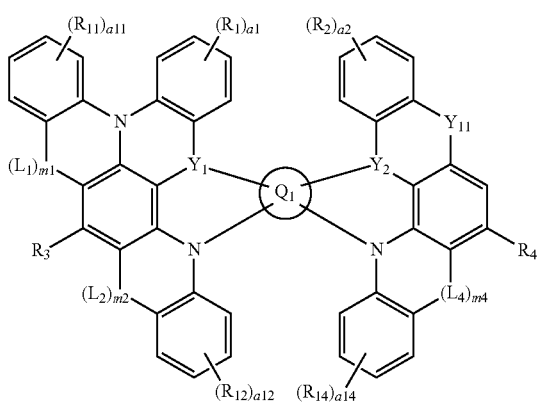

[Formula 1-4]
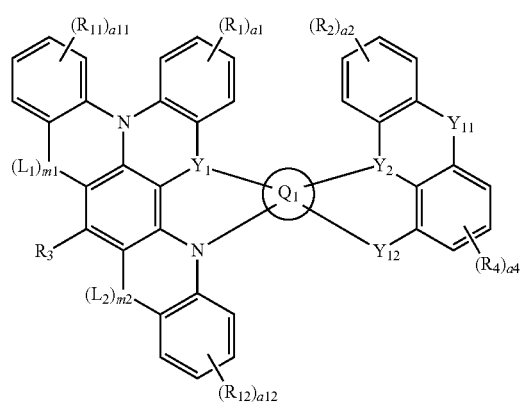

wherein in Formula 1-1 to Formula 1-4,
$Q_1$ is a substituted or unsubstituted hydrocarbon ring group, or a substituted or unsubstituted heterocyclic group,
$Y_1$ and $Y_2$ are each independently B, N, P, P=O, P=S, Al, Ga, As, Si($R_5$), or Ge($R_6$),
$Y_{11}$ and $Y_{12}$ are each independently O or S,
a1 and a2 are each independently an integer from 0 to 4,
a4 is an integer from 0 to 3,
a11 to a14 are each independently an integer from 0 to 4,
$L_1$ to $L_4$ are each a direct linkage,
at least one of m1 to m4 is 1, and the remainder of m1 to m4 are each independently 0 or 1,
$R_1$ to $R_6$ are each independently a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and $R_{11}$ to $R_{14}$ are each independently a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

2. The light emitting device of claim 1, wherein in Formula 1-1, $Y_1$ and $Y_2$ are each independently Al, Ga, As, Si($R_5$), or Ge($R_6$), and $R_5$ and $R_6$ are each an unsubstituted phenyl group.

3. The light emitting device of claim 1, wherein if a11 is an integer of 2 or more, multiple $R_{11}$ groups are combined to form a hydrocarbon ring.

4. The light emitting device of claim 1, wherein $R_{11}$ to $R_{14}$ are each independently a methyl group, a t-butyl group, an unsubstituted phenyl group, a substituted or unsubstituted diphenylamine group, or a substituted or unsubstituted carbazole group.

5. The light emitting device of claim 1, wherein Formula 1-1 is represented by one of Formula 1-1A to Formula 1-1C:

[Formula 1-1A]

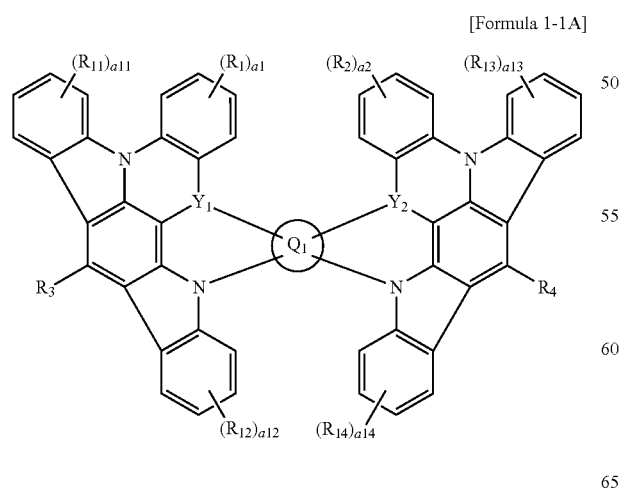

[Formula 1-1B]

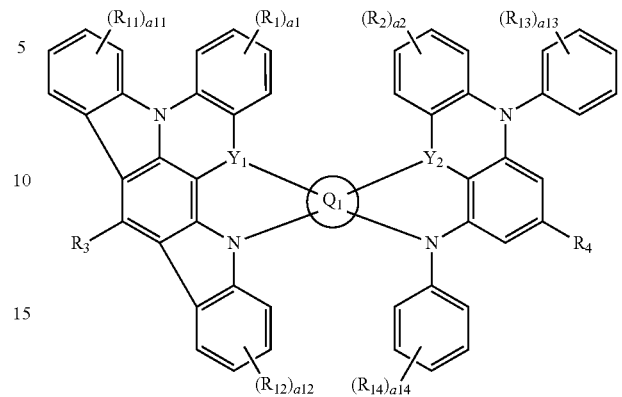

[Formula 1-1C]

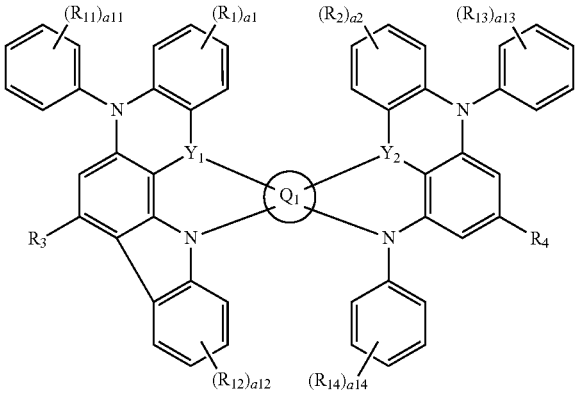

wherein in Formula 1-1A to Formula 1-1C, a1, a2, a11 to a14, $R_1$ to $R_4$, $R_{11}$ to $R_{14}$, $Q_1$, $Y_1$, and $Y_2$ are the same as defined in connection with Formula 1-1.

6. The light emitting device of claim 1, wherein $R_3$ and $R_4$ are each independently represented by R-1 or R-2:

R-1

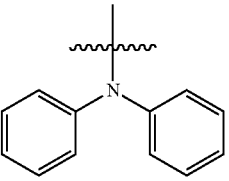

R-2

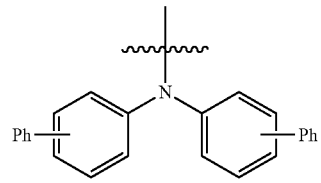

wherein in R-2,
Ph is a phenyl group, and
wherein in R-1 and R-2,

indicates a binding site to a neighboring atom.

7. The light emitting device of claim 1, wherein $Y_1$ and $Y_2$ are the same.

8. The light emitting device of claim 1, wherein the polycyclic compound has bilateral symmetry with respect to $Q_1$.

9. The light emitting device of claim 1, wherein the polycyclic compound comprises at least one substituted or unsubstituted diphenylamine group.

10. The light emitting device of claim 1, wherein the emission layer emits light with a central wavelength in a range of about 430 nm to about 470 nm.

11. The light emitting device of claim 1, further comprising a capping layer disposed on the second electrode, wherein
the capping layer has a refractive index equal to or greater than about 1.6.

12. The light emitting device of claim 1, wherein
the emission layer is a delayed fluorescence emission layer comprising a host and a dopant, and
the dopant comprises the polycyclic compound.

13. The light emitting device of claim 1, wherein the emission layer comprises at least one compound selected from Compound Group 1:

[Compound Group 1]

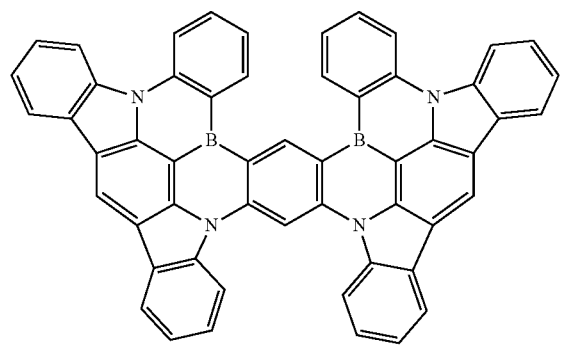

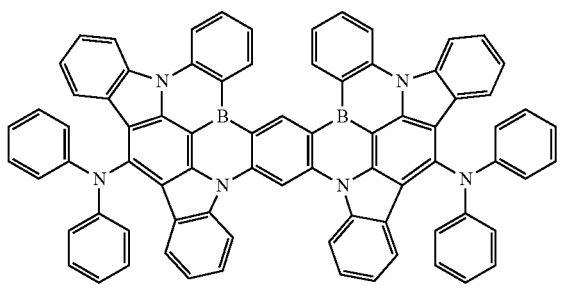

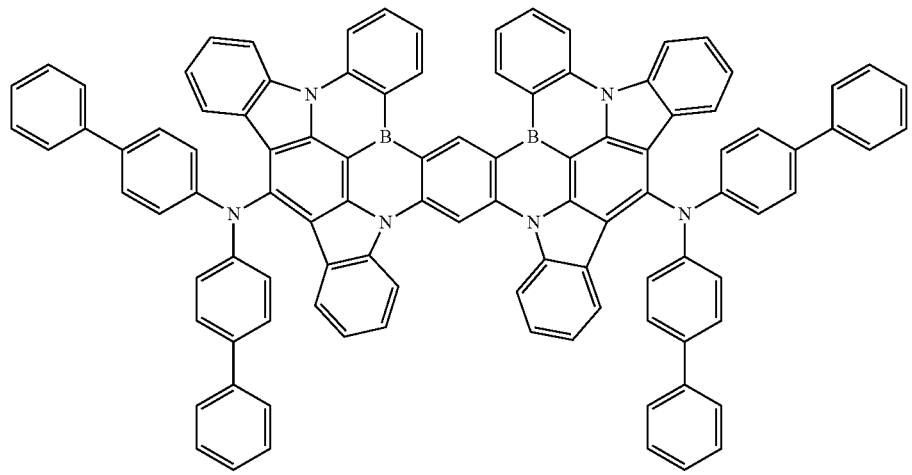

4
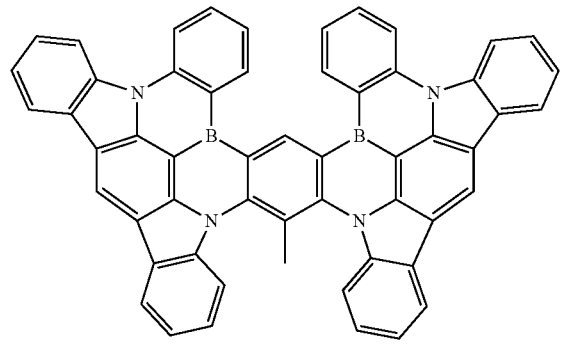
5
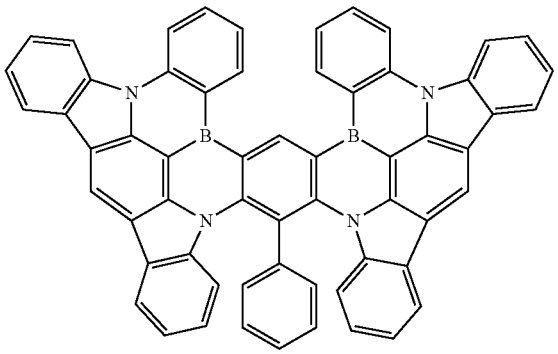
6
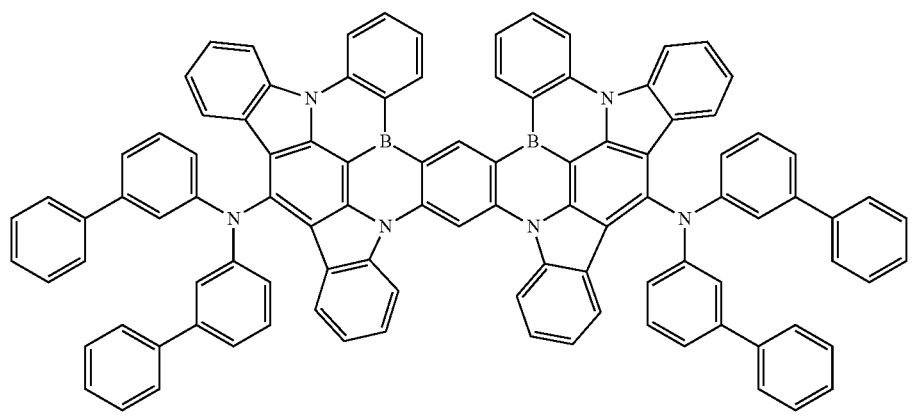
7
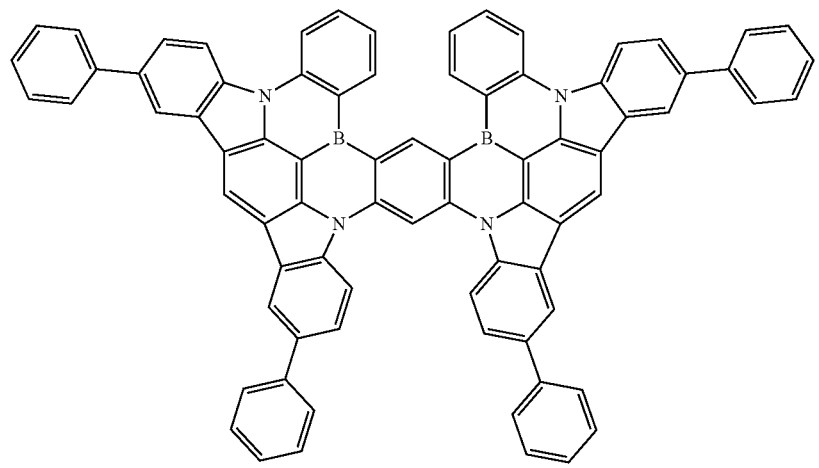
8
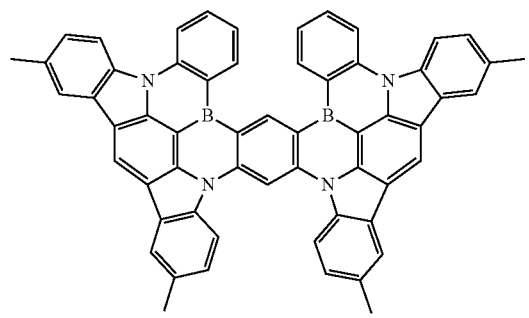
9
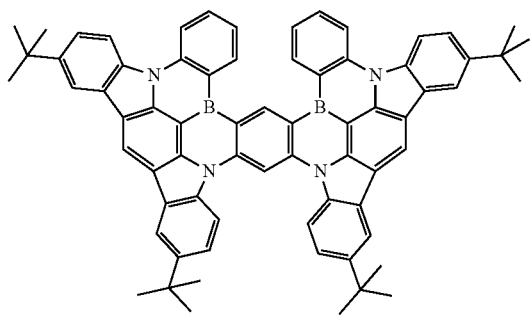

-continued
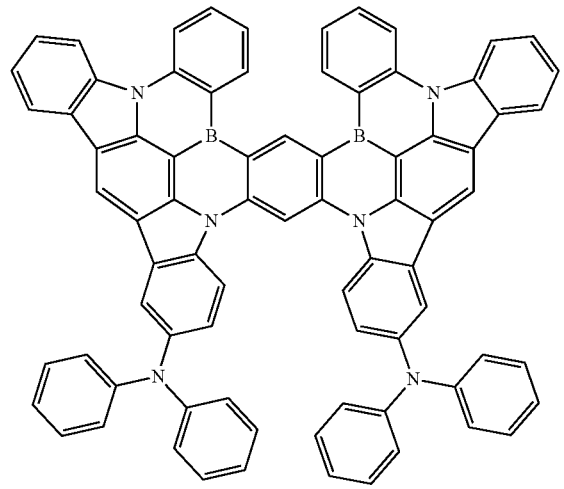
10
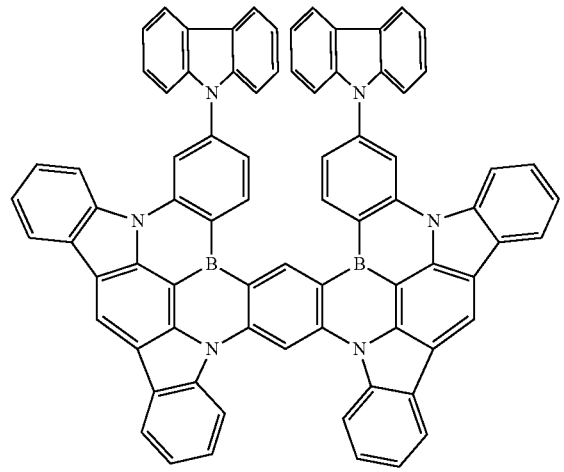
11
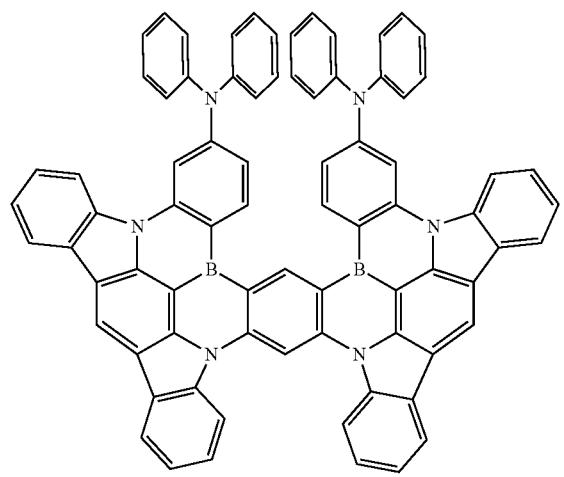
12
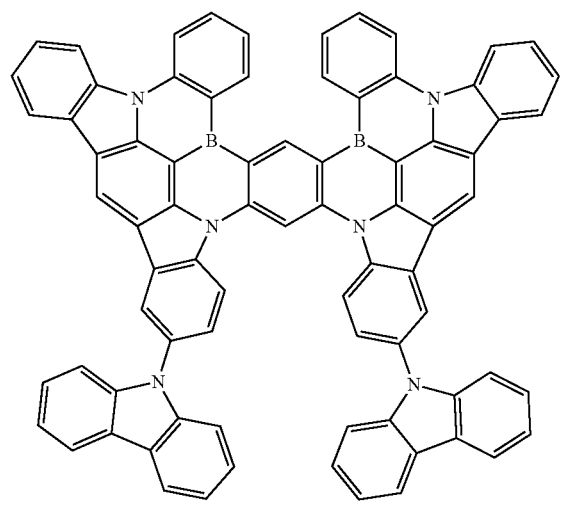
13
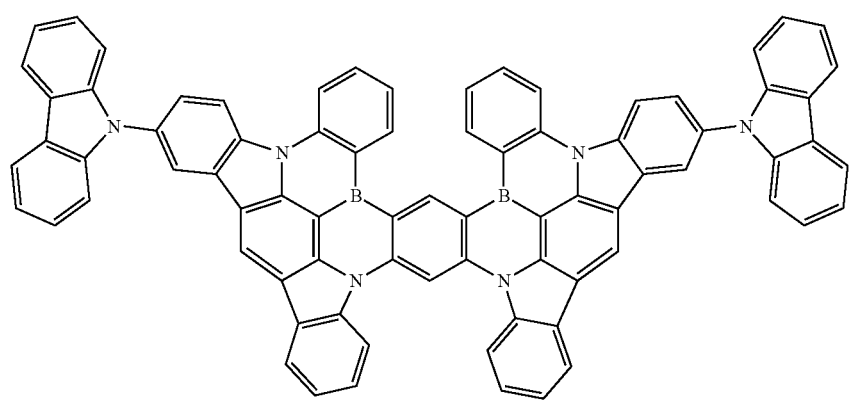
14

-continued
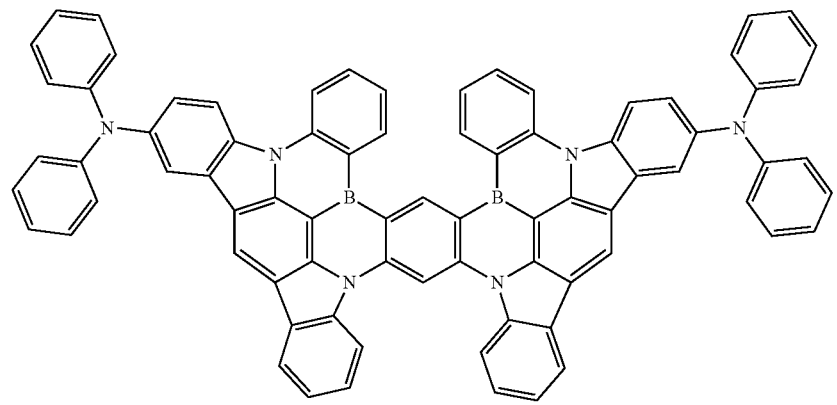
15
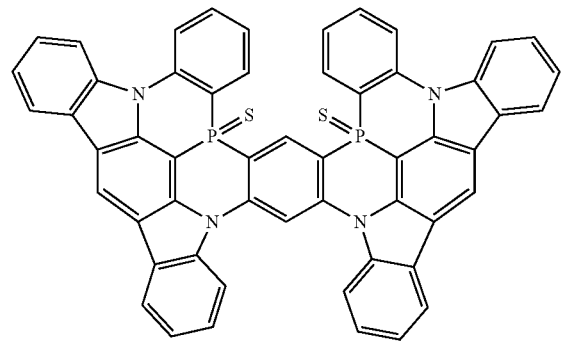
16
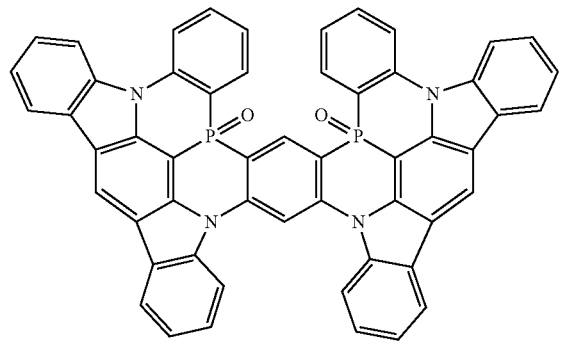
17
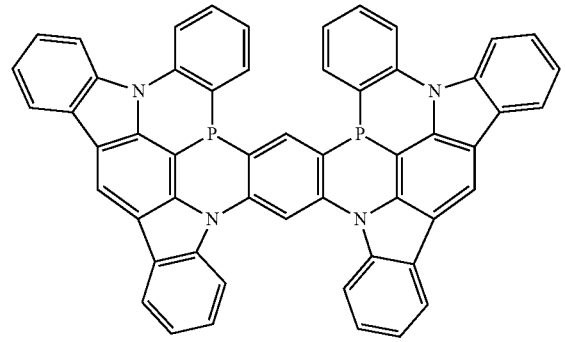
18
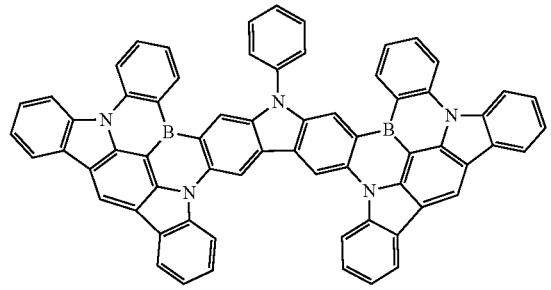
19
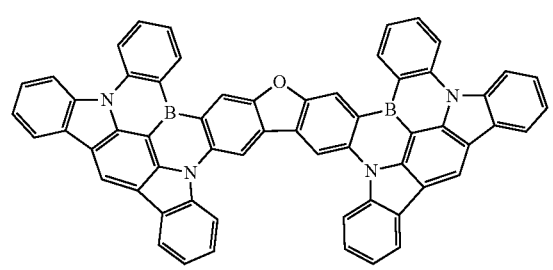
20
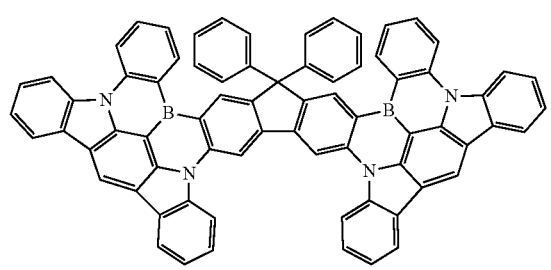
21

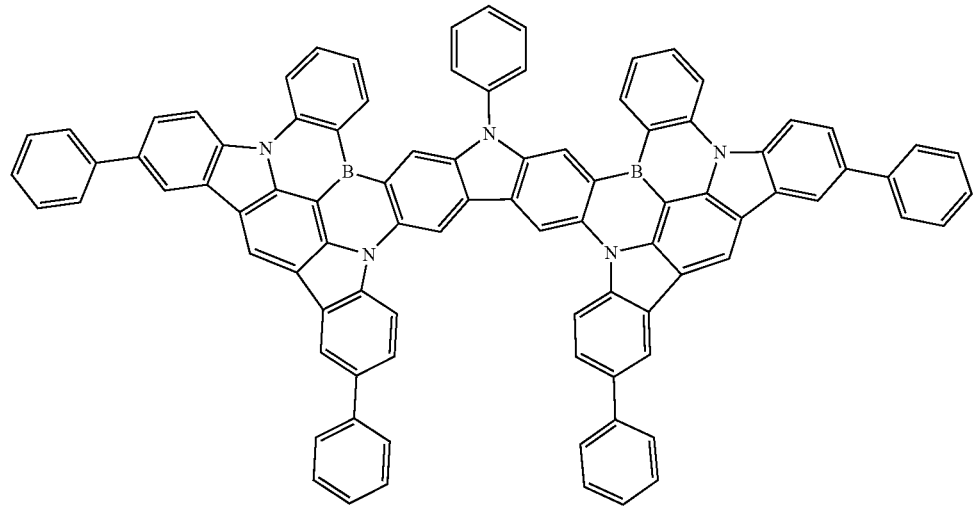
22
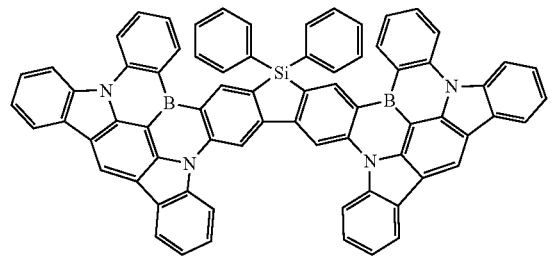
23
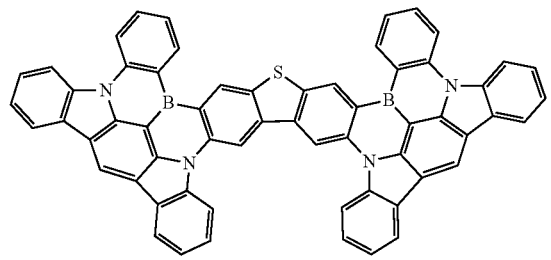
24
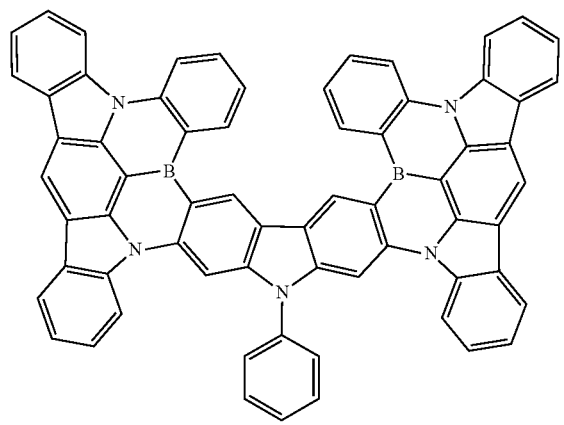
25
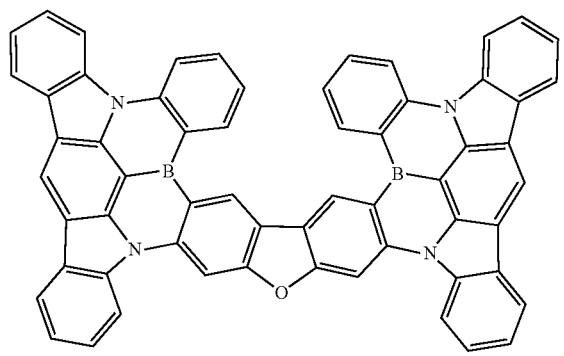
26
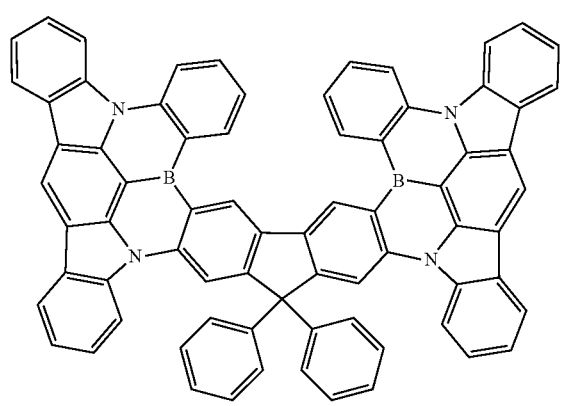
27

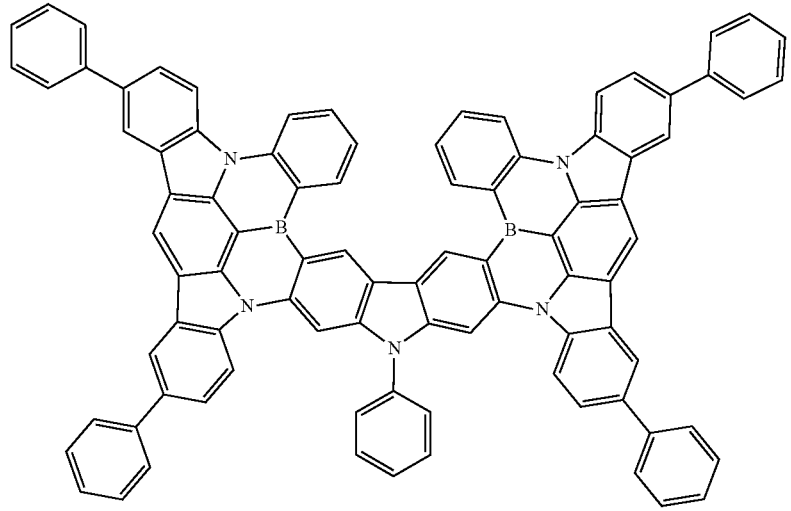
28
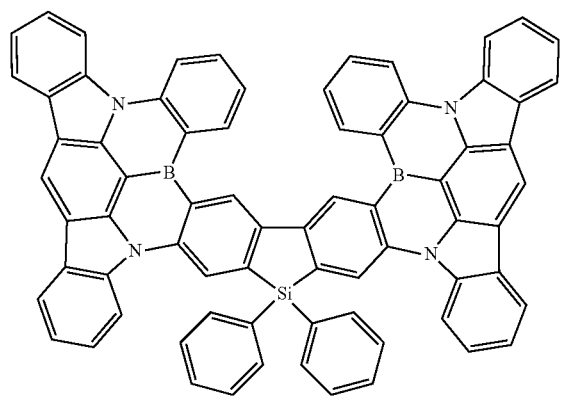
29
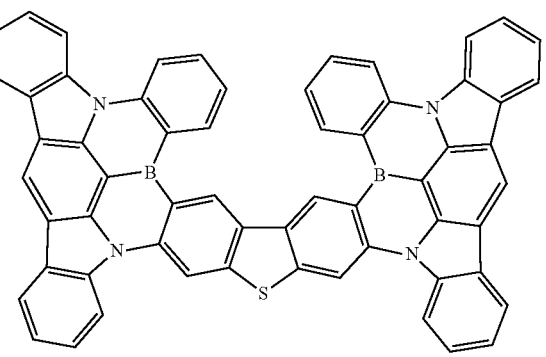
30
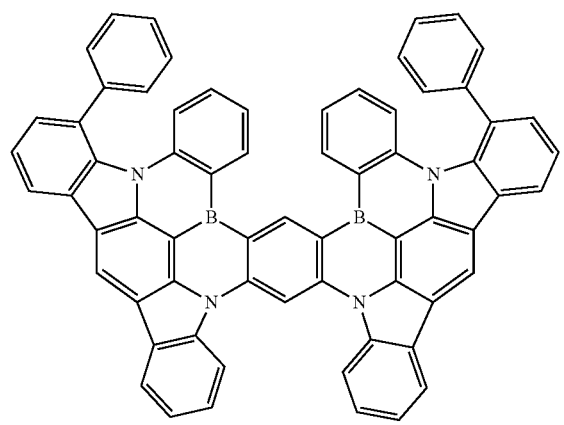
31
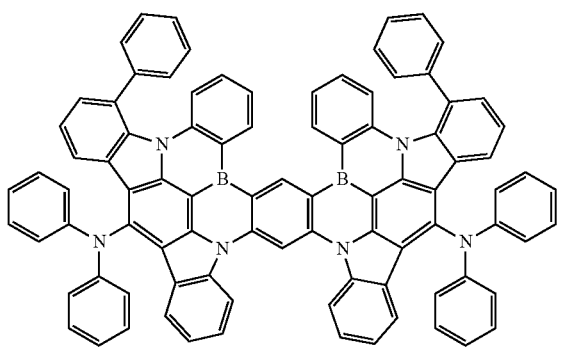
32

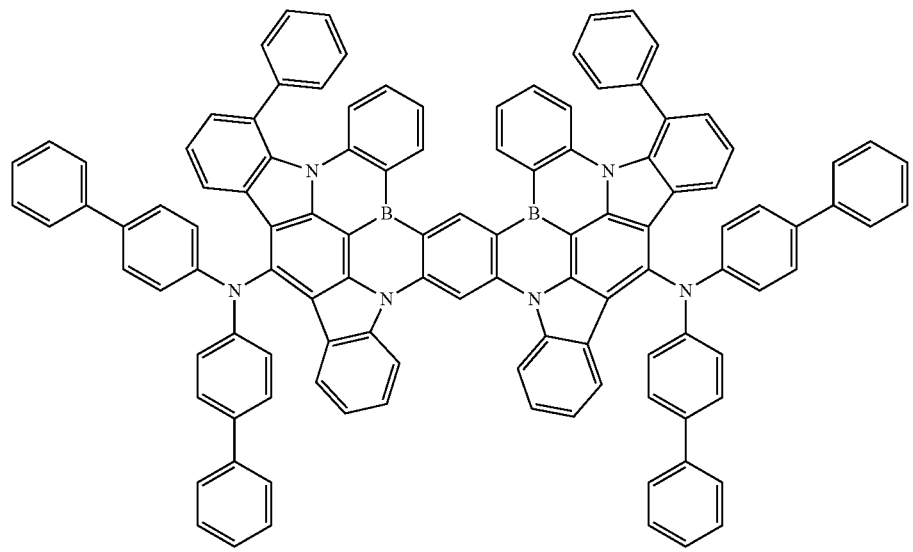
33
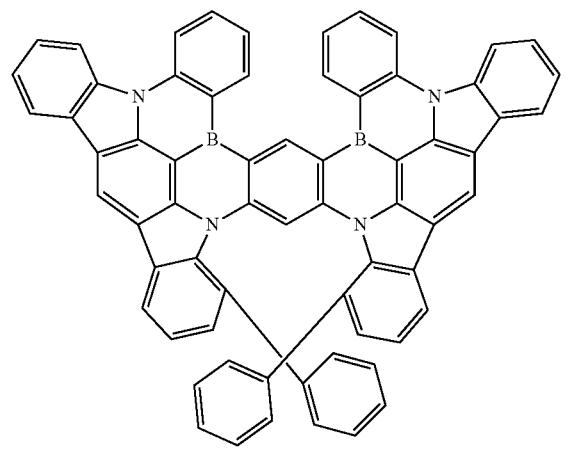
34
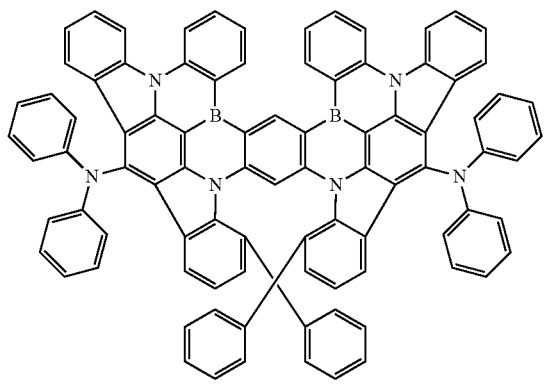
35
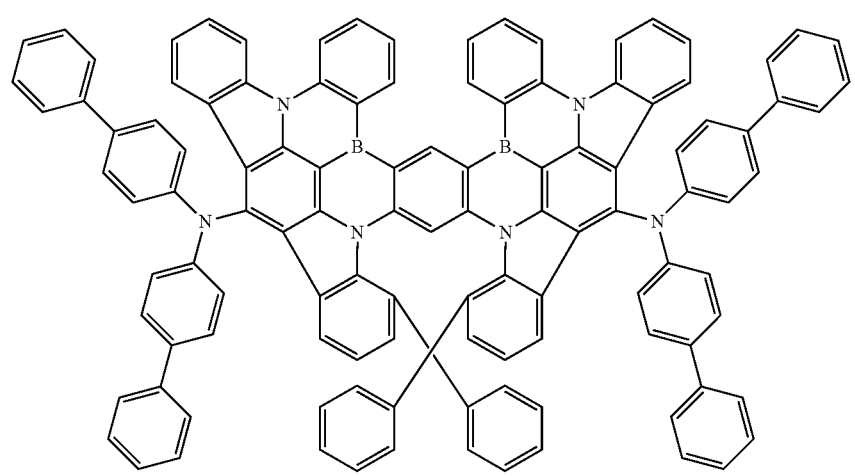
36

-continued
37
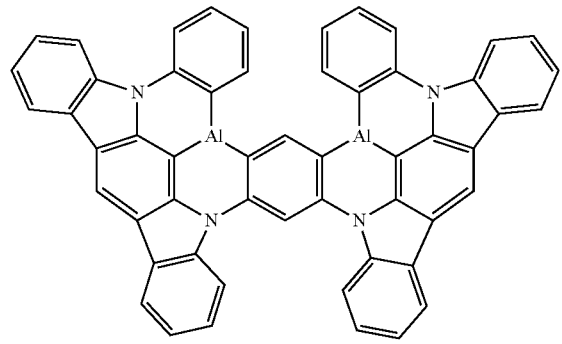
38
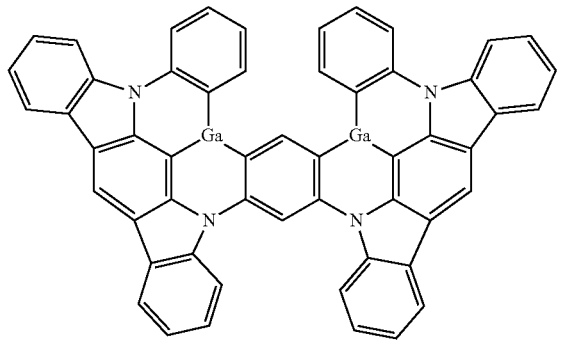
39
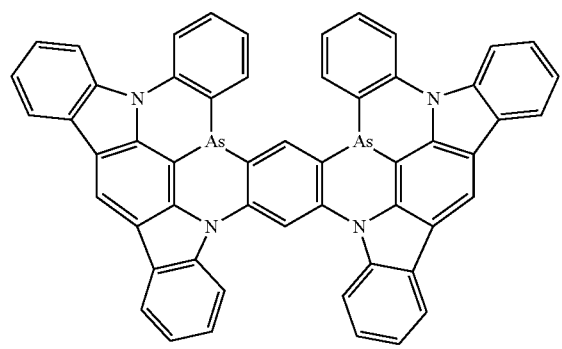
40
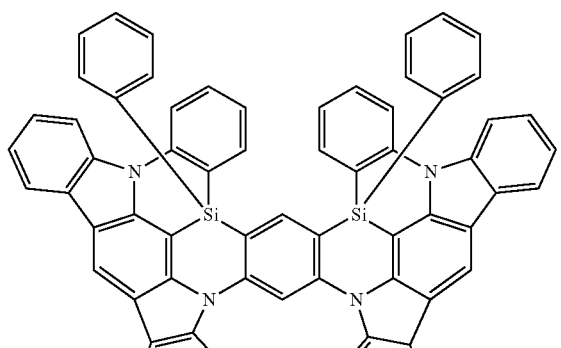
41
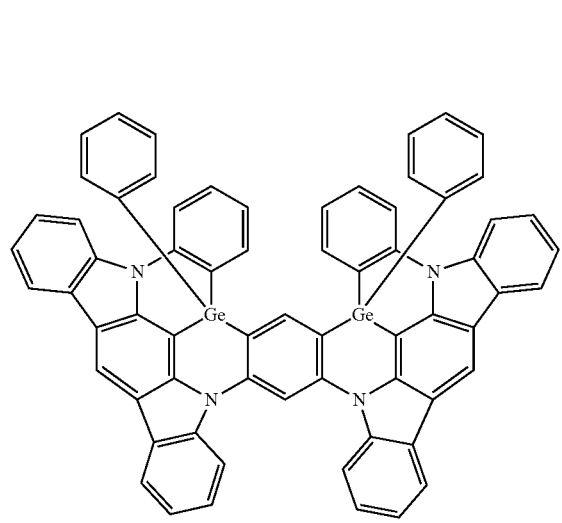
42
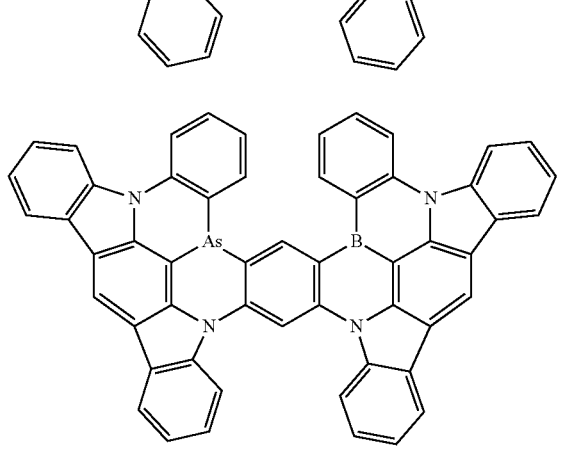
43
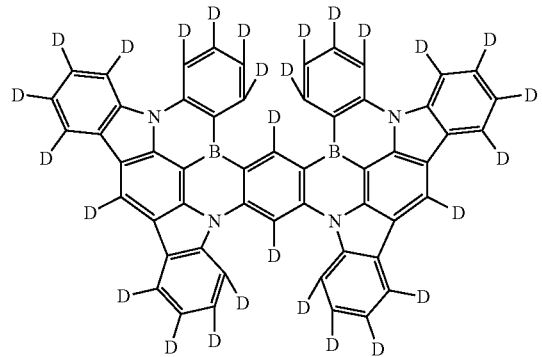
44
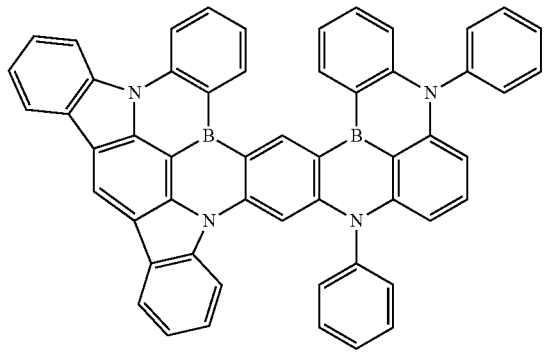

45
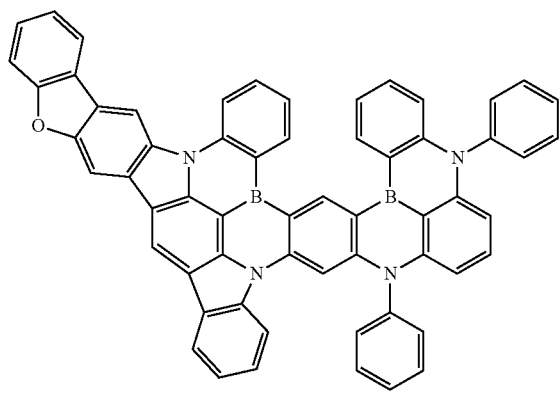
46
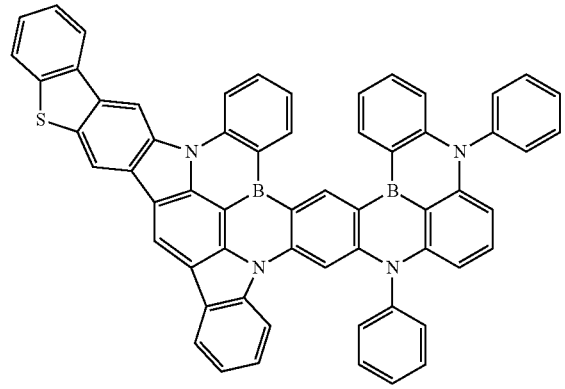
47
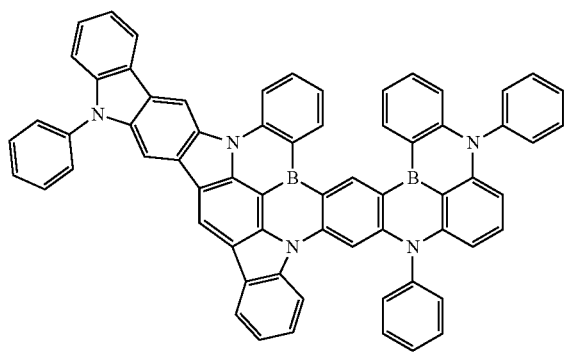
48
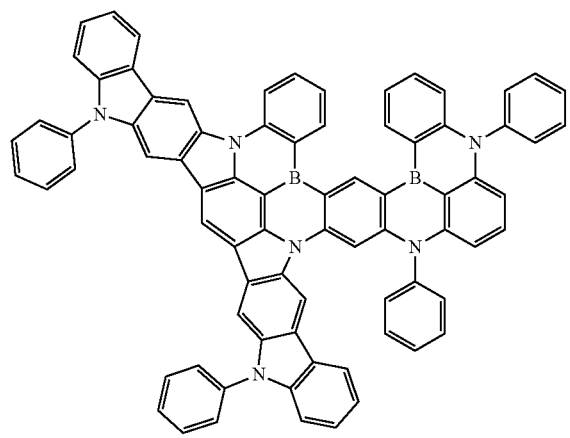
49
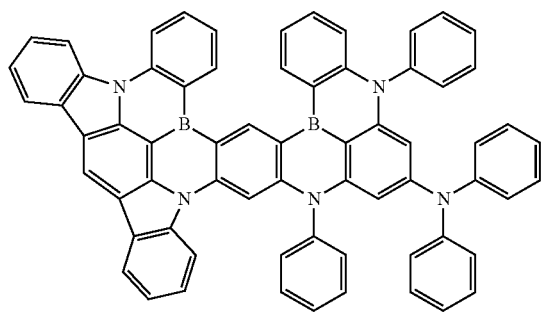
50
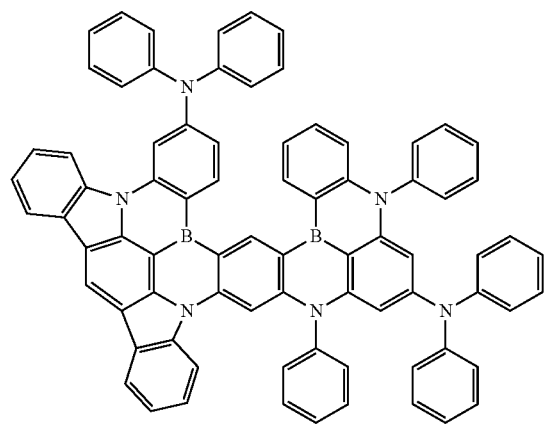

-continued
51
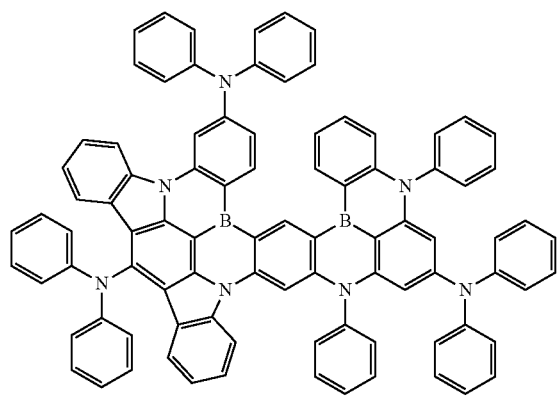
52
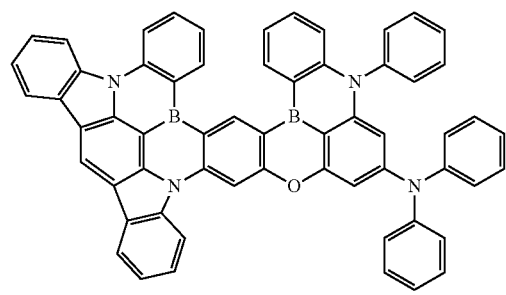
53
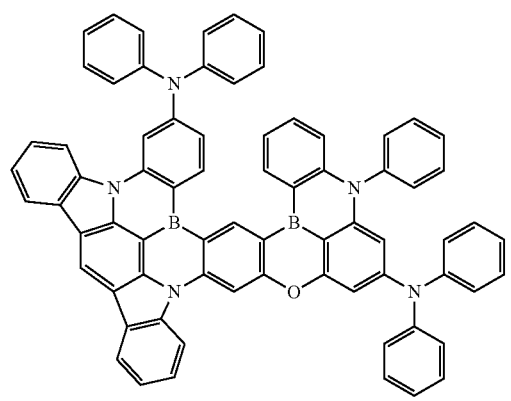
54
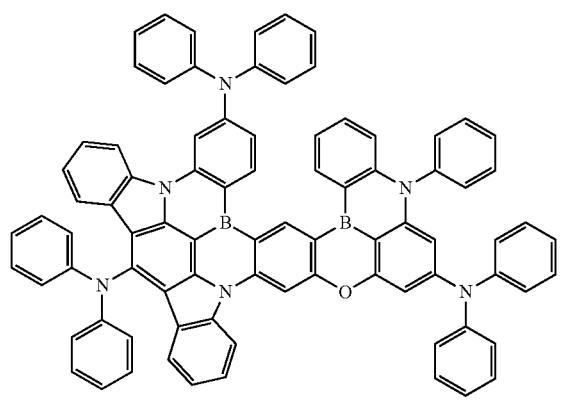
55
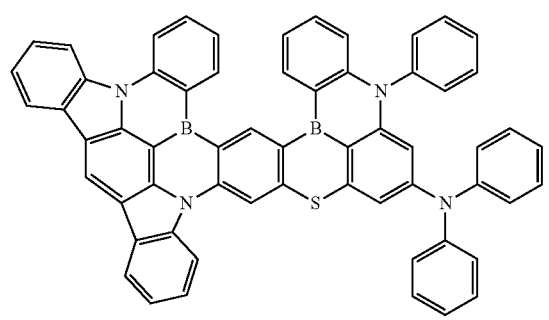
56
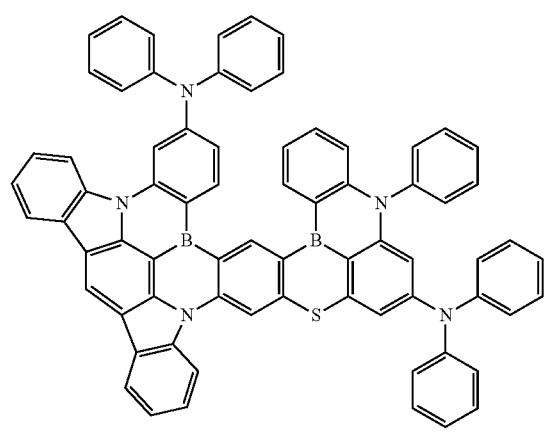
57
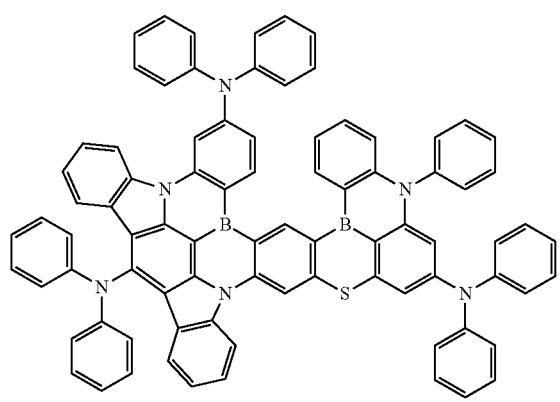
58
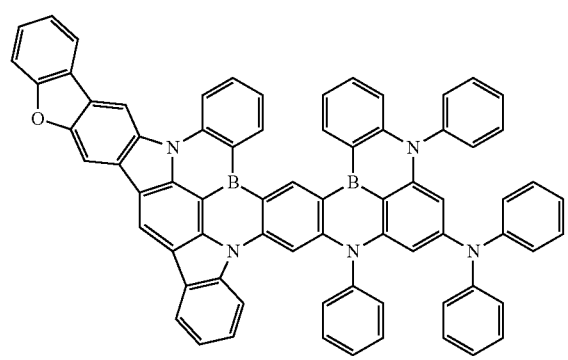

59
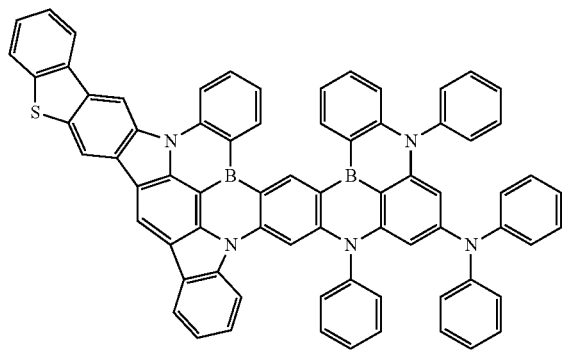
60
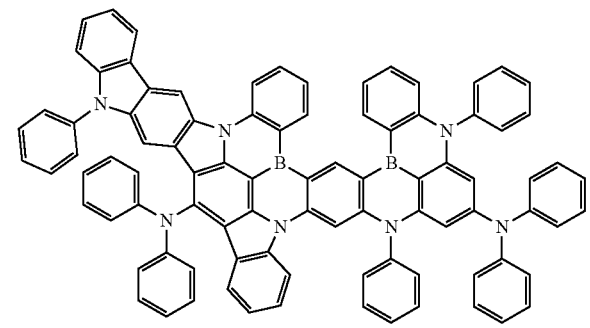
61
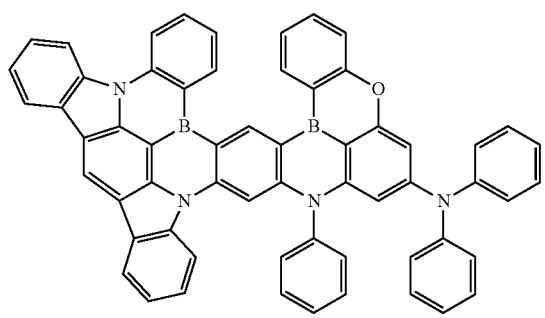
62
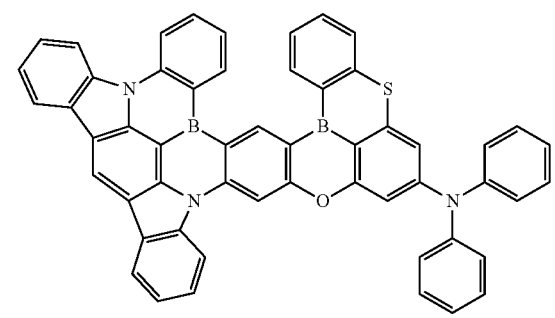
63
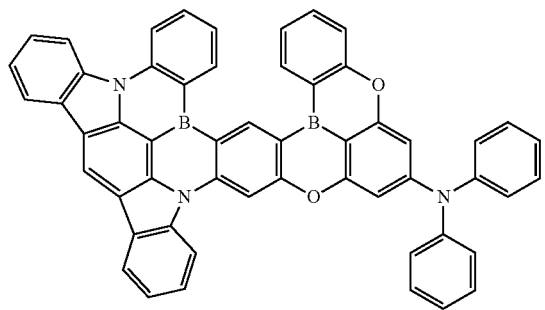
64
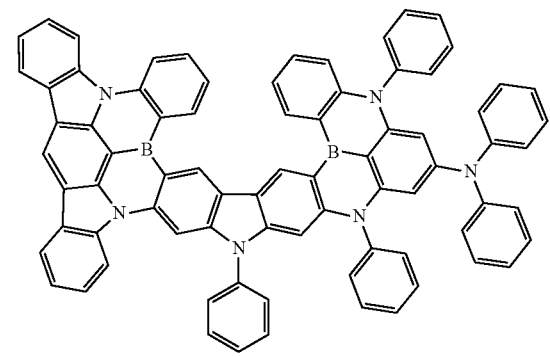
65
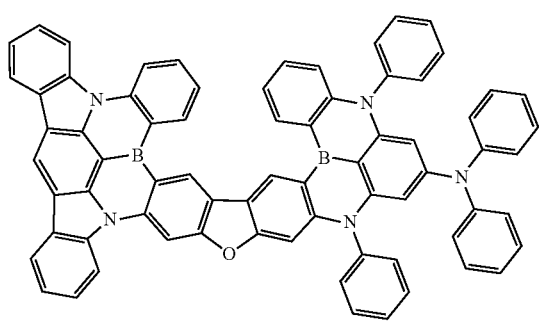
66
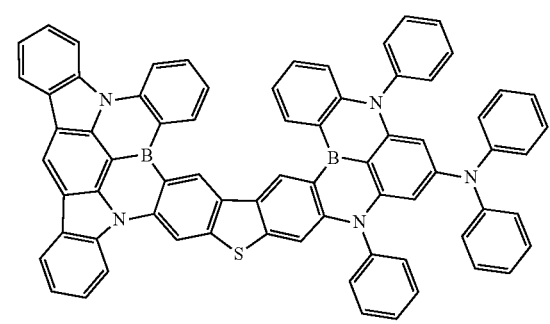

-continued
67
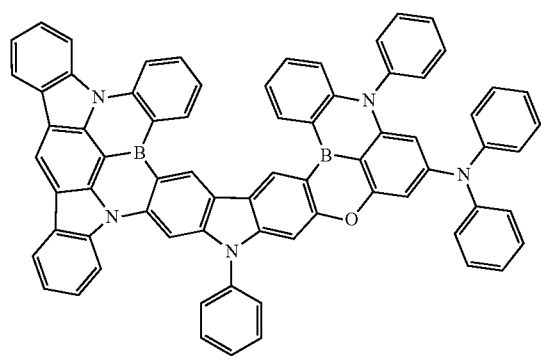
68
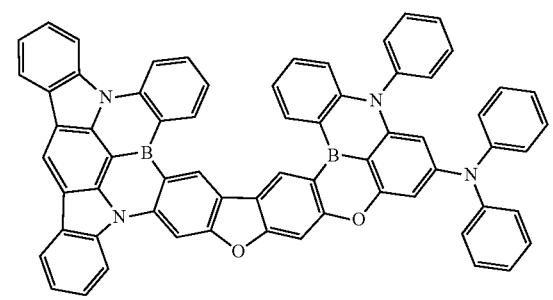
69
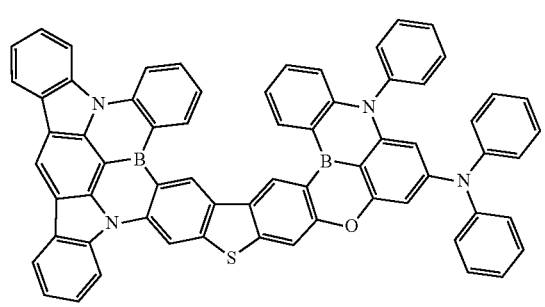
70
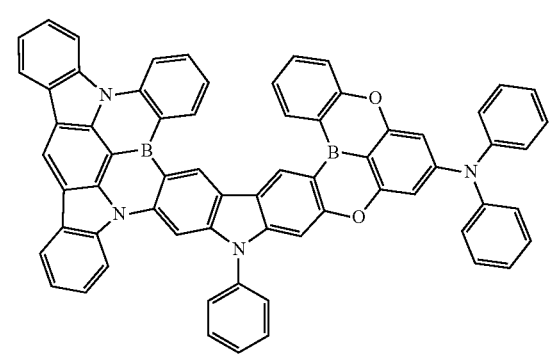
71
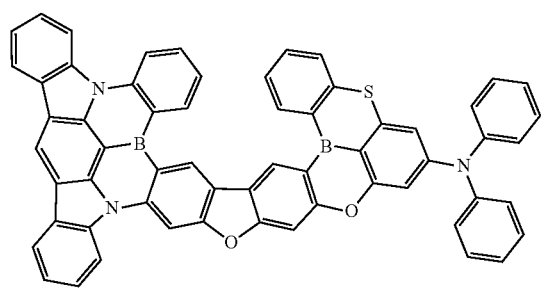
72
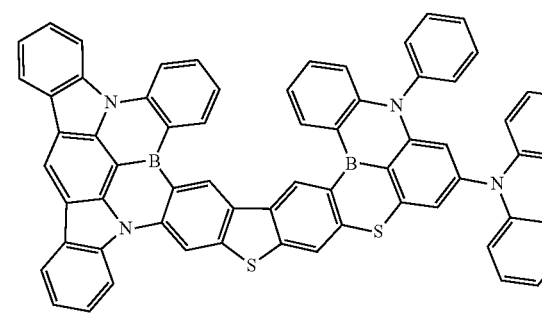
73
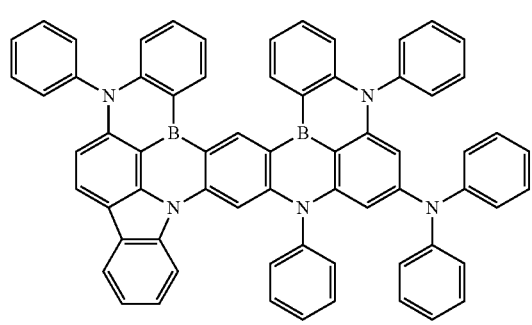
74
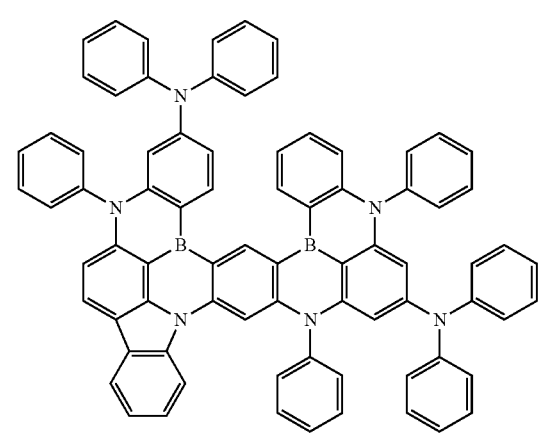

-continued
75
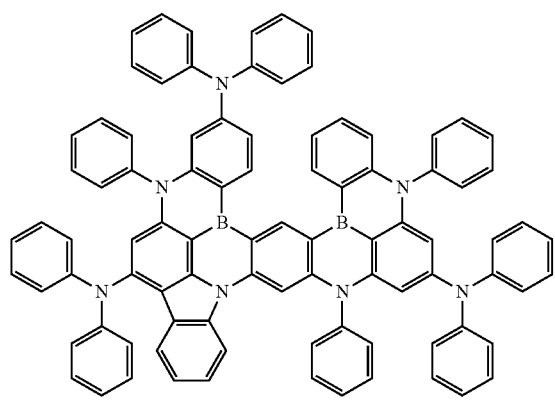
76
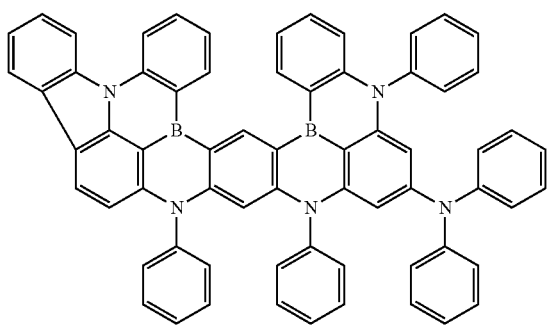
77
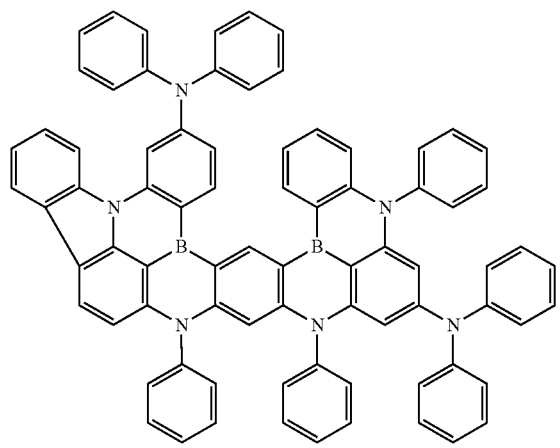
78
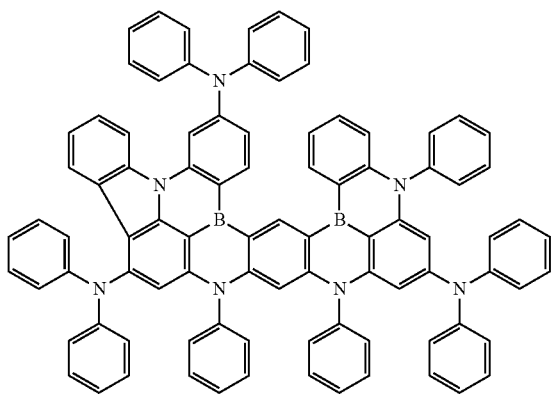
79
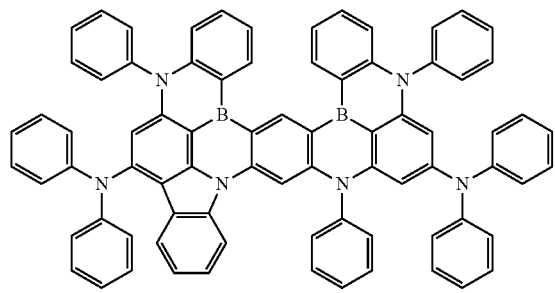
80
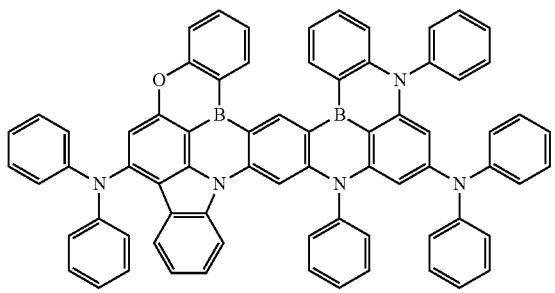
81
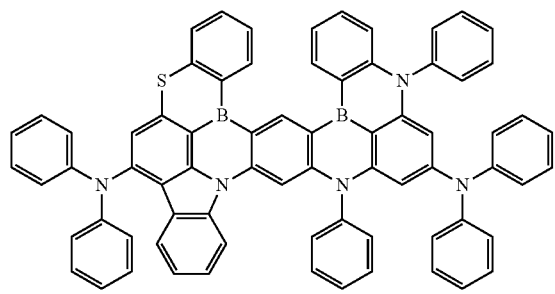
82
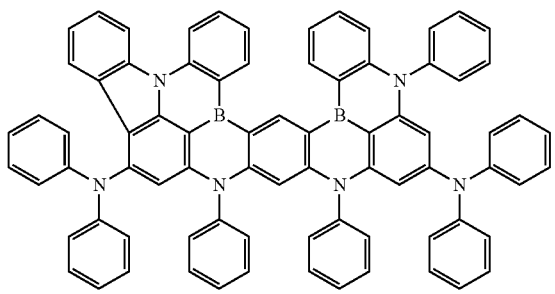

83

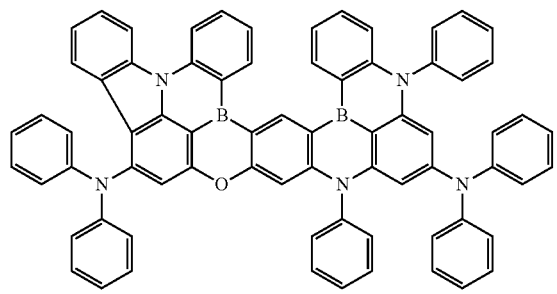

84

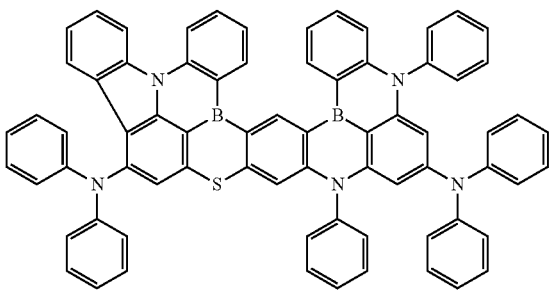

wherein in Compound 43, D is a deuterium atom.

14. A light emitting device comprising:
a first electrode;
a second electrode disposed on the first electrode; and
an emission layer disposed between the first electrode and the second electrode and comprising a polycyclic compound represented by Formula 2-2:

[Formula 2-2]

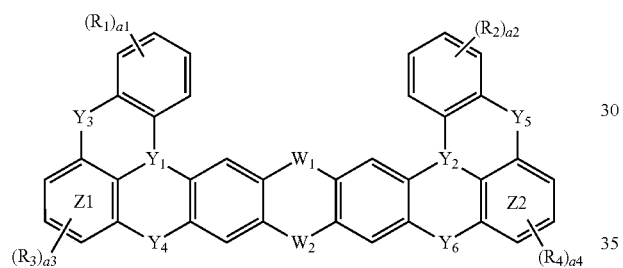

wherein in Formula 2-2,
$Y_1$ and $Y_2$ are each independently B, N, P, P=O, P=S, Al, Ga, As, Si($R_5$), or Ge($R_6$),
$Y_3$ to $Y_6$ are each independently N($R_7$) O, or S,
at least one of $Y_3$ to $Y_6$ is N($R_7$),
if at least one of $Y_3$ and $Y_4$ is N($R_7$), then $R_7$ is combined with adjacent ring Z1 to form a ring,
if at least one of $Y_5$ and $Y_6$ is N($R_7$), then $R_7$ is combined with adjacent ring Z2 to form a ring,
$W_1$ and $W_2$ are each independently a direct linkage, C($R_{21}$)($R_{22}$), N($R_{23}$), O, S, or Si($R_{24}$)($R_{25}$),
a1 and a2 are each independently an integer from 0 to 4,
a3 and a4 are each independently an integer from 0 to 3,
$R_1$ to $R_7$ are each independently a hydrogen atom, a deuterium atom, a halogen atom, a substituted or unsubstituted amine group, a substituted or unsubstituted thio group, a substituted or unsubstituted oxy group a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring forming carbon atoms, or are combined with an adjacent group to form a ring, and
$R_{21}$ to $R_{25}$ are each independently a hydrogen atom, a deuterium atom, or a substituted or unsubstituted aryl group of 6 to 30 ring-forming carbon atoms.

15. The light emitting device of claim 14, wherein at least one of $W_1$ and $W_2$ is a direct linkage.

16. The light emitting device of claim 14, wherein Formula 2-2 is represented by one of Formula 2-2A to Formula 2-2C:

[Formula 2-2A]

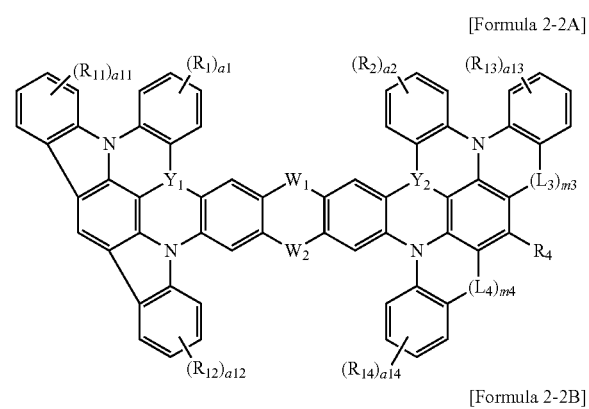

[Formula 2-2B]

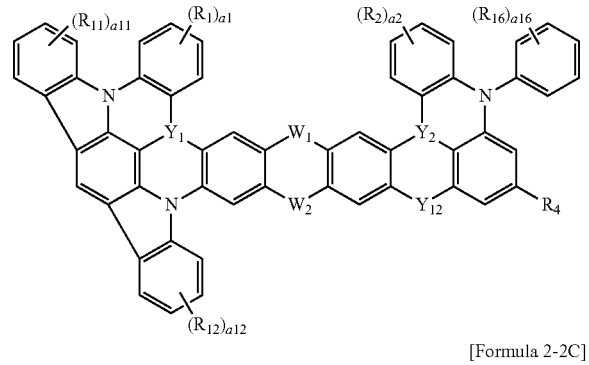

[Formula 2-2C]

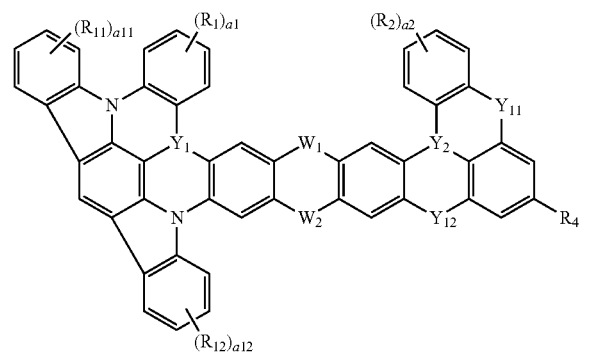

wherein in Formula 2-2A,
at least one of m3 and m4 is 1, and the remainder of m3 and m4 is 0 or 1, $L_3$ and $L_4$ are each a direct linkage, wherein in Formula 2-2B and Formula 2-2C, $Y_{11}$ and $Y_{12}$ are each independently O or S, wherein in Formula 2-2B, a16 is an integer from 0 to 5, and wherein in Formula 2-2A to Formula 2-2C, a11 to a14 are each independently an integer from 0 to 4, $R_{11}$ to $R_{14}$, and $R_{16}$ are each independently a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and a1, a2, $R_1$, $R_2$, $R_4$, $Y_1$, $Y_2$, $W_1$, and $W_2$ are the same as defined in connection with Formula 2-2.

17. A light emitting device, comprising:

a first electrode;

a second electrode disposed on the first electrode; and an emission layer disposed between the first electrode and the second electrode and comprising a polycyclic compound represented by Formula 1, wherein an external quantum efficiency of the light emitting device is in a range of about 24% to about 30%:

[Formula 1]

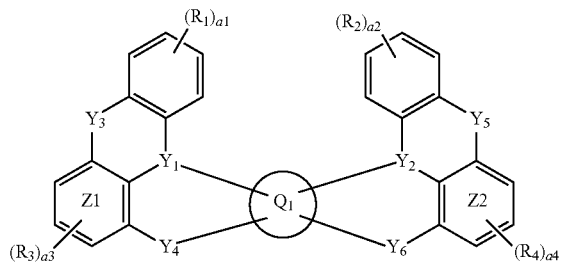

wherein in Formula 1, $Q_1$ is a substituted or unsubstituted hydrocarbon ring group, or a substituted or unsubstituted heterocyclic group, $Y_1$ and $Y_2$ are each independently B, N, P, P=O, P=S, Al, Ga, As, Si($R_5$), or Ge($R_6$), $Y_3$ to $Y_6$ are each independently N($R_7$), O, or S, at least one of $Y_3$ to $Y_6$ is N($R_7$), if at least one of $Y_3$ and $Y_4$ is N($R_7$), then $R_7$ is combined with adjacent ring Z1 to form a ring, if at least one of $Y_5$ and $Y_6$ is N($R_7$), then $R_7$ is combined with adjacent ring Z2 to form a ring, a1 and a2 are each independently an integer from 0 to 4, a3 and a4 are each independently an integer from 0 to 3, and $R_1$ to $R_7$ are each independently a hydrogen atom, a deuterium atom, a halogen atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

18. The light emitting device of claim 17, wherein the polycyclic compound is one selected from Compound Group 1:

[Compound Group 1]

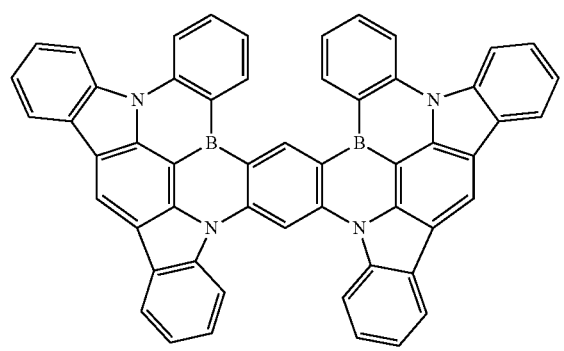

1

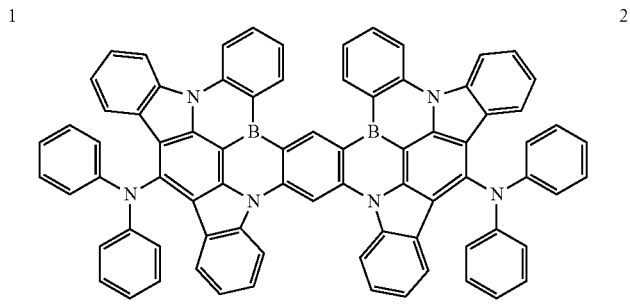

2

-continued
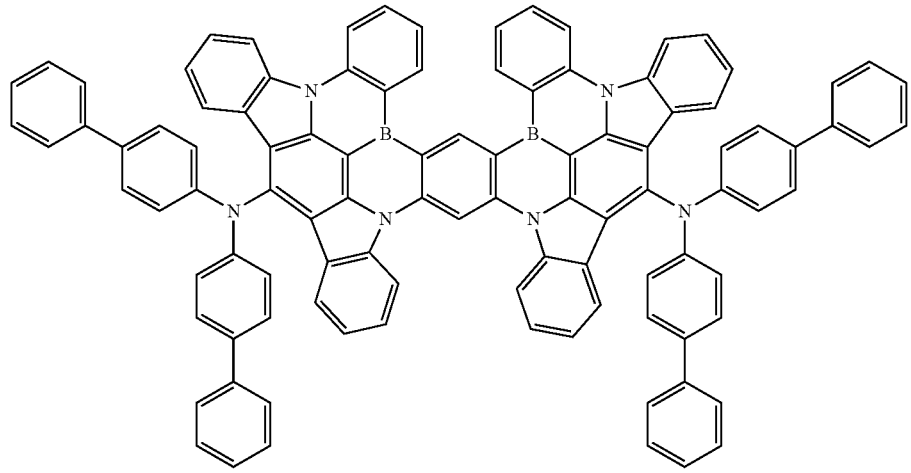
3
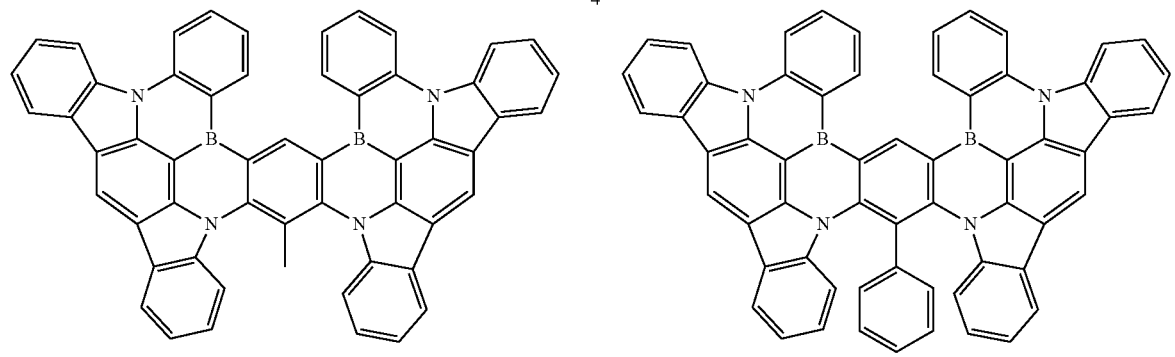
4 5
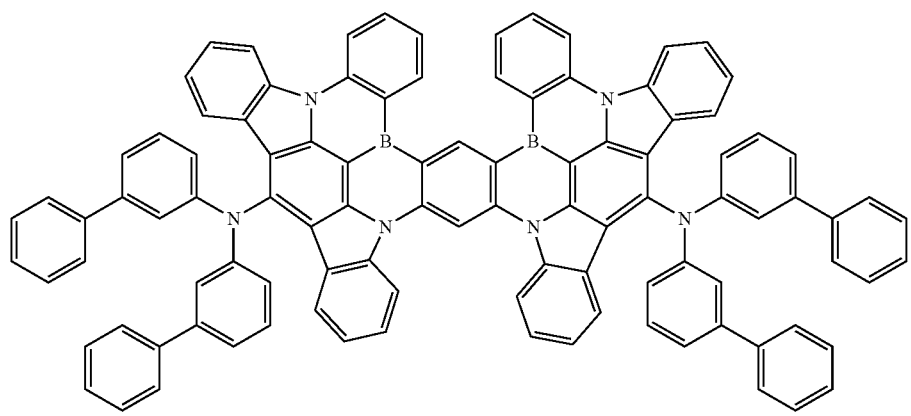
6

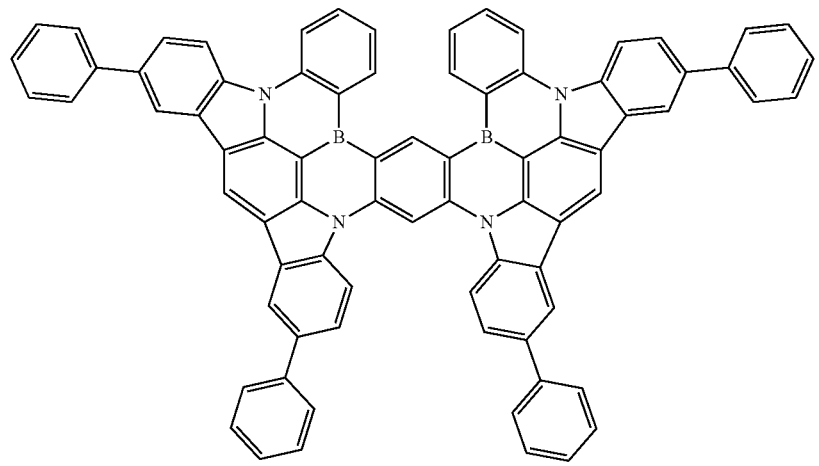
7
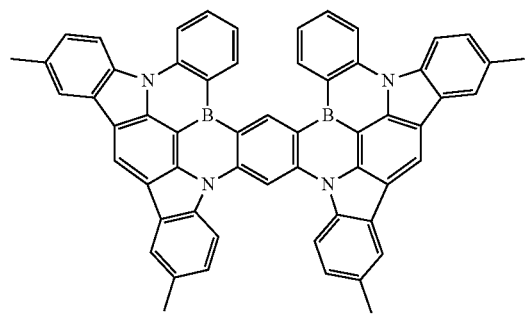
8
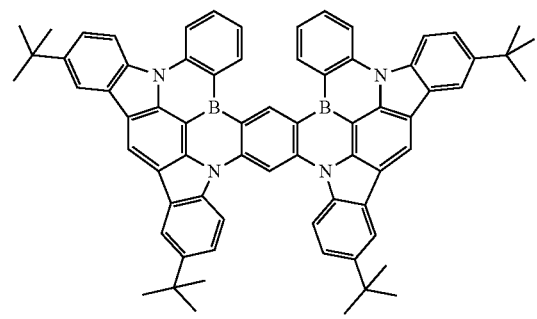
9
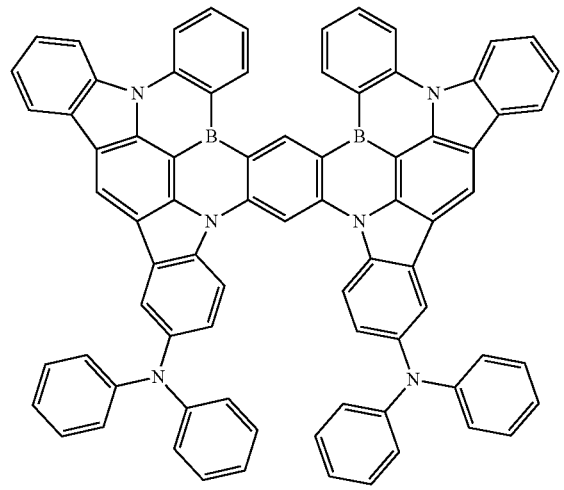
10
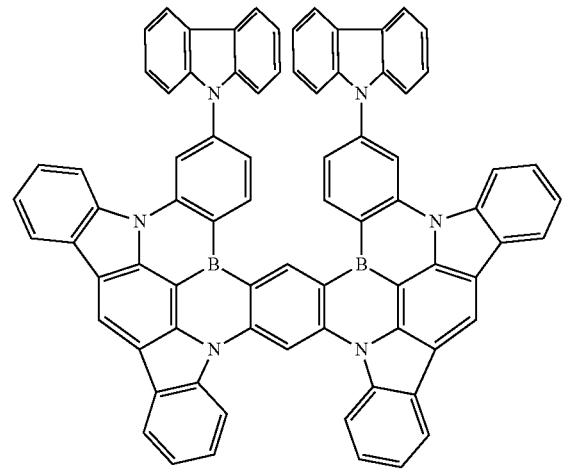
11

12
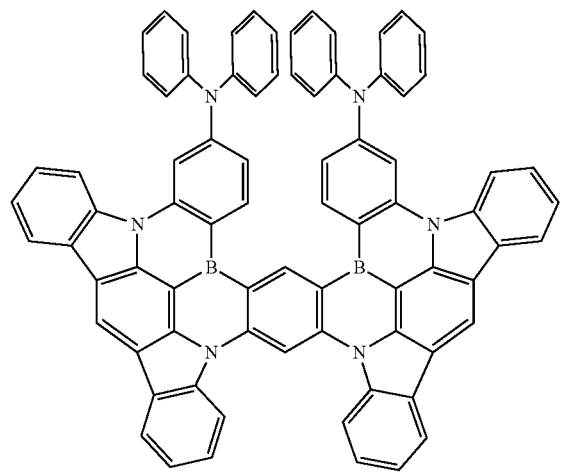
13
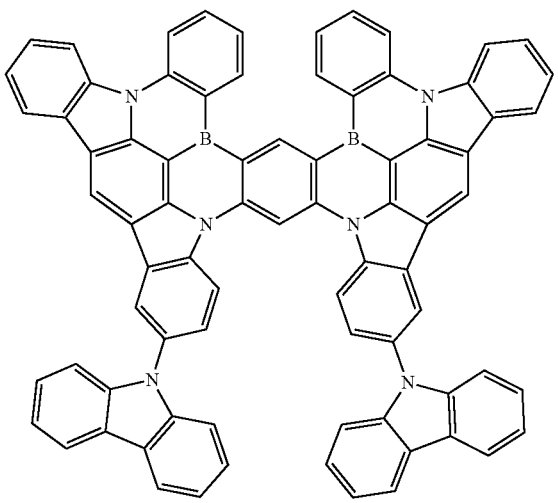
14
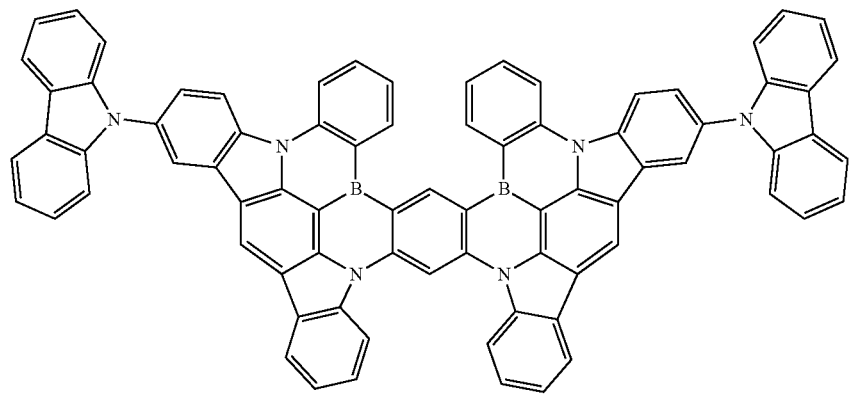
15
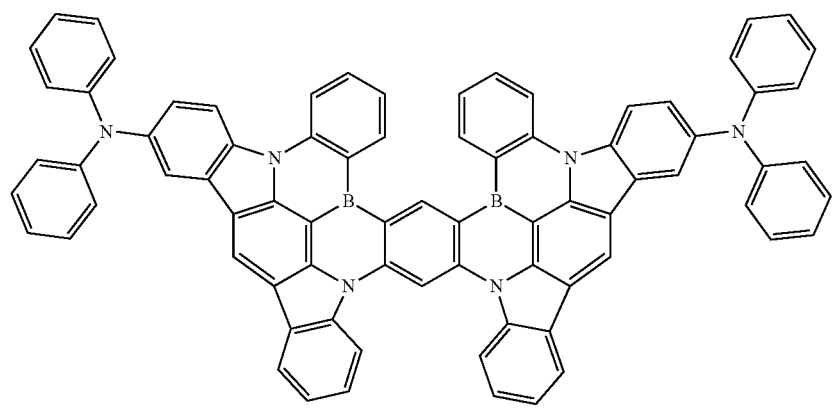
16
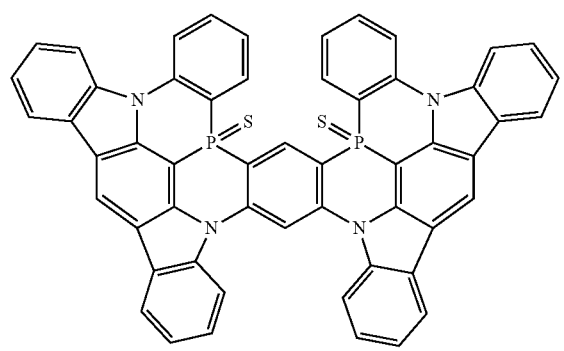
17
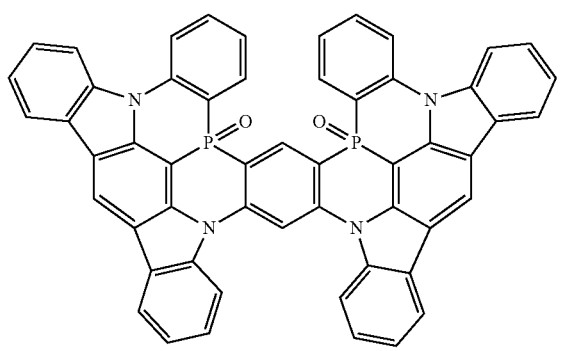

-continued
18
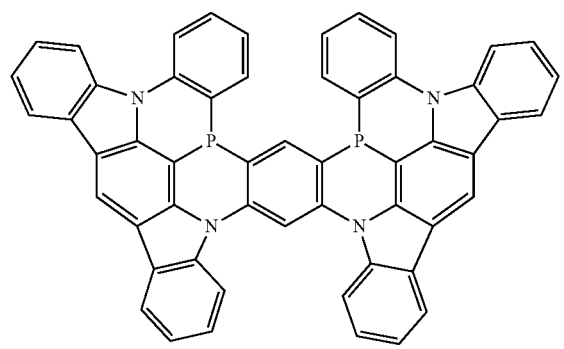
19
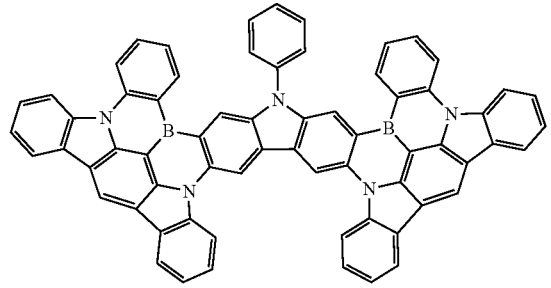
20
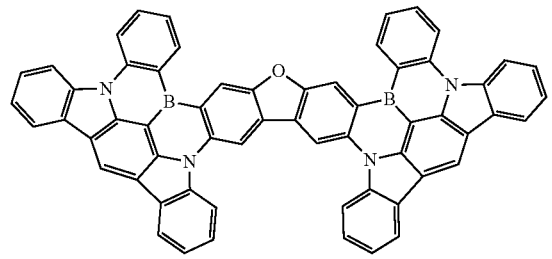
21
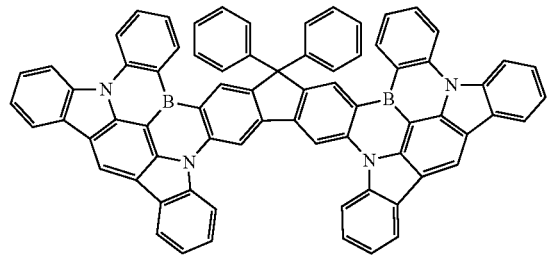
22
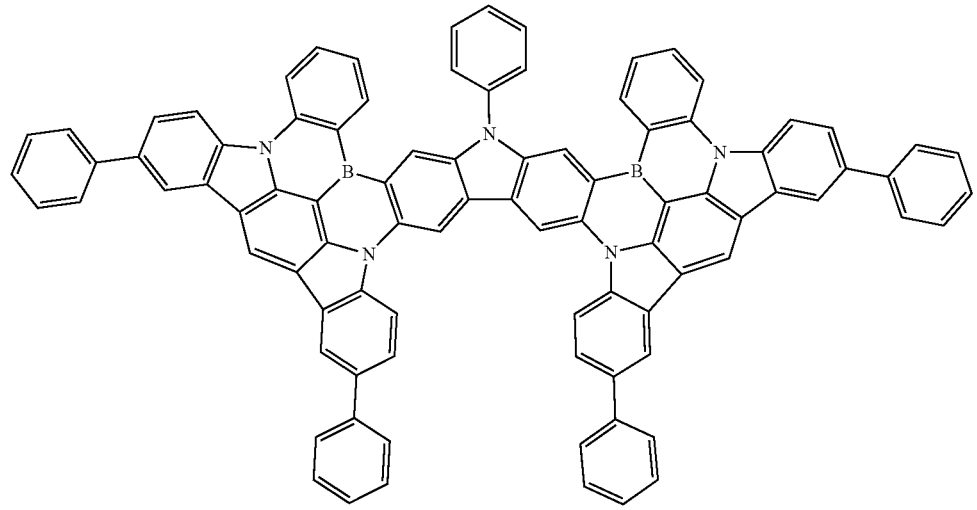
23
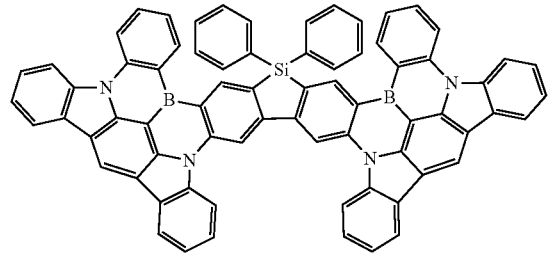
24
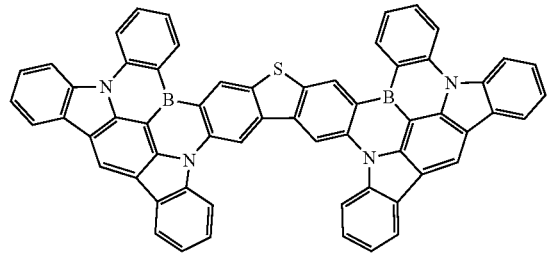

-continued
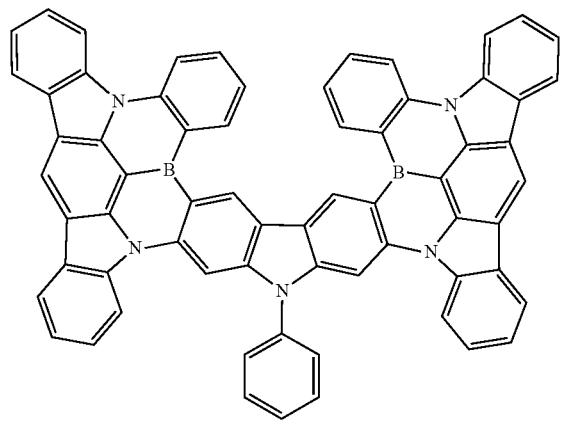
25
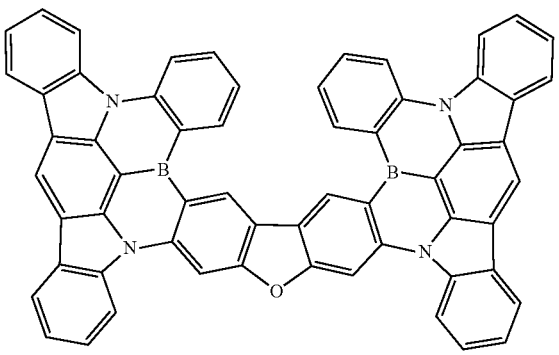
26
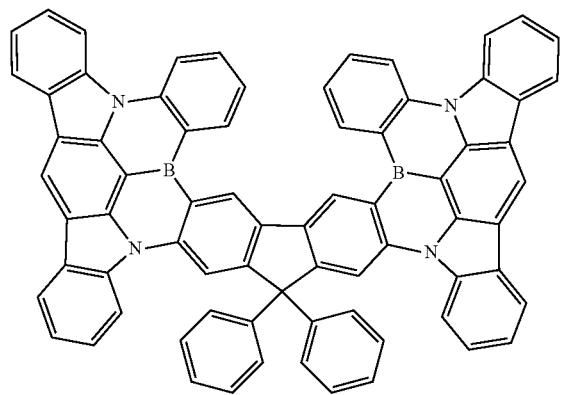
27
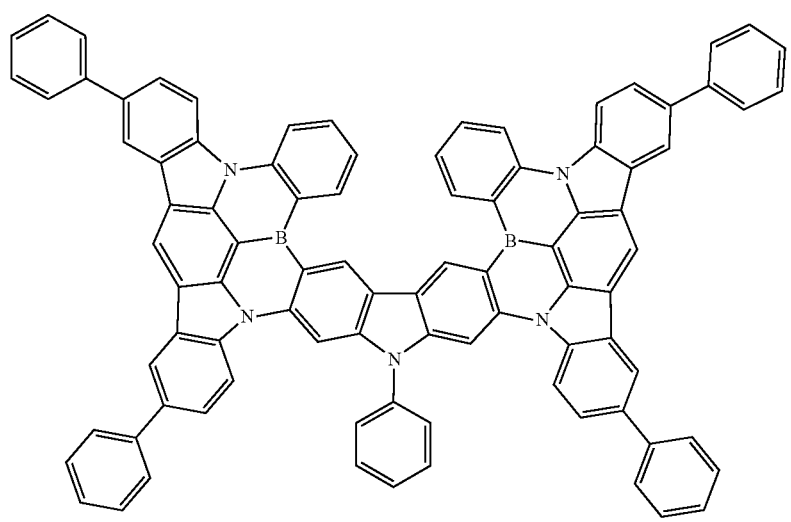
28

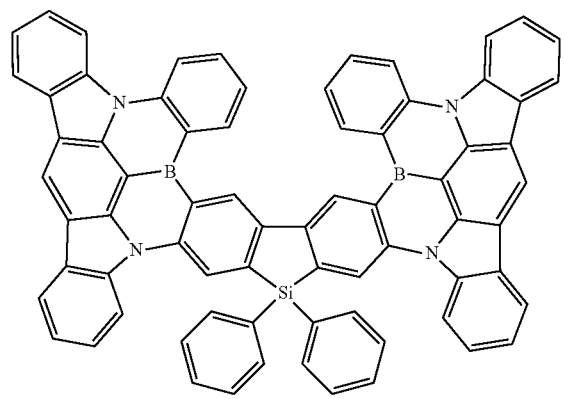
29
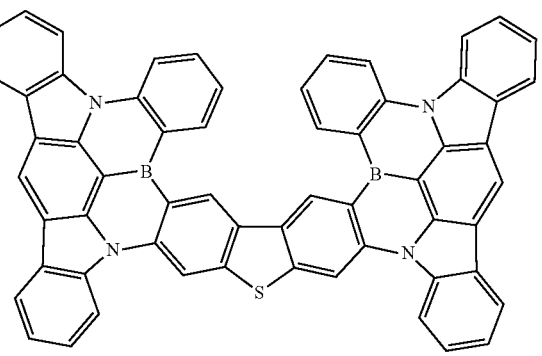
30
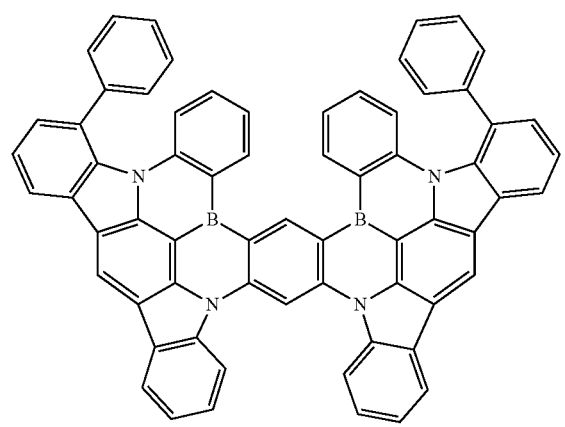
31
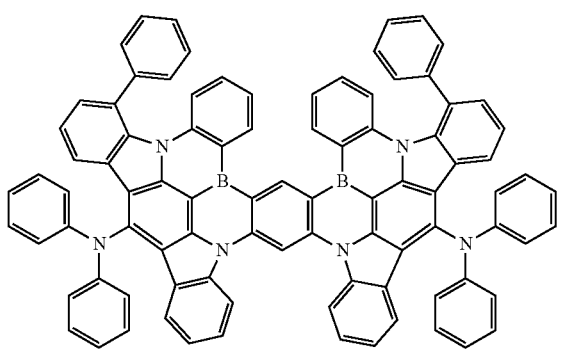
32
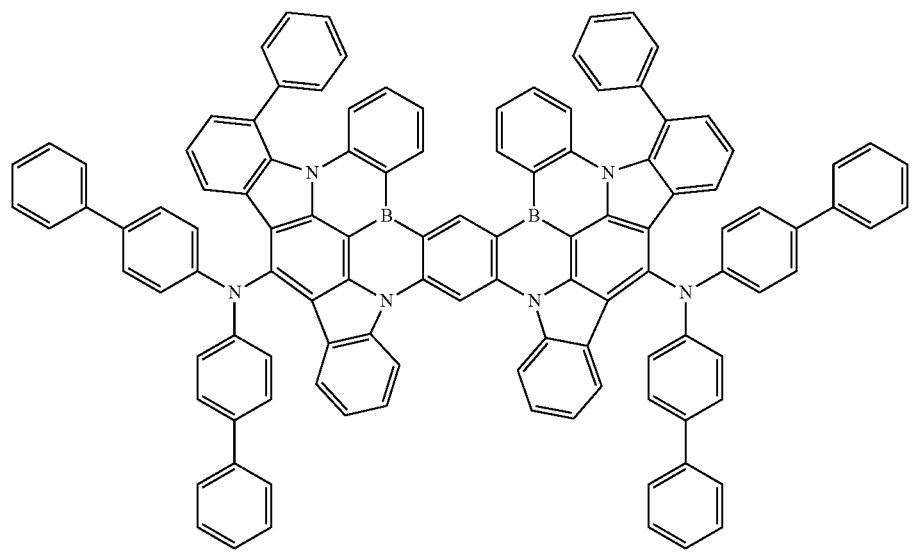
33

-continued
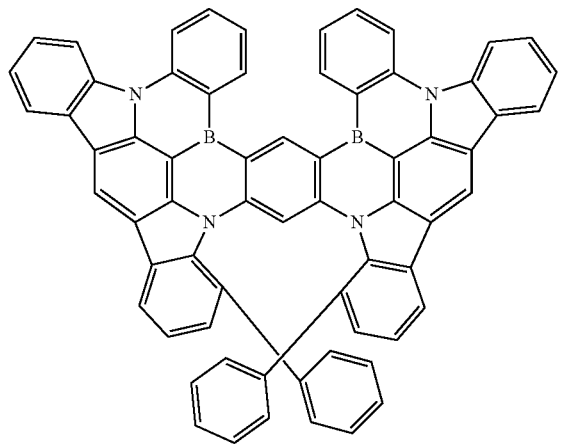
34
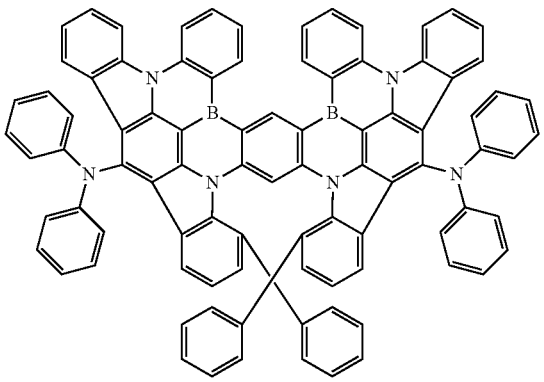
35
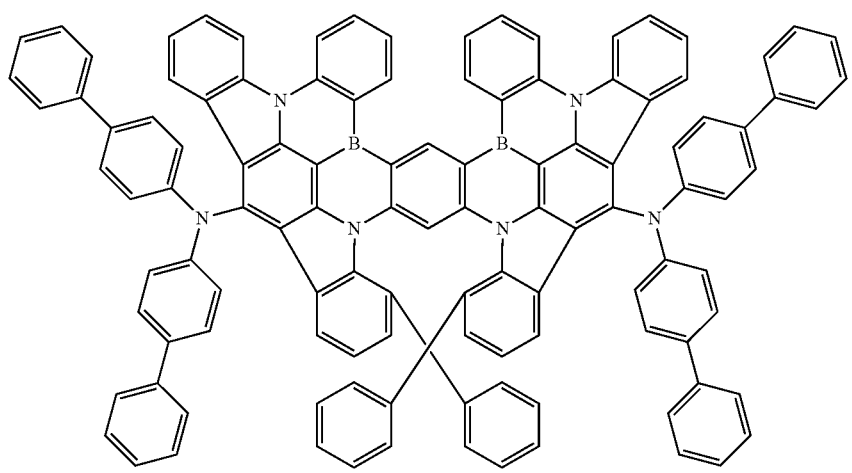
36
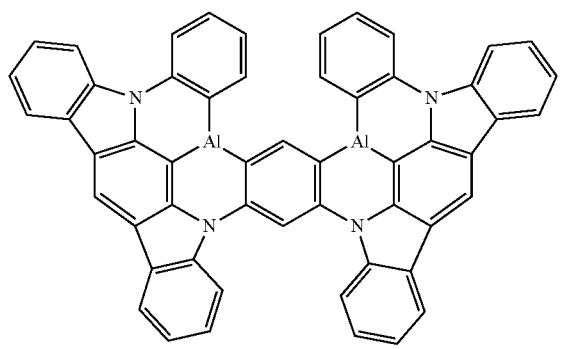
37
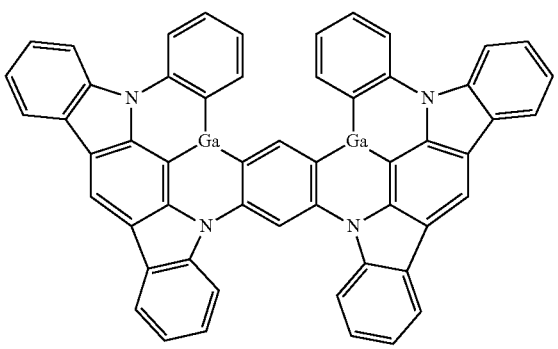
38

-continued
39
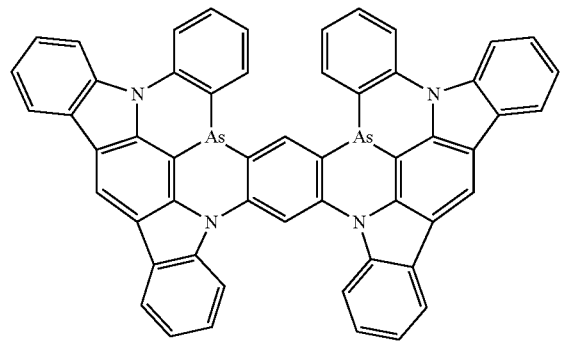
40
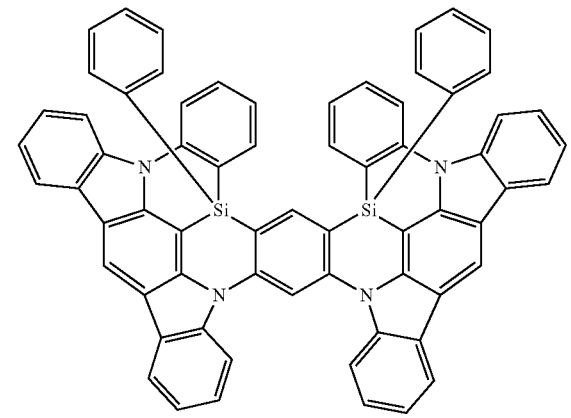
41
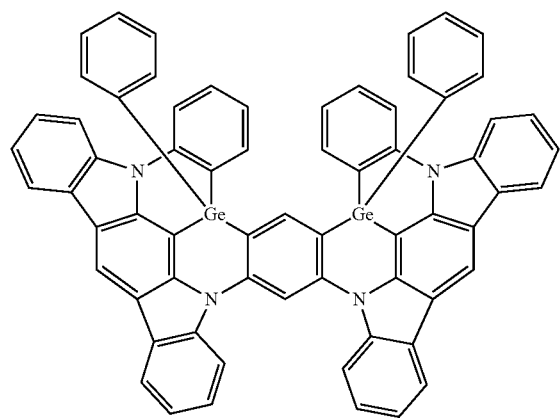
42
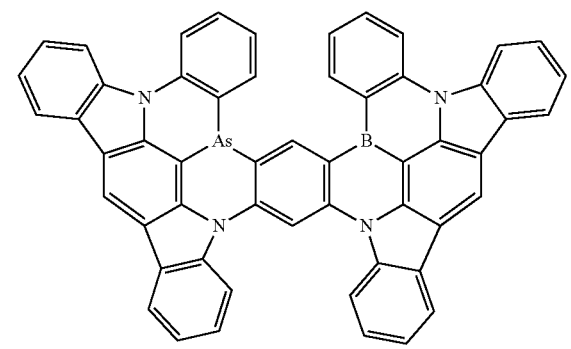
43
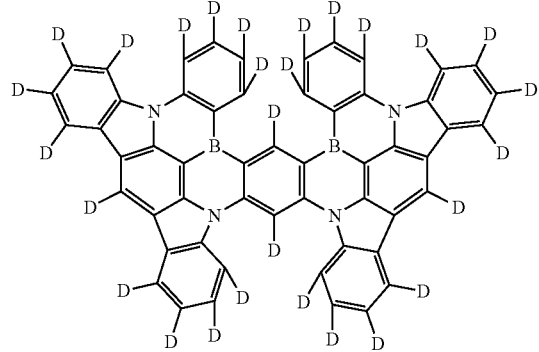
44
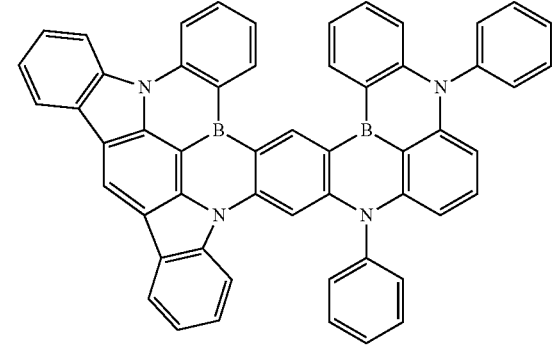
45
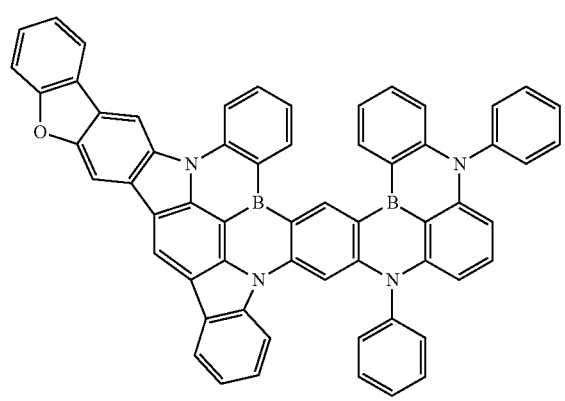
46
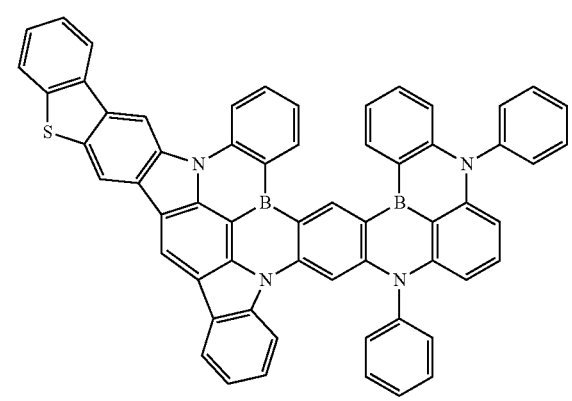

-continued
47
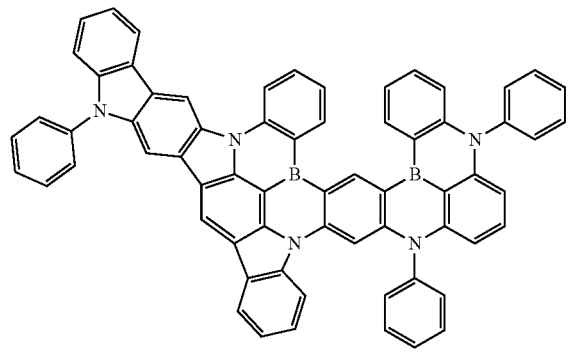
48
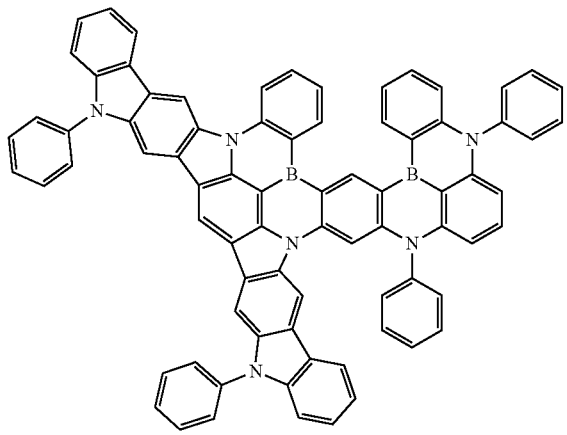
49
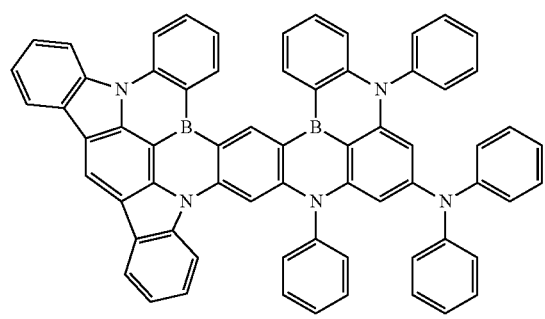
50
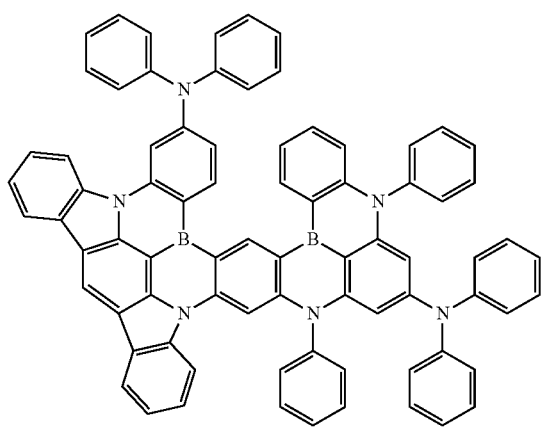
51
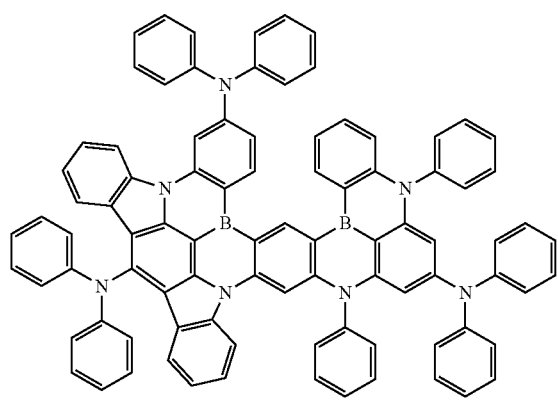
52
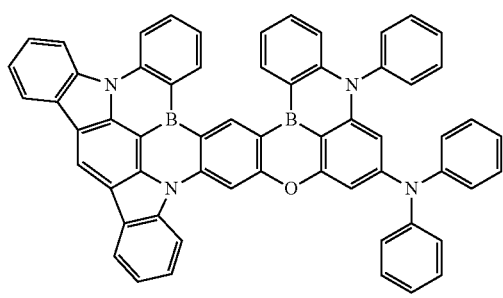

-continued
53
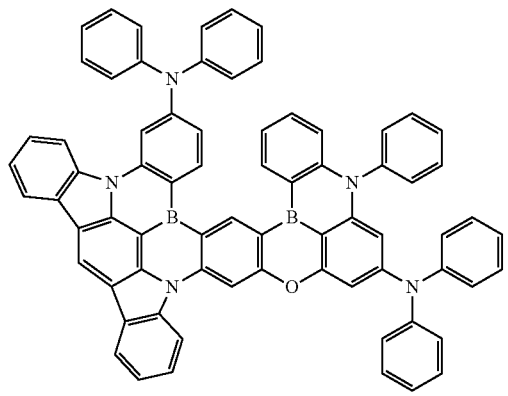
54
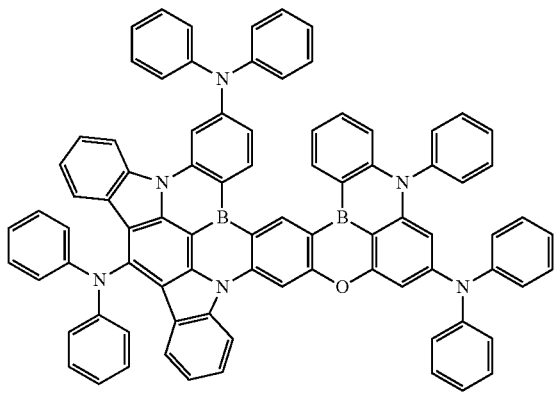
55
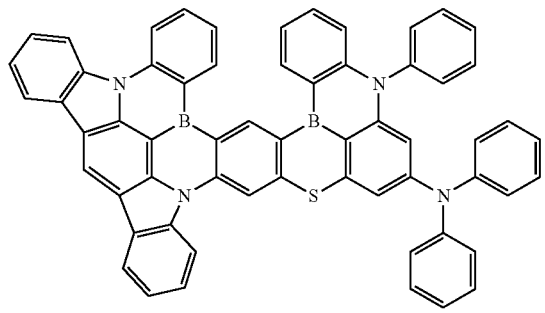
56
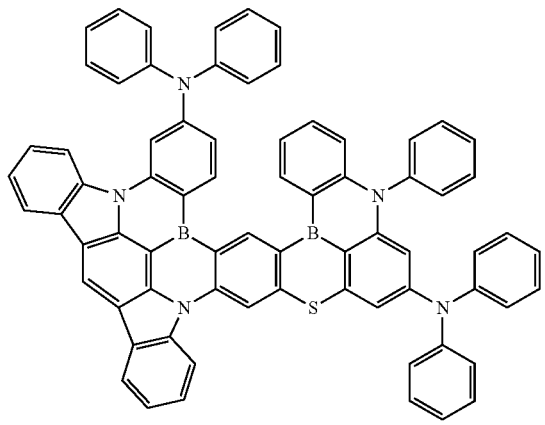
57
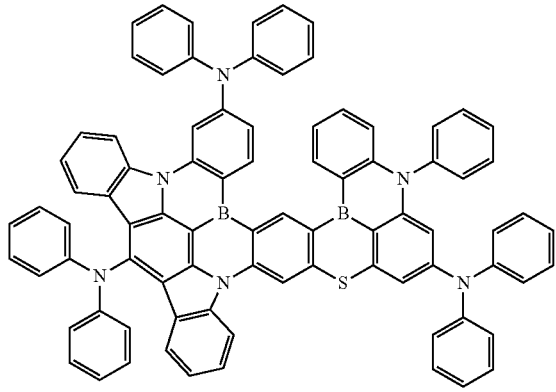
58
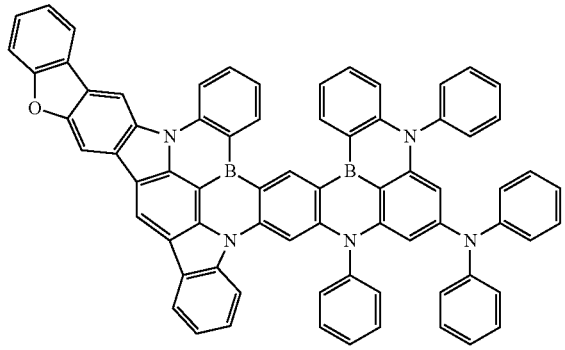
59
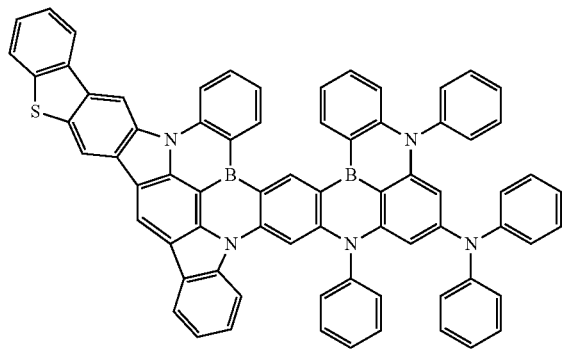
60
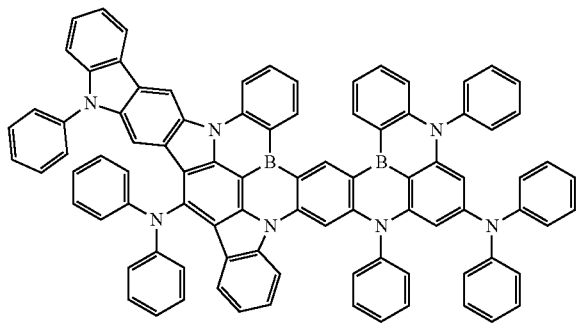

-continued
61
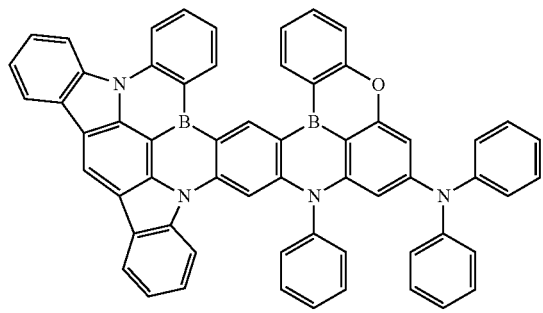
62
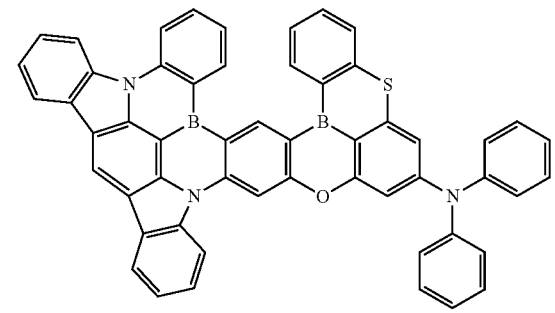
63
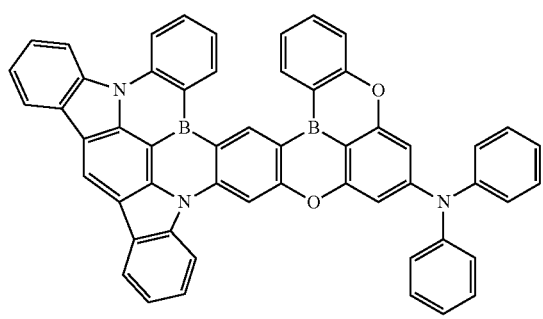
64
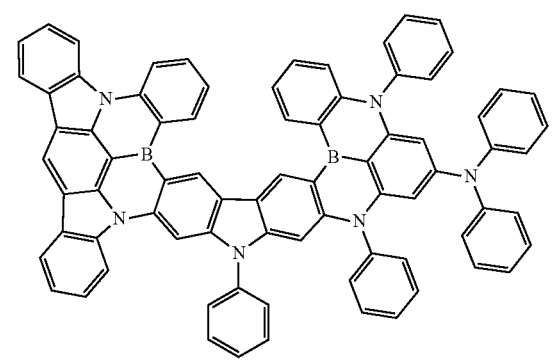
65
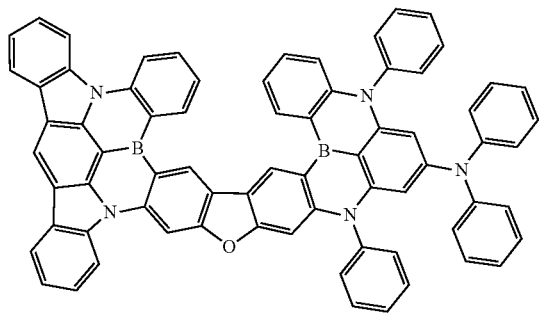
66
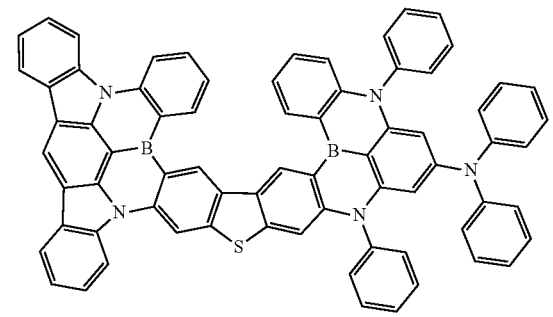
67
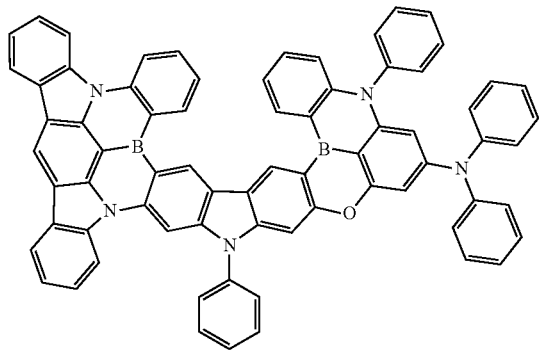
68
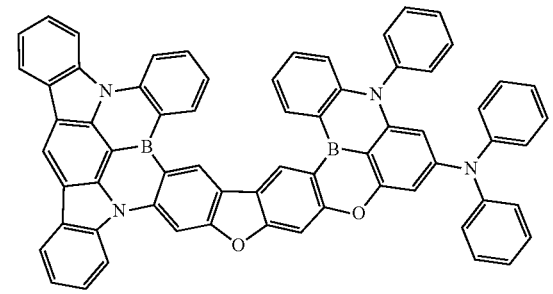

-continued
69
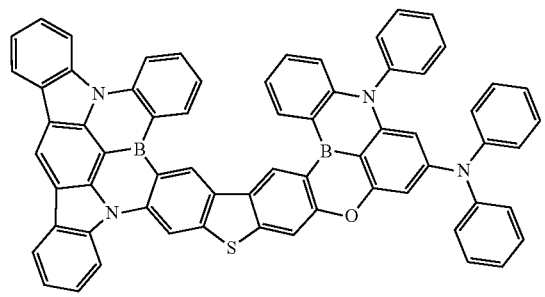
70
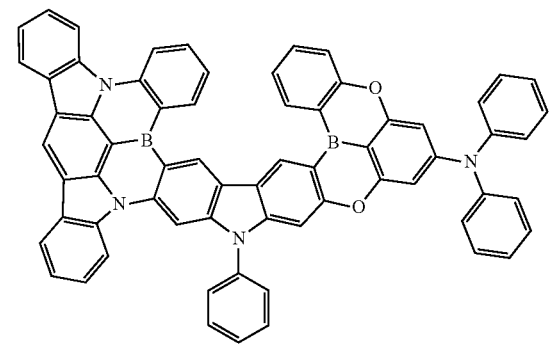
71
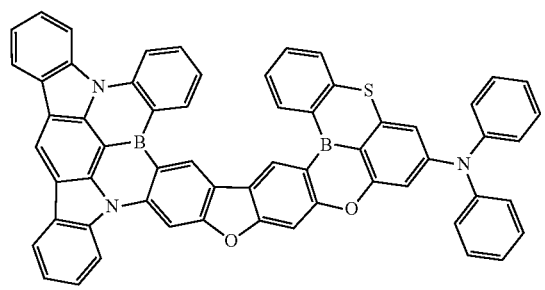
72
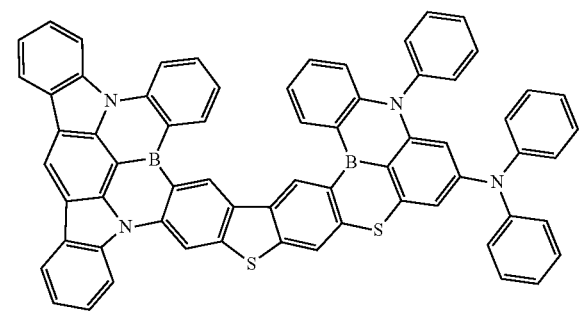
73
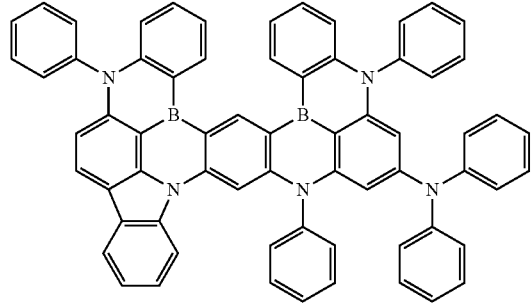
74
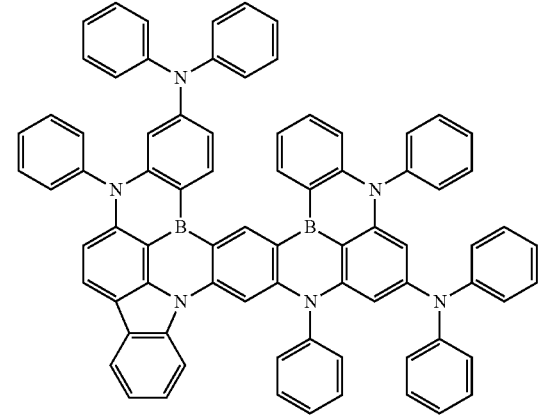
75
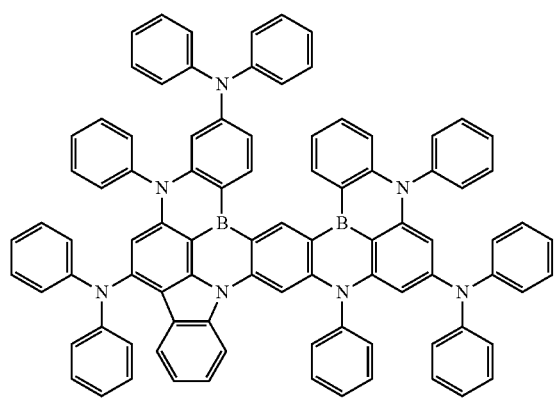
76
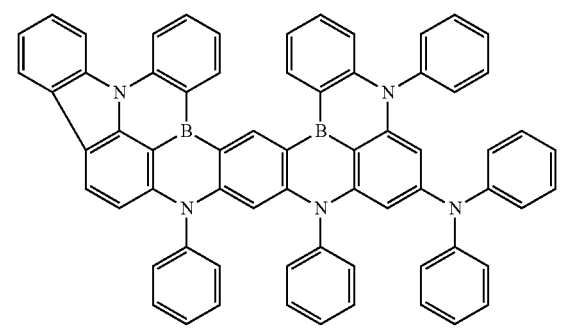

-continued
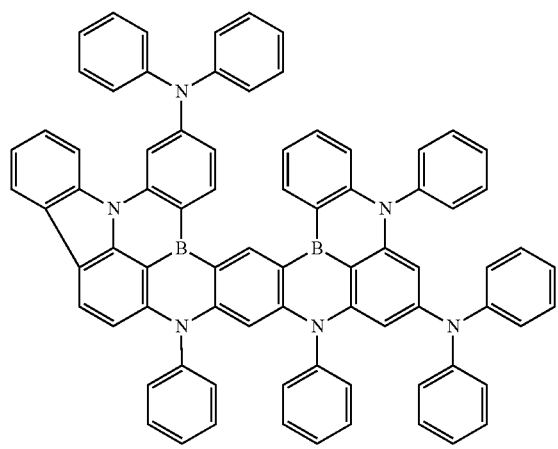
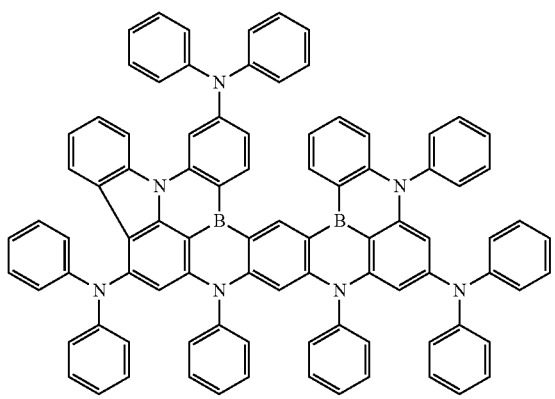
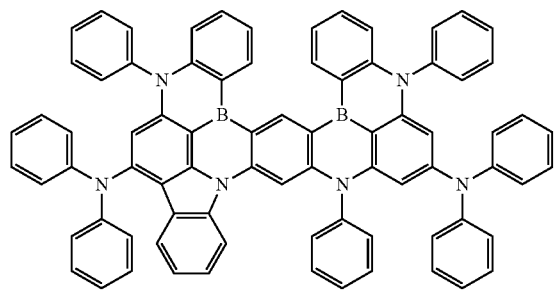
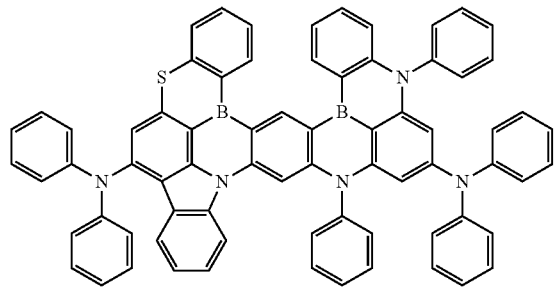
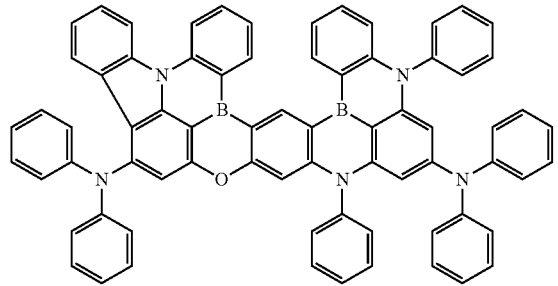
wherein in Compound 43, D is a deuterium atom.
* * * * *